US012567854B2

(12) United States Patent
Fukuhara et al.

(10) Patent No.: US 12,567,854 B2
(45) Date of Patent: Mar. 3, 2026

(54) STACKED ACOUSTIC WAVE DEVICE ASSEMBLY

(71) Applicant: Skyworks Solutions, Inc., Irvine, CA (US)

(72) Inventors: Hironori Fukuhara, Ibaraki (JP); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/936,567

(22) Filed: Sep. 29, 2022

(65) Prior Publication Data

US 2023/0111476 A1 Apr. 13, 2023

Related U.S. Application Data

(60) Provisional application No. 63/252,508, filed on Oct. 5, 2021.

(51) Int. Cl.
*H03H 9/17* (2006.01)
*H03H 9/02* (2006.01)
(Continued)

(52) U.S. Cl.
CPC ........ *H03H 9/175* (2013.01); *H03H 9/02228* (2013.01); *H03H 9/02574* (2013.01);
(Continued)

(58) Field of Classification Search
CPC .............. H03H 9/02102; H03H 9/175; H03H 9/02559; H03H 9/02015; H03H 9/0561;
(Continued)

(56) References Cited

U.S. PATENT DOCUMENTS

| | | | |
|---|---|---|---|
| 5,626,767 A | 5/1997 | Trampler et al. | |
| 5,910,756 A | 6/1999 | Ella | |

(Continued)

FOREIGN PATENT DOCUMENTS

| | | | |
|---|---|---|---|
| DE | 10-2012-205033 B4 | 1/2008 | |
| EP | 2658123 | 10/2013 | |

(Continued)

OTHER PUBLICATIONS

Plessky et al., "Laterally excited bulk wave resonators (XBARs) based on thin Lithium Niobate platelet for 5GHz and 13 GHz filters", IEEE/MTT-S International Microwave Symposium, pp. 512-515 (2019).

(Continued)

*Primary Examiner* — Quan Tra

(74) *Attorney, Agent, or Firm* — Knobbe, Martens, Olson & Bear, LLP

(57) ABSTRACT

A stacked acoustic wave device assembly is disclosed. The stacked acoustic wave device assembly can include a first acoustic wave device including a first solid acoustic mirror on a first substrate, a first piezoelectric layer on the first solid acoustic mirror and a first interdigital transducer electrode in contact with the first piezoelectric layer. The stacked acoustic wave device assembly can include a second acoustic wave device including a second solid acoustic mirror on a second substrate, a second piezoelectric layer on the second solid acoustic mirror and a second interdigital transducer electrode in contact with the second piezoelectric layer. The stacked acoustic wave device assembly can include a third solid acoustic mirror positioned between the first acoustic wave device and the second acoustic wave device.

20 Claims, 28 Drawing Sheets

(51) Int. Cl.
　　*H03H 9/13* 　　　(2006.01)
　　*H03H 9/145* 　　(2006.01)
　　*H03H 9/25* 　　　(2006.01)
　　*H03H 9/56* 　　　(2006.01)
(52) U.S. Cl.
　　CPC .............. *H03H 9/13* (2013.01); *H03H 9/145*
　　　　(2013.01); *H03H 9/25* (2013.01); *H03H 9/568*
　　　　　　　　　　　　　　　　　　　(2013.01)
(58) Field of Classification Search
　　CPC ...... H03H 9/02574; H03H 9/13; H03H 9/145;
　　　　　　　H03H 9/02834; H03H 9/02228; H03H
　　　　　　　　　　　　　　9/568; H03H 9/25
　　See application file for complete search history.

(56) References Cited

U.S. PATENT DOCUMENTS

| | | | |
|---|---|---|---|
| 6,262,637 | B1 | 7/2001 | Bradley et al. |
| 6,445,265 | B1 | 9/2002 | Wright |
| 6,509,813 | B2 | 1/2003 | Ellae et al. |
| 7,235,915 | B2 | 6/2007 | Nakamura et al. |
| 7,322,093 | B2 | 1/2008 | Kadota et al. |
| 7,471,027 | B2 | 12/2008 | Kando |
| 7,550,898 | B2 | 6/2009 | Kadota et al. |
| 7,576,471 | B1 | 8/2009 | Solal |
| 7,616,079 | B2 | 11/2009 | Tikka et al. |
| 7,733,198 | B1 | 6/2010 | Olsson et al. |
| 7,786,825 | B2 | 8/2010 | Handtmann et al. |
| 7,898,145 | B2 | 3/2011 | Mimura et al. |
| 7,902,717 | B2 | 3/2011 | Saijou et al. |
| 8,138,856 | B2 | 3/2012 | Khelif et al. |
| 8,248,185 | B2 | 8/2012 | Choy et al. |
| 8,294,331 | B2 | 10/2012 | Abbott et al. |
| 8,525,619 | B1 | 9/2013 | Olsson et al. |
| 8,575,820 | B2 | 11/2013 | Shirakawa et al. |
| 8,610,518 | B1 * | 12/2013 | Solal .................... H03H 9/0066 |
| | | | 333/195 |
| 8,741,683 | B2 | 6/2014 | Huang et al. |
| 8,836,449 | B2 | 9/2014 | Pang et al. |
| 8,852,104 | B2 | 10/2014 | Oralkan et al. |
| 9,136,818 | B2 | 9/2015 | Burak et al. |
| 9,219,466 | B2 | 12/2015 | Meltaus et al. |
| 9,893,712 | B2 | 2/2018 | Meltaus et al. |
| 10,090,825 | B2 | 10/2018 | Kuroyanagi |
| 10,097,158 | B2 | 10/2018 | Kaneda et al. |
| 10,164,605 | B2 | 12/2018 | Burak et al. |
| 10,211,806 | B2 | 2/2019 | Bhattacharjee |
| 10,243,536 | B2 | 3/2019 | Saijo et al. |
| 10,250,222 | B2 | 4/2019 | Kuroyanagi et al. |
| 10,305,443 | B2 | 5/2019 | Bhattacharjee |
| 10,374,573 | B2 | 8/2019 | Bhattacharjee |
| 10,389,332 | B2 | 8/2019 | Bhattacharjee |
| 10,453,636 | B1 | 10/2019 | Khlat |
| 10,601,392 | B2 | 3/2020 | Plesski et al. |
| 10,601,398 | B2 | 3/2020 | Sturzebecher et al. |
| 10,819,309 | B1 | 10/2020 | Turner et al. |
| 11,101,787 | B2 | 8/2021 | Ando et al. |
| 11,309,866 | B2 | 4/2022 | Omura |
| 11,368,137 | B2 | 6/2022 | Goto et al. |
| 11,463,065 | B2 | 10/2022 | Goto |
| 11,552,614 | B2 | 1/2023 | Caron et al. |
| 11,616,487 | B2 | 3/2023 | Nakamura et al. |
| 11,689,178 | B2 | 6/2023 | Nakamura et al. |
| 11,799,443 | B2 | 10/2023 | Omura et al. |
| 11,894,828 | B2 | 2/2024 | Nakamura et al. |
| 12,009,797 | B2 | 6/2024 | Goto |
| 12,063,026 | B2 | 8/2024 | Caron et al. |
| 12,119,804 | B2 | 10/2024 | Yamane et al. |
| 12,136,910 | B2 | 11/2024 | Goto |
| 12,334,899 | B2 | 6/2025 | Nakamura et al. |
| 12,341,486 | B2 | 6/2025 | Shin et al. |
| 12,355,423 | B2 | 7/2025 | Torazawa et al. |
| 12,413,203 | B2 | 9/2025 | Kimura |
| 2005/0005323 | A1 | 1/2005 | Birch et al. |

| | | | |
|---|---|---|---|
| 2005/0057323 | A1 | 3/2005 | Kando et al. |
| 2005/0206476 | A1 | 9/2005 | Ella et al. |
| 2006/0138902 | A1 | 6/2006 | Kando |
| 2007/0176710 | A1 | 8/2007 | Jamneala et al. |
| 2008/0169574 | A1 | 7/2008 | Molkkari et al. |
| 2008/0169884 | A1 | 7/2008 | Matsumoto et al. |
| 2008/0204857 | A1 | 8/2008 | Godshalk et al. |
| 2008/0297280 | A1 | 12/2008 | Thalhammer et al. |
| 2009/0009262 | A1 | 1/2009 | Schmidhammer et al. |
| 2009/0096550 | A1 | 4/2009 | Handtmann et al. |
| 2009/0115287 | A1 | 5/2009 | Kando |
| 2009/0265903 | A1 | 10/2009 | Handtmann et al. |
| 2009/0267457 | A1 | 10/2009 | Barber et al. |
| 2010/0244624 | A1 | 9/2010 | Matsuda et al. |
| 2010/0268152 | A1 | 10/2010 | Oralkan et al. |
| 2011/0084779 | A1 | 4/2011 | Zhang |
| 2011/0109196 | A1 | 5/2011 | Goto et al. |
| 2011/0193655 | A1 | 8/2011 | Kamiguchi et al. |
| 2011/0241481 | A1 | 10/2011 | Kimura et al. |
| 2011/0266917 | A1 | 11/2011 | Metzger et al. |
| 2011/0273243 | A1 | 11/2011 | Domingue et al. |
| 2012/0025931 | A1 | 2/2012 | Yamamoto et al. |
| 2012/0049690 | A1 | 3/2012 | Okamoto et al. |
| 2012/0164753 | A1 | 6/2012 | Johnston et al. |
| 2012/0198672 | A1 | 8/2012 | Ueda et al. |
| 2013/0026881 | A1 | 1/2013 | Okamoto et al. |
| 2013/0051588 | A1 | 2/2013 | Ruile et al. |
| 2013/0099630 | A1 | 4/2013 | Matsuda et al. |
| 2013/0176085 | A1 | 7/2013 | Barber et al. |
| 2013/0285768 | A1 | 10/2013 | Watanabe et al. |
| 2014/0003196 | A1 | 1/2014 | Tajima |
| 2014/0203893 | A1 | 7/2014 | Kando et al. |
| 2014/0217566 | A1 | 8/2014 | Goida et al. |
| 2015/0028720 | A1 | 1/2015 | Kando |
| 2015/0033521 | A1 | 2/2015 | Watanabe et al. |
| 2015/0102705 | A1 | 4/2015 | Iwamoto et al. |
| 2015/0243873 | A1 | 8/2015 | Nakanishi et al. |
| 2016/0044677 | A1 | 2/2016 | King et al. |
| 2016/0149553 | A1 | 5/2016 | Yoon et al. |
| 2016/0182007 | A1 | 6/2016 | Bhattacharjee |
| 2016/0182009 | A1 * | 6/2016 | Bhattacharjee .... H03H 9/02574 |
| | | | 310/313 R |
| 2017/0111066 | A1 | 4/2017 | King et al. |
| 2017/0141752 | A1 | 5/2017 | Hino |
| 2017/0170808 | A1 | 6/2017 | Iwaki et al. |
| 2017/0179920 | A1 | 6/2017 | Kawasaki |
| 2017/0201234 | A1 | 7/2017 | Jger et al. |
| 2017/0214382 | A1 | 7/2017 | Bhattacharjee |
| 2017/0214388 | A1 | 7/2017 | Irieda et al. |
| 2017/0250674 | A1 | 8/2017 | Takamine et al. |
| 2017/0331451 | A1 | 11/2017 | Yoon et al. |
| 2017/0366163 | A1 | 12/2017 | Kishimoto |
| 2018/0019832 | A1 | 1/2018 | Okuda |
| 2018/0054179 | A1 | 2/2018 | Gamble et al. |
| 2018/0097508 | A1 | 4/2018 | Iwamoto et al. |
| 2018/0269852 | A1 | 9/2018 | Daimon et al. |
| 2018/0287587 | A1 | 10/2018 | Campanella Pineda et al. |
| 2019/0028082 | A1 | 1/2019 | Jaeger et al. |
| 2019/0089328 | A1 | 3/2019 | Unterreithmeier |
| 2019/0097606 | A1 | 3/2019 | Nosaka et al. |
| 2019/0103853 | A1 | 4/2019 | Burak et al. |
| 2019/0149123 | A1 | 5/2019 | Sakashita |
| 2019/0181827 | A1 | 6/2019 | Timme et al. |
| 2019/0199324 | A1 | 6/2019 | Matsumoto et al. |
| 2019/0253036 | A1 | 8/2019 | Han et al. |
| 2019/0326874 | A1 | 10/2019 | Nakamura et al. |
| 2019/0326875 | A1 | 10/2019 | Nakamura et al. |
| 2019/0326879 | A1 * | 10/2019 | Nakamura ............... H03H 9/54 |
| 2019/0341885 | A1 * | 11/2019 | Jackson ................ H03B 5/326 |
| 2019/0356296 | A1 | 11/2019 | Mimura |
| 2019/0386637 | A1 | 12/2019 | Plesski et al. |
| 2019/0393924 | A1 | 12/2019 | Campbell |
| 2020/0028487 | A1 | 1/2020 | Caron |
| 2020/0067482 | A1 | 2/2020 | Maki et al. |
| 2020/0083860 | A1 | 3/2020 | Ylilammi et al. |
| 2020/0091892 | A1 | 3/2020 | Watanabe et al. |
| 2020/0106420 | A1 | 4/2020 | Kodama et al. |
| 2020/0144984 | A1 | 5/2020 | Fukuhara et al. |
| 2020/0212876 | A1 | 7/2020 | Goto et al. |

(56) References Cited

U.S. PATENT DOCUMENTS

| | | |
|---|---|---|
| 2020/0228089 A1 | 7/2020 | Tajic et al. |
| 2020/0304092 A1 | 9/2020 | Suzuki et al. |
| 2020/0304096 A1 | 9/2020 | Suzuki et al. |
| 2020/0328727 A1 | 10/2020 | Daimon |
| 2020/0358423 A1 | 11/2020 | Pao et al. |
| 2021/0044278 A1 | 2/2021 | Kankar et al. |
| 2021/0091742 A1 | 3/2021 | Gorisse et al. |
| 2021/0111135 A1 | 4/2021 | Li et al. |
| 2021/0119602 A1 | 4/2021 | Lu et al. |
| 2021/0126625 A1 | 4/2021 | Wang et al. |
| 2021/0143793 A1 | 5/2021 | Shirakawa et al. |
| 2021/0159877 A1* | 5/2021 | Fukuhara ........... H03H 9/02574 |
| 2021/0167752 A1 | 6/2021 | Caron et al. |
| 2021/0167753 A1 | 6/2021 | Goto |
| 2021/0203305 A1 | 7/2021 | Maki et al. |
| 2021/0313950 A1 | 10/2021 | Han et al. |
| 2021/0399711 A1 | 12/2021 | Ajima et al. |
| 2021/0408994 A1 | 12/2021 | Nagatomo et al. |
| 2022/0140224 A1 | 5/2022 | Hamasaki et al. |
| 2022/0149803 A1 | 5/2022 | Shuai et al. |
| 2022/0158612 A1 | 5/2022 | Goto et al. |
| 2022/0200566 A1 | 6/2022 | Kadota et al. |
| 2022/0216846 A1 | 7/2022 | Yamane et al. |
| 2022/0231651 A1 | 7/2022 | Luo |
| 2022/0286105 A1 | 9/2022 | Goto et al. |
| 2022/0321079 A1 | 10/2022 | Liu |
| 2022/0321088 A1 | 10/2022 | Goto et al. |
| 2022/0321095 A1 | 10/2022 | Liu et al. |
| 2022/0321096 A1 | 10/2022 | Goto et al. |
| 2022/0407487 A1 | 12/2022 | Liu |
| 2023/0103956 A1 | 4/2023 | Fukuhara et al. |
| 2023/0104500 A1 | 4/2023 | Fukuhara et al. |
| 2023/0105034 A1 | 4/2023 | Fukuhara et al. |
| 2023/0107728 A1 | 4/2023 | Fukuhara et al. |
| 2023/0107820 A1 | 4/2023 | Fukuhara et al. |
| 2023/0108686 A1 | 4/2023 | Fukuhara et al. |
| 2023/0121844 A1 | 4/2023 | Goto |
| 2023/0123285 A1 | 4/2023 | Goto et al. |
| 2023/0163746 A1 | 5/2023 | Caron et al. |
| 2023/0208384 A1 | 6/2023 | Goto et al. |
| 2023/0283255 A1 | 9/2023 | Nakamura et al. |
| 2023/0378930 A1 | 11/2023 | Goto et al. |
| 2024/0113679 A1 | 4/2024 | Goto et al. |
| 2024/0356515 A1 | 10/2024 | Goto |
| 2024/0356516 A1 | 10/2024 | Caron et al. |
| 2025/0023554 A1 | 1/2025 | Okada et al. |
| 2025/0030401 A1 | 1/2025 | Goto |

FOREIGN PATENT DOCUMENTS

| | | |
|---|---|---|
| JP | H05-95249 | 4/1993 |
| JP | 3710445 | 10/2005 |
| JP | 2011-066492 | 3/2011 |
| JP | 2015-146333 | 8/2015 |
| JP | 2017-528060 | 9/2017 |
| KR | 799438 B1 | 1/2008 |
| KR | 10-2013-0086378 | 8/2013 |
| SG | 10-2020-12058 | 7/2021 |
| TW | 2010-21409 | 6/2010 |
| WO | WO 1998/52279 | 11/1998 |
| WO | WO 2010/004741 | 1/2010 |
| WO | WO 2011/046117 | 4/2011 |
| WO | WO 2011/158445 | 12/2011 |
| WO | WO 2012/086639 | 6/2012 |
| WO | WO 2017/043427 | 3/2017 |
| WO | WO 2017/068828 | 4/2017 |
| WO | WO 2017/138540 | 8/2017 |
| WO | 2017/161303 A1 | 9/2017 |

OTHER PUBLICATIONS

Written Opinion in application No. 10202012082V, dated Sep. 15, 2023, in.

Yen et al., "Integrated High-performance Clocking Solutions Utilizing Mirror-encapsulated BAW Resonators", Program Digest, 2019 IEEE International Ultrasonics Symposium (IUS), Glasgow, Scotland (Oct. 6-9, 2019).

Aslam et al., "Surface acoustic wave modes characteristics of CMOS compatible SiO2/AlN/SiO2/Si multilayer structure with embedded electrodes", Sensors and Actuators A: Physical, vol. 313:112202 (2020).

Drafts, Bill, "Acoustic Wave Technology Sensors", Fierce Electronics article, Oct. 1, 2000.

Kando et al., "RF Filter using Boundary Acoustic Wave," Japanese Journal of Applied Physics, vol. 45, No. 5B, May 25, 2006, pp. 4651-4654.

Kando, Hajime, et al., "RF Filter using Boundary Acoustic Wave," 2006 IEEE Ultrasonics Symposium, pp. 188-191.

Kimura et al., "A High Velocity and Wideband SAW on a Thin LiNbO3 Plate Bonded on a Si Substrate in the SHF Range", IEEE International Ultrasonics Symposium (2019).

Pitschi et al., "Approaches to wafer level packaging for SAW components", 2013 IEEE MTT-S International Microwave Symposium Digest (MTT), 2013.

Irino, Toshio, et al., "Propagation of Boundary Acoustic Waves along a ZnO Layer between Two Materials," IEEE Ultrasonics Symposium, 1986, pp. 195-200.

Wang, Yiliu, et al., "Change in Piezoelectric Boundary Acoustic Wave Characteristics with Overlay and Metal Grating Materials," Conference Paper, Apr. 2009, pp. 241-244.

Yamane, Takashi, et al., "A Miniaturized UMTS Band II Duplexer Employing Piezoelectric Boundary Acoustic Wave," Proceedings of the Asia-Pacific Microwave Conference 2011, pp. 550-553.

Mimura, M., et al., "Low Acoustic Velocity Rayleigh SAW Technology for Miniaturization of High Performance TC-Saw Devices", Seventh International Symposium on Acoustic Wave Devices for Future Mobile Communication Systems., Mar. 7, 2018, 8 pages.

Nakamura, H., et al., "Suppression Mechanism of Transverse-Mode Spurious Responses in SAW Resonators on a SiO2/Al/LiNbO3 Structure", IEEE International Ultrasonics Symposium Proceedings, 2011, 4 pages.

* cited by examiner pm
110
88
66    ↑ HIGHER
44    │ DISPLACEMENT
22
0 pm
17
13.6
10.2  ↑ HIGHER
6.8   │ DISPLACEMENT
3.4
0.0

Y–PARAMETER

200

227
22
20
222
224
22
20,202
20
214
212
20
22
217

220
225
226
201
216
215
210

200

227
22
20
224
222

220
225

22
20,202
20

201
226
216

212
214
20
22
217

210
215

300

310

320

330

RF_IN — RF_OUT

332

RF1 — 330A

COM

RF2 — 330B

334

RF1 — 330A

COM

RFN — 330N

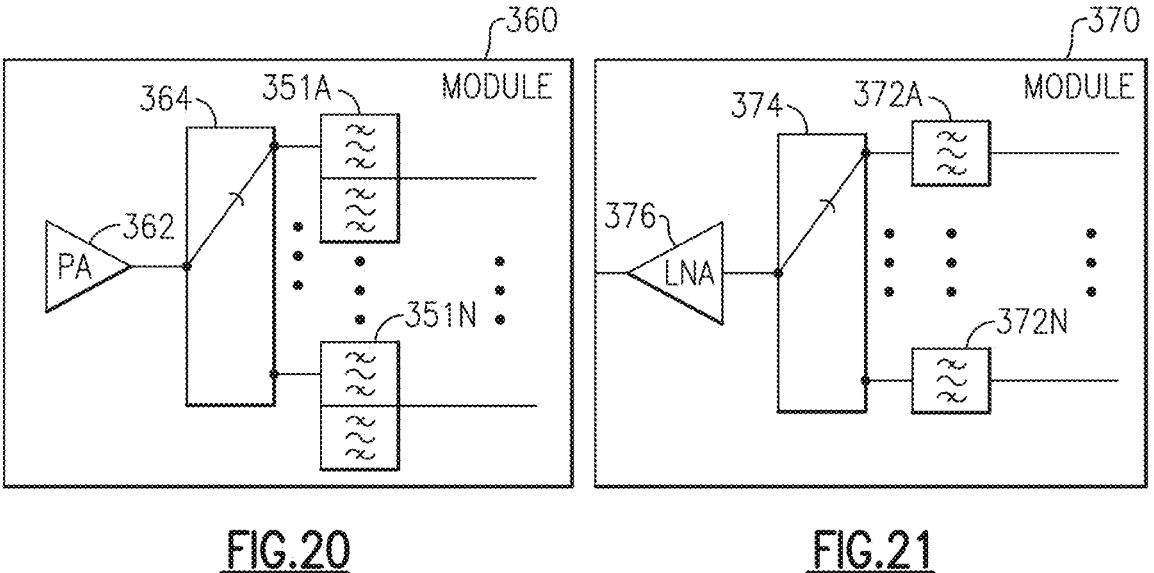
FIG.20
FIG.21
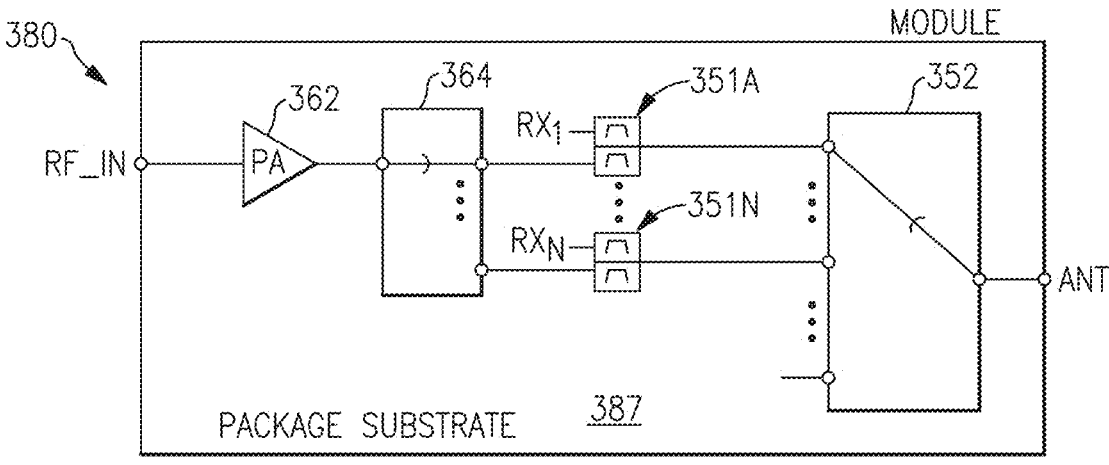
FIG.22

STACKED ACOUSTIC WAVE DEVICE ASSEMBLY

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/252,508, filed Oct. 5, 2021, titled "STACKED ACOUSTIC WAVE DEVICE ASSEMBLY" are hereby incorporated by reference under 37 CFR 1.57 in their entirety.

BACKGROUND

Technical Field

Embodiments of the invention relate to stacked acoustic wave device assemblies.

Description of the Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs). Certain acoustic resonators can include features of SAW resonators and features of BAW resonators. A stacked acoustic wave device assembly can include a plurality of acoustic wave devices (or: acoustic wave resonators).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. The two acoustic wave filters of a duplexer can be included in one stacked acoustic wave device assembly. As another example, four acoustic wave filters can be arranged as a quadplexer, for example four acoustic wave filters provided by the two acoustic filter devices of each of two stacked acoustic wave devices assemblies.

SUMMARY

The innovations described in the claims each have several aspects, no single one of which is solely responsible for its desirable attributes. Without limiting the scope of the claims, some prominent features of this disclosure will now be briefly described.

In one aspect, a stacked acoustic wave device assembly is disclosed. The stacked acoustic wave device assembly can include a first acoustic wave device that includes a first solid acoustic mirror on a first substrate, a first piezoelectric layer on the first solid acoustic mirror, and a first interdigital transducer electrode in contact with the first piezoelectric layer. The stacked acoustic wave device assembly can include a second acoustic wave device that includes a second solid acoustic mirror on a second substrate, a second piezoelectric layer on the second solid acoustic mirror, and a second interdigital transducer electrode in contact with the second piezoelectric layer. The stacked acoustic wave device assembly can include a third solid acoustic mirror that is positioned between the first acoustic wave device and the second acoustic wave device.

In one embodiment, the first piezoelectric layer is arranged between the first interdigital transducer electrode and the first substrate.

In one embodiment, the second interdigital transducer electrode is arranged between the second interdigital transducer electrode and the second substrate.

In one embodiment, wherein the first solid acoustic mirror, the first piezoelectric layer, the first interdigital transducer electrode, the second interdigital transducer electrode, the third solid acoustic mirror, the second piezoelectric layer, and the second solid acoustic mirror are positioned between the first substrate and the second substrate.

In one embodiment, the third solid acoustic mirror includes a first section adapted to mirror frequencies for which the first acoustic wave device is configured. The first section can be arranged in contact with the first acoustic wave device.

In one embodiment, the third solid acoustic mirror includes a second section adapted to mirror frequencies for which the second acoustic wave device is configured. The second section can be arranged in contact with the second acoustic wave device. The first and the second section of the third solid acoustic mirror can be arranged in contact with one another.

In one embodiment, the first acoustic wave device, the second acoustic wave device, and the third solid acoustic mirror are stacked such as to minimize the footprint of the stacked acoustic wave device assembly.

In one embodiment, the first acoustic wave device is a laterally excited bulk acoustic wave resonator. The first piezoelectric layer can include a lithium niobate crystal cut with a surface normal orientation of $(\alpha, \beta, \gamma)$, with $\alpha$ between $-10°$ and $+10°$, $\beta$ between $-10°$ and $+10°$, and $\gamma$ between $80°$ and $100°$ in Euler angles. The first piezoelectric layer can include a lithium niobate crystal cut with a surface normal orientation of $(\alpha, \beta, \gamma)=(0°, 0°, 90°)$ in Euler angles.

In one embodiment, the second acoustic wave device is a laterally excited bulk acoustic wave resonator. The second piezoelectric layer can include a lithium niobate crystal cut with a surface normal orientation of $(\alpha, \beta, \gamma)$, with $\alpha$ between $-10°$ and $+10°$, $\beta$ between $-10°$ and $+10°$, and $\gamma$ between $80°$ and $100°$ in Euler angles. The second piezoelectric layer can include a lithium niobate crystal cut with a surface normal orientation of $(\alpha, \beta, \gamma)=(0°, 0°, 90°)$ in Euler angles.

In one embodiment, the first acoustic wave device is a leaky longitudinal surface acoustic wave resonator. The first piezoelectric layer can include a lithium niobate crystal cut with a surface normal orientation of $(\alpha, \beta, \gamma)$, with $\alpha$ between $80°$ and $100°$, $\beta$ between $80°$ and $100°$, and $\gamma$ between $30°$ and $50°$. The first piezoelectric layer can include a lithium niobate crystal cut with a surface normal orientation of $(\alpha, \beta, \gamma)=(90°, 90°, 40°)$ in Euler angles. The first piezoelectric layer can include a lithium niobate crystal cut with a surface normal orientation of $(\alpha, \beta, \gamma)$, with $\alpha$ between $-10°$ and $+10°$, $\beta$ between $70°$ and $110°$, and $\gamma$ between $80°$ and $100°$. The first piezoelectric layer can include a lithium niobate crystal cut with a surface normal orientation of $(\alpha, \beta, \gamma)=(0°, 90°, 90°)$ in Euler angles.

In one embodiment, the second acoustic wave device is a leaky longitudinal surface acoustic wave resonator. The second piezoelectric layer can include a lithium niobate crystal cut with a surface normal orientation of $(\alpha, \beta, \gamma)$, with $\alpha$ between 80° and 100°, $\beta$ between 80° and 100°, and $\gamma$ between 30° and 50°. The second piezoelectric layer can include a lithium niobate crystal cut with a surface normal orientation of (90°, 90°, 40°) in Euler angles. The second piezoelectric layer can include a lithium niobate crystal cut with a surface normal orientation of $(\alpha, \beta, \gamma)$, with $\alpha$ between −10° and +10°, $\beta$ between 70° and 110°, and $\gamma$ between 80° and 100°. The second piezoelectric layer can include a lithium niobate crystal cut with a surface normal orientation of $(\alpha, \beta, \gamma)=(0°, 90°, 90°)$ in Euler angles.

In one embodiment, the first interdigital transducer electrode is arranged on the first piezoelectric layer.

In one embodiment, the second interdigital transducer electrode is arranged on the second piezoelectric layer.

In one embodiment, the first interdigital transducer electrode is completely enclosed by the first piezoelectric layer.

In one embodiment, the second interdigital transducer electrode is completely enclosed by the second piezoelectric layer.

In one embodiment, the first interdigital transducer electrode is partially enclosed by the first piezoelectric layer. A surface of the first interdigital transducer electrode can be flush with a surface of the first piezoelectric layer.

In one embodiment, the second interdigital transducer electrode is partially enclosed by the second piezoelectric layer. A surface of the second interdigital transducer electrode can be flush with a surface of the second piezoelectric layer.

In one embodiment, the stacked acoustic wave device assembly is used for filtering a first electric signal with the first acoustic wave device and for filtering a second electric signal with the second acoustic wave device.

In one embodiment, the stacked acoustic wave device assembly is used for filtering an electric signal with the first acoustic wave device and with the second acoustic wave device.

In one aspect, a radio frequency module is disclosed. The radio frequency module can include a first acoustic wave device that includes a first solid acoustic mirror on a first substrate, a first piezoelectric layer on the first solid acoustic mirror, and a first interdigital transducer electrode in contact with the first piezoelectric layer. The radio frequency module can include a first radio frequency circuit element that is coupled to the first acoustic wave device. The radio frequency module can include a second acoustic wave device that includes a second solid acoustic mirror on a second substrate, a second piezoelectric layer on the second solid acoustic mirror, and a second interdigital transducer electrode in contact with the second piezoelectric layer. The radio frequency module can include a third solid acoustic mirror that is positioned between the first acoustic wave device and the second acoustic wave device. The first acoustic wave device, the second acoustic wave device, the third solid acoustic mirror, and the radio frequency circuit element are enclosed within a common package.

In one embodiment, the first radio frequency circuit element is a radio frequency amplifier arranged to amplify a radio frequency signal.

In one embodiment, the first radio frequency amplifier is a low noise amplifier.

In one embodiment, the first radio frequency amplifier is a power amplifier.

In one embodiment, the radio frequency module further includes a first switch that is configured to selectively couple a terminal of the first acoustic wave device to an antenna port of the first radio frequency module.

In one embodiment, the first radio frequency circuit element is a first switch that is configured to selectively couple the first acoustic wave device to an antenna port of the first radio frequency module.

In one embodiment, the radio frequency module further includes a second radio frequency circuit element which is coupled to the second acoustic wave device and which is also enclosed within the common package.

In one embodiment, the first radio frequency circuit element is a radio frequency amplifier arranged to amplify a radio frequency signal.

In one embodiment, the second radio frequency amplifier is a low noise amplifier.

In one embodiment, the second radio frequency amplifier is a power amplifier.

In one embodiment, the radio frequency module further includes a second switch configured to selectively couple a terminal of the second acoustic wave device to an antenna port of the second radio frequency module. The second radio frequency circuit element can be a second switch that is configured to selectively couple the second acoustic wave device to an antenna port of the second radio frequency module.

In one aspect, a wireless communication device is disclosed. The wireless communication device can include a first acoustic wave device that includes a first solid acoustic mirror on a first substrate, a first piezoelectric layer on the first solid acoustic mirror, and a first interdigital transducer electrode in contact with the first piezoelectric layer. The wireless communication device can include a second acoustic wave device that includes a second solid acoustic mirror on a second substrate, a second piezoelectric layer on the second solid acoustic mirror, and a second interdigital transducer electrode in contact with the second piezoelectric layer. The wireless communication device can include an antenna that is operatively coupled to the first acoustic wave device and the second acoustic wave device, a radio frequency amplifier that is operatively coupled to the first acoustic wave device and configured to amplify a radio frequency signal, a transceiver that is in communication with the radio frequency amplifier, and a third solid acoustic mirror that is positioned between the first acoustic wave device and the second acoustic wave device.

In one embodiment, the wireless communication device further includes a baseband processor that is in communication with the transceiver.

In one embodiment, the first acoustic wave device is included in a radio frequency front end.

In one embodiment, the first acoustic wave device is included in a diversity receive module.

In one aspect, a method of filtering a radio frequency signal is disclosed. The method can include receiving a radio frequency signal at a port of a stacked acoustic wave device assembly that includes a first acoustic wave device including a first solid acoustic mirror on a first substrate, a first piezoelectric layer on the first solid acoustic mirror, and a first interdigital transducer electrode in contact with the first piezoelectric layer, a second acoustic wave device that includes a second solid acoustic mirror on a second substrate, a second piezoelectric layer on the second solid acoustic mirror, and a second interdigital transducer electrode in contact with the second piezoelectric layer, and a third solid acoustic mirror positioned between the first acoustic wave device and the second acoustic wave device. The method can include filtering the radio frequency signal with the first acoustic wave device or with the second acoustic wave device or with both.

In one aspect, a stacked acoustic wave device assembly is disclosed. The stacked acoustic wave device assembly can include a first acoustic wave device that includes a first double acoustic mirror structure having a first solid acoustic mirror and a second solid acoustic mirror, and a first piezoelectric layer between the first and second solid acoustic mirrors. The stacked acoustic wave device assembly can include a second acoustic wave device that includes a second double acoustic mirror structure having a third solid acoustic mirror and a fourth acoustic mirror, and a second piezoelectric layer between the third and fourth acoustic mirrors. The second acoustic wave device is vertically stacked on the first acoustic wave device such that the second solid acoustic mirror and the fourth solid acoustic mirror are positioned between the first and second piezoelectric layers.

In one embodiment, the first acoustic wave device includes a first interdigital transducer electrode formed on or with the first piezoelectric layer and the second acoustic wave device includes a second interdigital transducer electrode formed on or with the second piezoelectric layer. The first interdigital transducer electrode can be at least partially embedded in the first piezoelectric layer. The second interdigital transducer electrode can be at least partially embedded in the second piezoelectric layer.

In one embodiment, the first solid acoustic mirror and the second solid acoustic mirror are configured to confine acoustic energy generated by the first acoustic wave device, and the third solid acoustic mirror and the fourth solid acoustic mirror are configured to confine acoustic energy generated by the second acoustic wave device. The first, second, third, and fourth solid acoustic mirrors each includes alternating low impedance layers and high impedance layers that have a higher impedance than the low impedance layer. A pitch of the alternating low impedance layers and high impedance layers of the first acoustic mirror can be different from a pitch of the alternating low impedance layers and high impedance layers of the third acoustic mirror. The first acoustic wave device can be configured to generate an acoustic wave having a first wavelength, and the second acoustic wave device can be configured to generate an acoustic wave having a second wavelength higher than the first wavelength. The pitch of the alternating low impedance layers and high impedance layers of the first acoustic mirror can be wider than the pitch of the alternating low impedance layers and high impedance layers of the third acoustic mirror.

In one embodiment, the second solid acoustic mirror and the fourth solid acoustic mirror are defined in different sections of a solid acoustic mirror structure.

In one embodiment, at least one of the first acoustic wave device or the second acoustic wave device is a laterally excited bulk acoustic wave resonator.

In one embodiment, at least one of the first acoustic wave device or the second acoustic wave device is a leaky longitudinal surface acoustic wave resonator.

In one embodiment, the first acoustic wave device includes a support substrate positioned such that the first solid acoustic mirror is positioned between the first piezoelectric layer and the support substrate.

In one embodiment, the stacked acoustic wave device assembly further includes a third acoustic wave device stacked on the second acoustic wave device.

In one aspect, a stacked acoustic wave device assembly is disclosed. The stacked acoustic wave device assembly can include a first solid acoustic mirror and a first piezoelectric layer on the first solid acoustic mirror. A first interdigital transducer electrode is formed on or with the first piezoelectric layer. The first solid acoustic mirror is configured to confine acoustic energy generated by the first interdigital transducer electrode. The stacked acoustic wave device assembly can include a second solid acoustic mirror over the first piezoelectric layer, and a second piezoelectric layer over the second solid acoustic mirror. A second interdigital transducer electrode is formed on or with the second piezoelectric layer. The stacked acoustic wave device assembly can include a third solid acoustic mirror over the second piezoelectric layer. The third solid acoustic mirror is configured to confine acoustic energy generated by the second interdigital transducer electrode.

In one embodiment, the stacked acoustic wave device assembly further includes a fourth solid acoustic mirror between the second solid acoustic mirror and the second piezoelectric layer. The fourth solid acoustic mirror is in contact with the second piezoelectric layer. The stacked acoustic wave device assembly can further include a fourth solid acoustic mirror between the second solid acoustic mirror and the second piezoelectric layer. The fourth solid acoustic mirror can be in contact with the second piezoelectric layer.

In one embodiment, the first solid acoustic mirror and the second solid acoustic mirror define a first double acoustic mirror structure. The third solid acoustic mirror and the fourth solid acoustic mirror define a second double acoustic mirror structure.

In one embodiment, the first solid acoustic mirror, second solid acoustic mirror, and the first piezoelectric layer at least partially define a first acoustic wave device. The third solid acoustic mirror, second solid acoustic mirror, and the second piezoelectric layer at least partially define a second acoustic wave device.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/936,571, titled "STACKED STRUCTURE WITH MULTIPLE ACOUSTIC WAVE DEVICES," filed on even date herewith filed on even date herewith, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

FIG. 20 is a schematic block diagram of a module that includes a power amplifier, a radio frequency switch, and duplexers.

FIG. 21 is a schematic block diagram of a module that includes a low noise amplifier, a radio frequency switch, and filters.

FIG. 22 is a schematic diagram of a radio frequency module that includes an acoustic wave filter.

DETAILED DESCRIPTION OF CERTAIN EMBODIMENTS

Figure 1B:
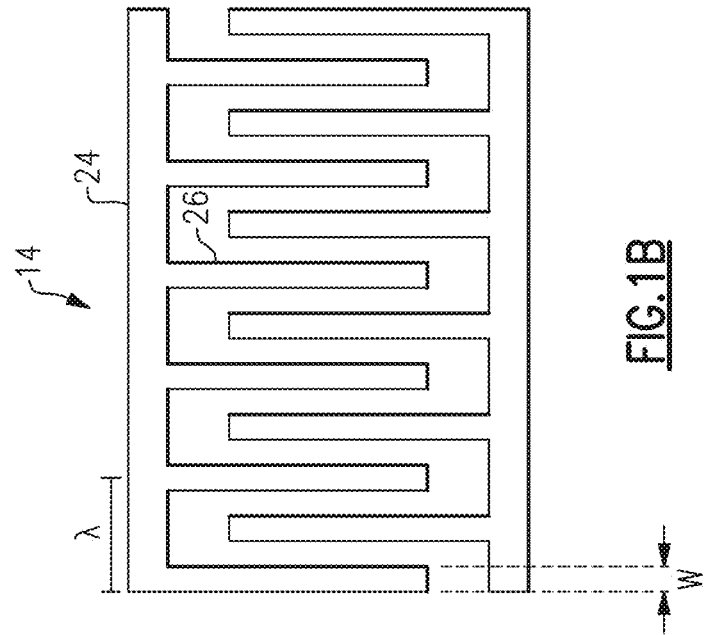
FIG. 1B is a schematic top plan view of an interdigital transducer (IDT) electrode of the laterally excited bulk acoustic wave device of FIG. 1A.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Laterally excited bulk acoustic wave resonators can be included in acoustic wave filters for high frequency bands, such as frequency bands above 3 Gigahertz (GHz) and/or frequency bands above 5 GHz. Such frequency bands can include a fifth generation (5G) New Radio (NR) operating band. Certain laterally excited bulk acoustic wave resonators can include an interdigital transducer (IDT) electrode on a relatively thin piezoelectric layer. A bulk acoustic wave (BAW) mode excited by the IDT electrode is not strongly affected by the pitch of IDT electrode in certain applications. Accordingly, the BAW resonator can have a higher operating frequency than certain conventional surface acoustic wave (SAW) resonators. Certain laterally excited bulk acoustic wave resonators can be free standing. However, heat dissipation can be undesirable for such free standing laterally excited bulk acoustic wave resonators. Power durability and/or mechanical ruggedness of such laterally excited bulk acoustic wave resonators can be a technical concern. Free standing laterally excited bulk acoustic wave resonators with lithium niobate or lithium tantalate piezoelectric layers can encounter problems related to power durability in, for example, transmit filter applications.

Heat dissipation and mechanical ruggedness can be improved by bonding a piezoelectric layer to a support substrate with a relatively high thermal conductivity. By bonding the piezoelectric layer directly to the support substrate, resonant characteristics can be degraded by leakage into support substrate.

Aspects of this disclosure relate to a laterally excited bulk acoustic wave resonator with a solid acoustic mirror positioned between a piezoelectric layer and a support substrate, and a stacked structure including the laterally excited bulk acoustic wave resonator. An IDT electrode can be positioned on the piezoelectric layer. The support substrate can have a relatively high thermal conductivity. For example, the support substrate can be a silicon support substrate. The solid acoustic mirror, which can be an acoustic Bragg reflector, can reduce and/or eliminate leakage into the support substrate. With such a structure, acoustic energy can be confined over the solid acoustic mirror effectively and heat can flow though the support substrate with the relatively high thermal conductivity. Mechanical ruggedness of such a laterally exited bulk acoustic wave resonator can be improved by avoiding an air cavity between the piezoelectric layer and the support substrate. At the same time, a relatively high frequency resonance can be achieved with desirable power durability.

A laterally excited bulk acoustic wave device including any suitable combination of features disclosed herein can be included in a filter arranged to filter a radio frequency signal in a fifth generation 5G NR operating band within Frequency Range 1 (FR1). A filter arranged to filter a radio frequency signal in a 5G NR operating band can include one or more laterally excited bulk acoustic wave device disclosed herein. FR1 can be from 410 MHz to 7.125 GHz, for example, as specified in a current 5G NR specification.

A laterally excited bulk acoustic wave device disclosed herein can be included in a filter arranged to filter a radio frequency signal having a frequency above FR1. For example, a laterally excited bulk acoustic wave device can be included in a filter arranged to filter radio frequency signals in a range from 10 GHz to 25 GHz. In applications where such high frequency signals are being transmitted, higher transmit powers can be used to account for higher loss in communication channels at higher frequencies.

Accordingly, thermal dissipation at high frequencies of laterally excited bulk acoustic wave devices disclosed herein can be desirable.

In certain 5G applications, the thermal dissipation of the acoustic wave disclosed herein can be advantageous. For example, such thermal dissipation can be desirable in 5G applications with a higher time-division duplexing (TDD) duty cycle compared to fourth generation (4G) Long Term Evolution (LTE) applications. As another example, there can be more ganging of filters and carrier aggregation in 5G applications than 4G LTE applications. Accordingly, signals can have higher power to account for losses associated with such ganging of filters and/or carrier aggregation. Thermal dissipation of laterally excited bulk acoustic wave devices disclosed can be implemented in these example applications to improve performance of filters.

Another type of acoustic wave resonators that can be used for frequency bands above 3 Gigahertz (GHz) and/or frequency bands above 5 GHz is the leaky longitudinal surface acoustic wave resonator, or LLSAW resonator. Leaky longitudinal surface acoustic wave resonators provide small propagation losses and high velocities. Suitable materials of a piezoelectric layer used in the LLSAW resonator can include lithium niobate and lithium tantalate. For example, for the piezoelectric layer of a leaky longitudinal surface acoustic wave device, a lithium niobate crystal may be cut along a plane with Euler angles of ($\alpha$, $\beta$, $\gamma$), with $\alpha$ between 80° and 100°, $\beta$ between 80° and 100°, and $\gamma$ between 30° and 50°. Especially preferred is a lithium niobate crystal cut along a plane with Euler angles of ($\alpha$, $\beta$, $\gamma$)=(90°, 90°, 40°). In some embodiments, the piezoelectric layer can have a cut angle of (90±30, 90±30, 40±30). Alternatively, for the piezoelectric layer of a leaky longitudinal surface acoustic wave device, a lithium niobate crystal may be cut along a plane with Euler angles of ($\alpha$, $\beta$, $\gamma$), with $\alpha$ between −10° and +10°, $\beta$ between 70° and 110°, and $\gamma$ between 80° and 100°. Especially preferred is a lithium niobate crystal cut along a plane with Euler angles of ($\alpha$, $\beta$, $\gamma$)=(0°, 90°, 90°). Aspects of this disclosure thus also relate to a leaky longitudinal surface acoustic resonator with a solid acoustic mirror positioned between a piezoelectric layer and a support substrate. All features and variants that are described herein with respect to laterally excited bulk acoustic wave resonators may also be applied (if necessary, mutatis mutandis) to leaky longitudinal surface acoustic wave resonators. Most embodiments and variants herein will be described with respect to laterally excited bulk acoustic wave resonators, laterally excited bulk acoustic wave devices, laterally excited bulk acoustic wave filters and so on. It shall be understood that, unless explicitly mentioned, the same embodiments and variants may also be provided with leaky longitudinal surface acoustic wave resonators, leaky longitudinal surface acoustic wave devices, leaky longitudinal surface acoustic wave filters and so on instead or in addition.

One or more laterally excited bulk acoustic wave devices and/or one or more leaky longitudinal surface acoustic wave devices in accordance with any suitable principles and advantages disclosed herein can be included in a filter (i.e. an acoustic wave filter) arranged to filter a radio frequency signal in a 4G LTE operating band and/or in a filter having a passband that includes a 4G LTE operating band and a 5G NR operating band.

Various embodiments disclosed herein relate to a stacked structure that includes a first acoustic wave device and a second acoustic wave device. The first and second acoustic wave devices can each include a double mirror structure. The double mirror structure can include a solid double mirror structure. In some embodiments, the first and second acoustic wave devices can share a solid acoustic mirror positioned between a first piezoelectric layer of the first acoustic wave device and a second piezoelectric layer of the second acoustic wave device. Including the solid acoustic mirror, as compared to including a cavity, can enable a more reliable acoustic wave device because any unwanted particle (e.g., debris) in the cavity can significantly degrade the performance of the device but the solid acoustic mirror can avoid or mitigate such issues.

Figure 1A:
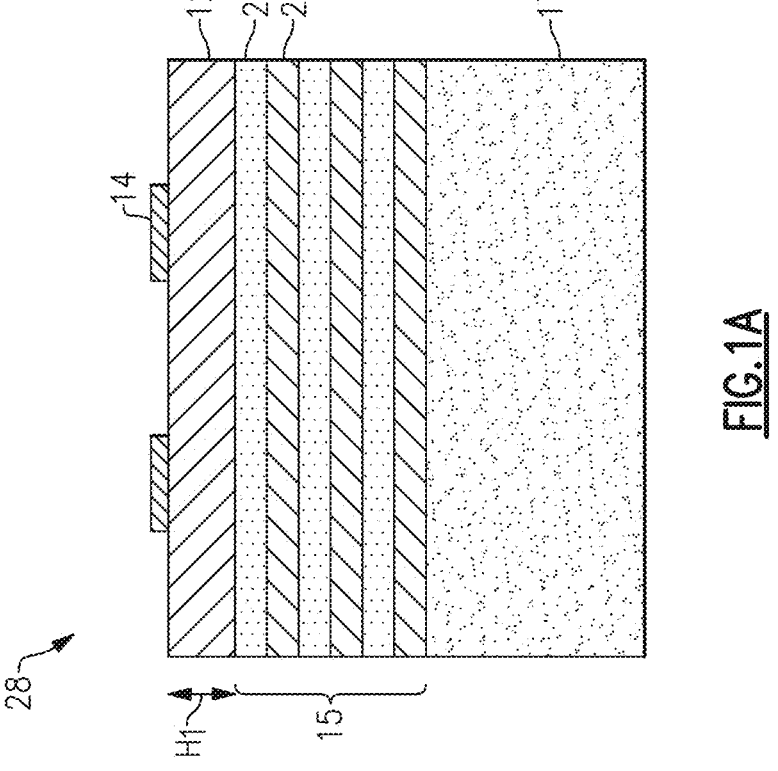
FIG. 1A is a schematic cross sectional side view of a laterally excited bulk acoustic wave device.

FIG. 1A is a schematic cross sectional side view of a laterally excited bulk acoustic wave device 28 with a solid acoustic mirror 15 according to an embodiment. The laterally excited bulk acoustic wave device 28 can be a laterally excited bulk acoustic wave resonator included in a filter. The laterally excited bulk acoustic wave device 28 can be any other suitable laterally excited bulk acoustic wave device, such as a device in a delay line. The laterally excited bulk acoustic wave device 28 can be implemented in relatively high frequency acoustic wave filters. Such acoustic wave filters can filter radio frequency signals having frequencies above 3 GHz and/over above 5 GHz. The laterally excited bulk acoustic wave device 28 can be any other suitable laterally excited bulk acoustic wave device, such as a device in a delay line. As illustrated, the laterally excited bulk acoustic wave device 28 includes a support substrate 17, a solid acoustic mirror 15 on the support substrate 17, a piezoelectric layer 12 on the solid acoustic mirror 15, and an IDT electrode 14 on the piezoelectric layer 12. The IDT electrode 14 is arranged to laterally excite a bulk acoustic wave. The substrate 17 can function like a heat sink. The substrate 17 can provide thermal dissipation and improve power durability of the laterally excited bulk acoustic wave device 28.

The piezoelectric layer 12 can be a lithium based piezoelectric layer. For example, the piezoelectric layer 12 can be a lithium niobate layer. As another example, the piezoelectric layer 12 can be a lithium tantalate layer. In certain applications, the piezoelectric layer 12 can be an aluminum nitride layer. The piezoelectric layer 12 can be any other suitable piezoelectric layer.

In certain surface acoustic wave resonators, there can be horizontal acoustic wave propagation. In such surface acoustic wave resonators, IDT electrode pitch can set the resonant frequency. Limitations of photolithography can set a lower bound on IDT electrode pitch and, consequently, resonant frequency of certain surface acoustic wave resonators.

The laterally excited bulk acoustic wave device 28 can generate a Lamb wave that is laterally excited. A resonant frequency of the laterally excited bulk acoustic wave device 28 can depend on a thickness H1 of the piezoelectric layer 12. The thickness H1 of the piezoelectric layer 12 can be a dominant factor in determining the resonant frequency for the laterally excited bulk acoustic wave device 28. The pitch of the IDT electrode 14 can be a second order factor in determining resonant frequency of the laterally excited bulk acoustic wave device 28. A thickness of a low impedance layer, such as a silicon dioxide layer, directly under the piezoelectric layer 12 can have a secondary impact on the resonant frequency of the laterally excited bulk acoustic wave device 28. The thickness of such a low impedance layer can be sufficient to adjust resonant frequency for a shunt resonator and a series resonator of a filter.

A combination of the thickness H1 of the piezoelectric layer 12 and acoustic velocity in the piezoelectric layer 12 can determine the approximate resonant frequency of the laterally excited bulk acoustic wave device 28. The resonant frequency can be increased by making the piezoelectric layer 12 thinner and/or by using a piezoelectric layer 12 with a higher acoustic velocity.

The piezoelectric layer 12 can be manufactured with a thickness H1 that is 0.2 micrometers or higher from the fabrication point of view. The piezoelectric layer 12 can have a thickness in a range from 0.2 micrometers to 0.4 micrometers in certain applications. The piezoelectric layer can have a thickness in a range from 0.2 micrometers to 0.3 micrometers. In certain applications, the piezoelectric layer can have a thickness H1>0.04L from the electrical performance (K2) point of view, in which L is IDT electrode pitch.

The laterally excited bulk acoustic wave device 28 with a 0.2 micrometer thick aluminum nitride piezoelectric layer 12 can have a resonant frequency of approximately 25 GHz. The laterally excited bulk acoustic wave device 28 with a 0.2 micrometer thick lithium niobate piezoelectric layer 12 can have a resonant frequency of approximately 10 GHz. The laterally excited bulk acoustic wave device 28 with a 0.4 micrometer thick lithium niobate piezoelectric layer 12 can have a resonant frequency of approximately 5 GHz. Based on the piezoelectric materials and thickness of the piezoelectric layer, the resonant frequency of the laterally excited bulk acoustic wave device 28 can be designed for filtering an RF signal having a particular frequency.

Odd harmonics for a laterally excited bulk acoustic wave resonator can have a k2 that is sufficiently large for a ladder filter in certain applications. Such odd harmonics (e.g., a 3rd harmonic) can have a k2 that is proportional to fundamental mode k2. A laterally excited bulk acoustic wave resonator using an odd harmonic can have a lithium niobate piezoelectric layer. The electromechanical coupling factor k2 (or, more formally, k2), is usually defined by:

$$k^2 = \frac{\pi}{2} \frac{f_s}{f_p} \tan\left(\frac{\pi}{2} \frac{\Delta f}{f_p}\right),$$

fs/> and fp the frequencies of the resonance and antiresonance, respectively, and Δf=fs−fp.

Filters that include one or more laterally excited bulk acoustic wave devices 28 can filter radio frequency signals up to about 10 GHz with a relatively wide bandwidth. Filters that include one or more laterally excited bulk acoustic wave devices 28 can filter radio frequency signals having a frequency in a range from 10 GHz to 25 GHz. In some instances, a filter that include one or more laterally excited bulk acoustic wave devices 28 can filter an RF signal having a frequency in a range from 3 GHz to 5 GHz, a range from 4.5 GHz to 10 GHz, a range from 5 GHz to 10 GHz, or a range from 10 GHz to 25 GHz.

In the laterally excited bulk acoustic wave device 28, the IDT electrode 14 is positioned over the piezoelectric layer 12. As illustrated, the IDT electrode 14 has a first side in physical contact with the piezoelectric layer 12 and a second side opposite the first side. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications.

The solid acoustic mirror 15 includes alternating low impedance layers 20 and high impedance layers 22. Accordingly, the solid acoustic mirror 15 is an acoustic Bragg reflector. The low impedance layers 20 can be any suitable low impedance material such as silicon dioxide (SiO$_2$) or the like. The high impedance layers 22 can be any suitable high impedance material such as platinum (Pt), tungsten (W), iridium (Ir), aluminum nitride (AlN), molybdenum (Mo), or the like.

As illustrated, the layer of the solid acoustic mirror 15 closest to the piezoelectric layer 12 is a low impedance layer 20. Having a low impedance layer 20 closest to the piezo-electric layer 12 can increase an electromechanical coupling coefficient (k2) of the laterally excited bulk acoustic wave device 28 and/or bring a temperature coefficient of fre-quency (TCF) of the laterally excited bulk acoustic wave device 28 closer to 0 in certain instances.

As illustrated, the layer of the solid acoustic mirror 15 closest to the substrate 17 is a high impedance layer 22. Having a high impedance layer 22 closest to the substrate 17 can increase reflection of the layer of the solid acoustic mirror 15 closest to the substrate 17. Alternatively, a solid acoustic mirror (not illustrated) with a low impedance layer 20 closest to the substrate 17 can have a higher adhesion with the substrate 17. For example, when the substrate 17 is a silicon substrate, the substrate should have a higher adhesion with a solid acoustic mirror with a silicon dioxide low impedance layer 20 that is closest to the support substrate (not illustrated) relative to the having a platinum high impedance layer 22 closest to the substrate 17. A low impedance layer of an acoustic mirror in contact with the substrate 17 can have a reduced thickness compared to other low impedance layers of the solid acoustic mirror 15 in certain applications.

The solid acoustic mirror 15 can confine acoustic energy. The solid acoustic mirror 15 can confine acoustic energy such that the support substrate 17 is free from acoustic energy during operation of the laterally excited bulk acoustic wave device 28. At least one of the low impedance layers 20 and/or at least one of the high impedance layers 22 can be free from acoustic energy during operation of the laterally excited bulk acoustic wave device 28.

The support substrate 17 can dissipate heat associated with generating a laterally excited bulk acoustic wave. The support substrate 17 can be any suitable support substrate. The support substrate 17 can have a relatively high thermal conductivity to dissipate heat associated with operation of the laterally excited bulk acoustic wave device 28. The support substrate 17 can be a silicon substrate. The support substrate 17 being a silicon substrate can be advantageous for processing during manufacture of the laterally excited bulk acoustic wave device 28 and provide desirable thermal conductivity. Silicon is also a relatively inexpensive mate-rial. The support substrate 17 can be an aluminum nitride substrate. In some other applications, the support substrate 17 can be a quartz substrate, a ceramic substrate, a glass substrate, a spinel substrate, a magnesium oxide spinel substrate, a sapphire substrate, a diamond substrate, a dia-mond like carbon substrate, a silicon carbide substrate, a silicon nitride substrate, or the like.

FIG. 1B illustrates the IDT electrode 14 of the laterally excited bulk acoustic wave device 28 of FIG. 1A in a top plan view. Only the IDT electrode 14 of the laterally excited bulk acoustic wave device 28 is shown in FIG. 1B. The IDT electrode 14 includes a bus bar 24 and IDT fingers 26 extending from the bus bar 24. The IDT fingers 26 have a pitch of λ and a width of W. As discussed above, the pitch λ can have less impact than the thickness of the piezoelectric layer 12 in the laterally excited bulk acoustic wave device 28. The laterally excited bulk acoustic wave device 28 can include any suitable number of IDT fingers 26.

Figure 2:
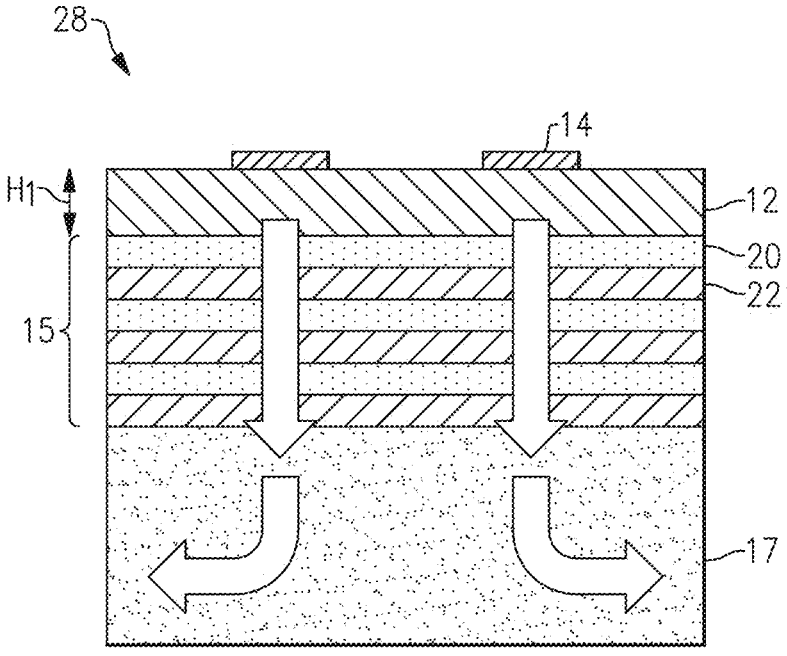
FIG. 2 is a schematic cross sectional side view showing heat flow in the laterally excited bulk acoustic wave device of FIG. 1A.

FIG. 2 is a schematic cross sectional side view showing heat flow in the laterally excited bulk acoustic wave device 28 of FIG. 1A. During operation, heat can be generated by the IDT electrode 14. This heat can flow through the piezoelectric layer 12 and the solid acoustic mirror 15 to the substrate 17. Accordingly, the solid acoustic mirror 15 can provide a heat flow path from the piezoelectric layer 12 to the substrate 17. The substrate 17 can have a relatively high thermal conductivity and provide heat dissipation. The sub-strate 17 can increase mechanical durability.

Figure 3:
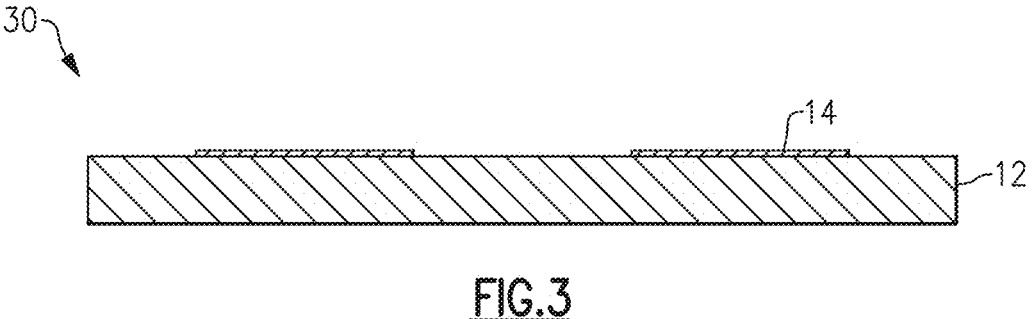
FIG. 3 is a schematic cross sectional side view of a laterally excited bulk acoustic wave device.

FIG. 3 is a schematic cross sectional side view of a laterally excited bulk acoustic wave device 30. As illus-trated, the laterally excited bulk acoustic wave device 30 includes a piezoelectric layer 12 and an IDT electrode 14 on the piezoelectric layer 12. The laterally excited bulk acoustic wave device 30 can be a free standing device supported over a support substrate (not shown). There can be an air cavity (not shown) positioned between the piezoelectric layer 12 and the support substrate.

Figure 4A:
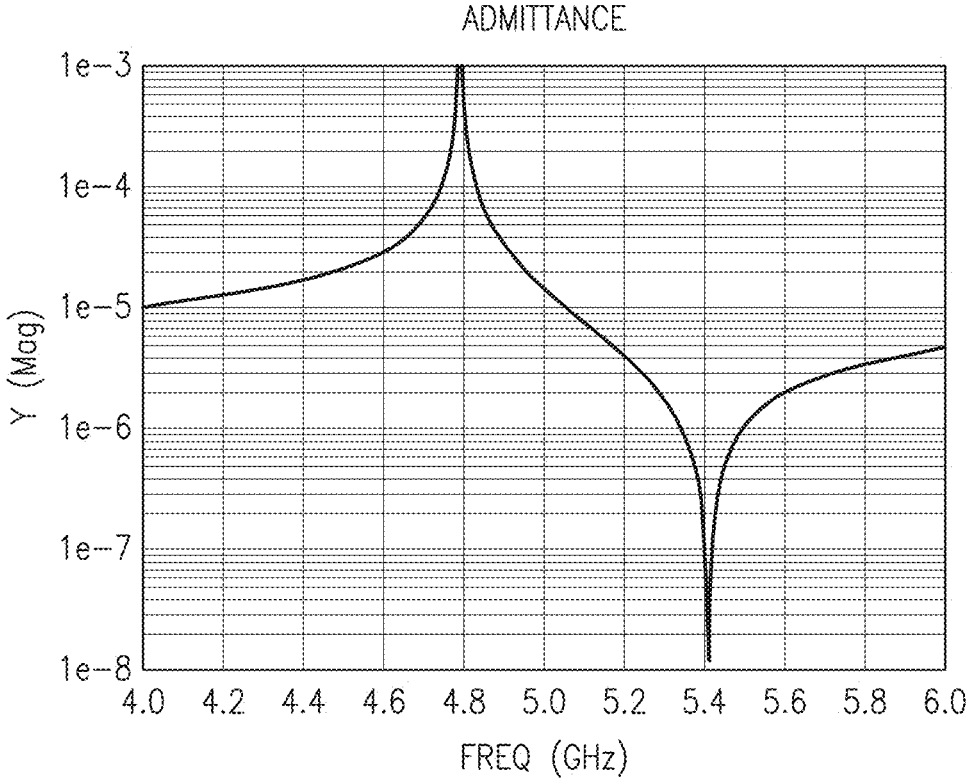
FIG. 4A is graph of admittance of the laterally excited bulk acoustic wave device of FIG. 3.

FIG. 4A is a graph of admittance of the laterally excited bulk acoustic wave device 30 of FIG. 3. This graph shows a relatively clean frequency response with a resonant fre-quency at around 4.8 GHz and an anti-resonant frequency around 5.4 GHz.

Figure 4B:
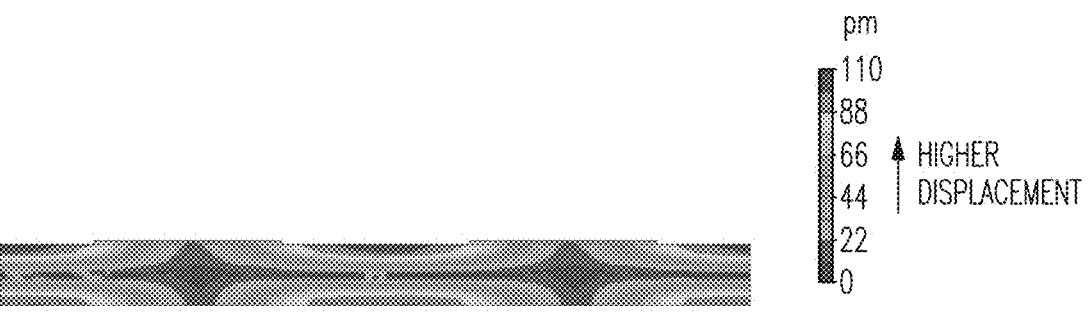
FIG. 4B illustrates displacement at a resonant frequency for the laterally excited bulk acoustic wave device of FIG. 3.

FIG. 4B illustrates displacement at a resonant frequency for the laterally excited bulk acoustic wave device 30 of FIG. 3. FIG. 4B indicates displacement in the piezoelectric layer 12 at the resonant frequency.

Figure 4C:
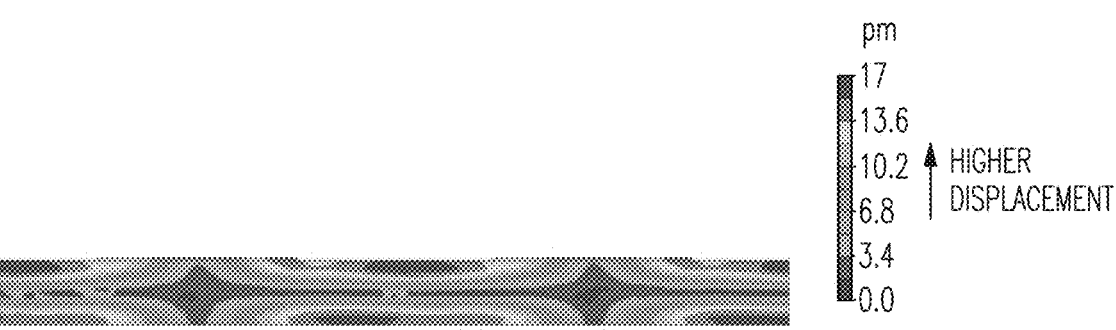
FIG. 4C illustrates displacement at an anti-resonant frequency for the laterally excited bulk acoustic wave device of FIG. 3.

FIG. 4C illustrates displacement at an anti-resonant fre-quency for the laterally excited bulk acoustic wave device 30 of FIG. 3. FIG. 4C indicates displacement in the piezo-electric layer 12 at the anti-resonant frequency.

Figure 5:
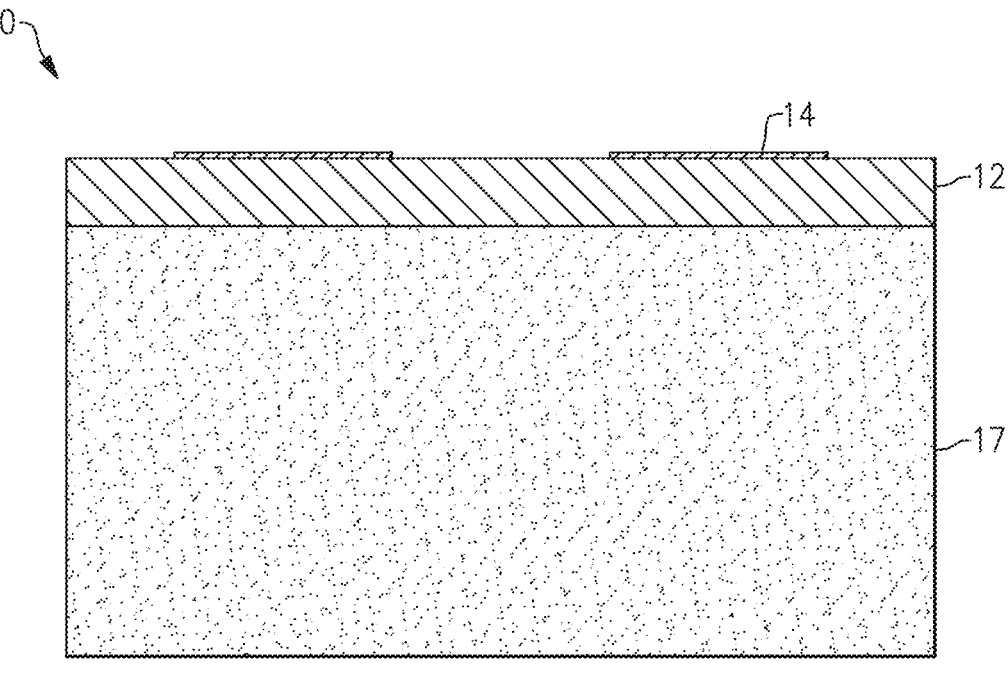
FIG. 5 is a schematic cross sectional side view of a laterally excited bulk acoustic wave device with a support substrate in contact with a piezoelectric layer.

FIG. 5 is a schematic cross sectional side view of a laterally excited bulk acoustic wave device 50 with a support substrate 17 in contact with a piezoelectric layer 12. As illustrated, the laterally excited bulk acoustic wave device 50 includes a piezoelectric layer 12, an IDT electrode 14 on a first side of the piezoelectric layer 12, and a support substrate 17 in contact with a second side of the piezoelectric layer 12 that is opposite to the first side. The support substrate 17 can be a silicon substrate. The support substrate 17 can dissipate heat associated with operation of the laterally excited bulk acoustic wave device 50.

Figure 6A:
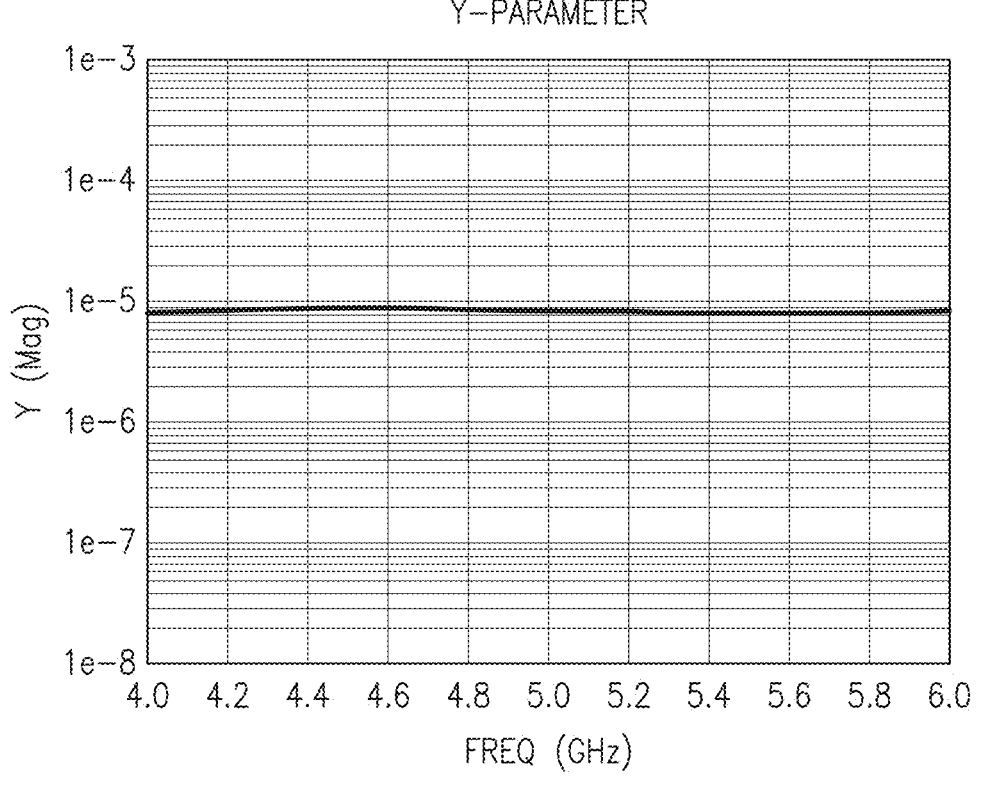
FIG. 6A is graph of admittance of the laterally excited bulk acoustic wave device of FIG. 5.

FIG. 6A is a graph of admittance of the laterally excited bulk acoustic wave device 50 of FIG. 5, in which the support substrate 17 is a silicon substrate. The graph of FIG. 6A indicates that the laterally excited bulk acoustic wave device 50 produces a low quality factor (Q) that is generally undesirable for an acoustic wave filter.

Figure 6B:
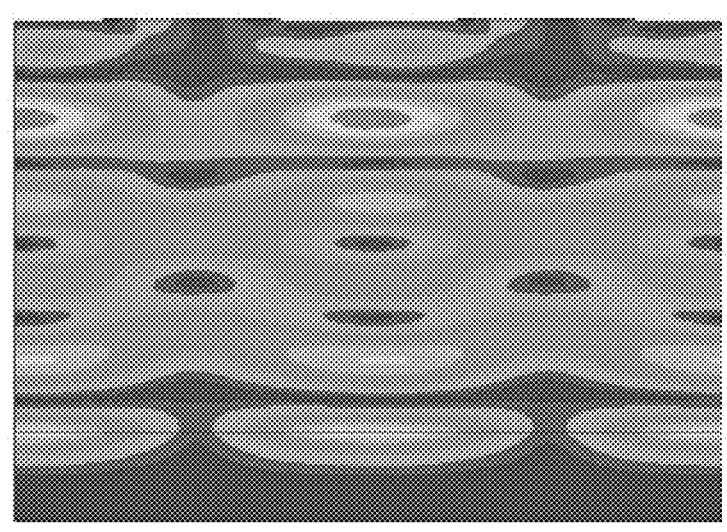
FIG. 6B illustrates displacement at a resonant frequency for the laterally excited bulk acoustic wave device of FIG. 5.

FIG. 6B illustrates displacement at a resonant frequency for the laterally excited bulk acoustic wave device 50 of FIG. 5, in which the support substrate 17 is a silicon substrate. FIG. 6B indicates acoustic energy leakage into the silicon substrate at the resonant frequency.

Figure 6C:
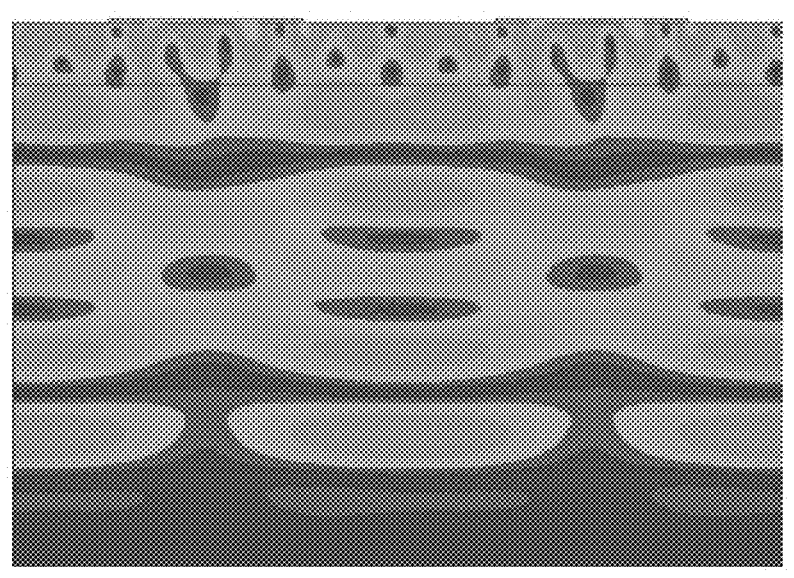
FIG. 6C illustrates displacement at an anti-resonant frequency for the laterally excited bulk acoustic wave device of FIG. 5.

FIG. 6C illustrates displacement at an anti-resonant fre-quency for the laterally excited bulk acoustic wave device 50 of FIG. 5, in which the support substrate 17 is a silicon substrate. FIG. 6C indicates acoustic energy leakage into the silicon substrate at the anti-resonant frequency.

Figure 7:
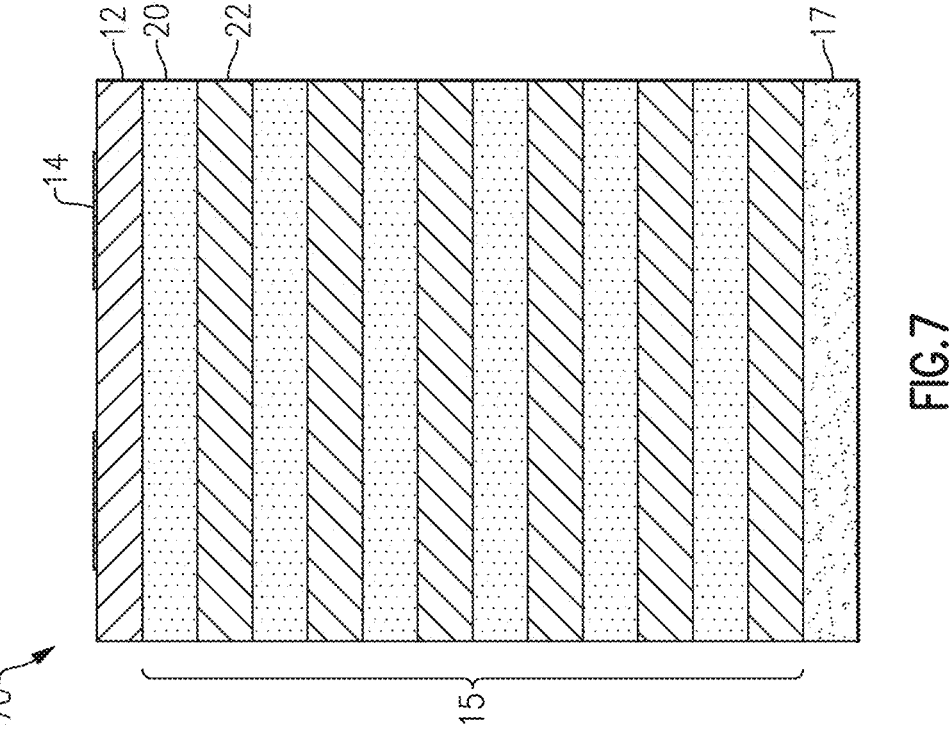
FIG. 7 is a schematic cross sectional side view of a laterally excited bulk acoustic wave device with a solid acoustic mirror before design refinement.

FIG. 7 is a schematic cross sectional side view of a laterally excited bulk acoustic wave device 70 with a solid acoustic mirror 15 according to an embodiment before design refinement and/or optimization. The laterally excited bulk acoustic wave device 70 includes a piezoelectric layer 12, an interdigital transducer electrode 14 on the piezoelec-tric layer 12, the solid acoustic mirror 15 including alter-nating low impedance layers 20 and high impedance layers 22, and a support substrate 17. The solid acoustic mirror 15 is positioned between the support substrate 17 and the piezoelectric layer 12. The solid acoustic mirror 15 is not optimized in the laterally excited bulk acoustic wave device 70. In FIG. 7, the support substrate 17 is not necessarily shown to scale. The support substrate 17 can be the thickest element illustrated in the laterally excited bulk acoustic wave device 70.

Figure 8A:
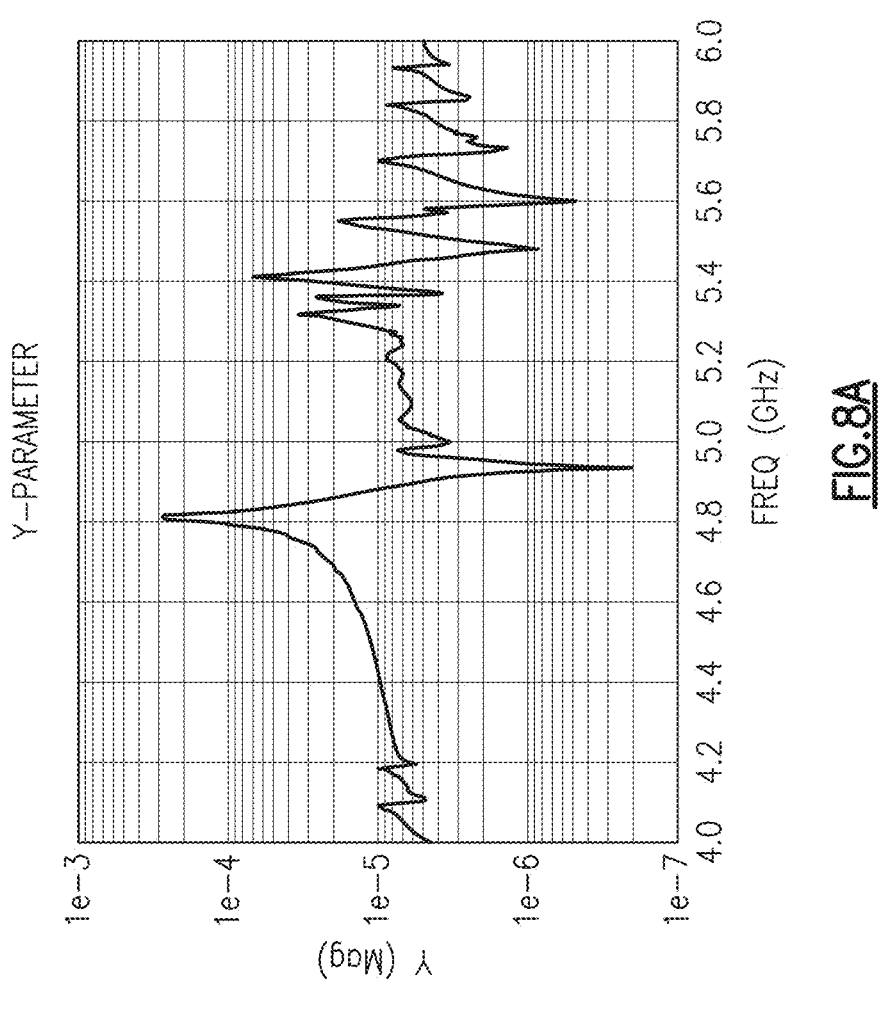
FIG. 8A is graph of admittance of the laterally excited bulk acoustic wave device of FIG. 7.
Figure 8B:
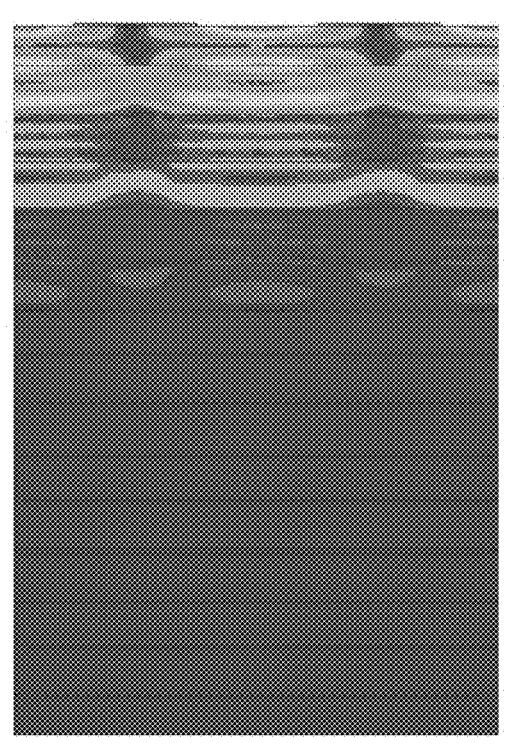
FIG. 8B illustrates displacement at a resonant frequency for the laterally excited bulk acoustic wave device of FIG. 7.
Figure 8B:
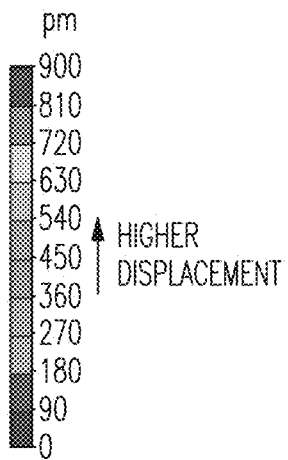
Figure 8C:
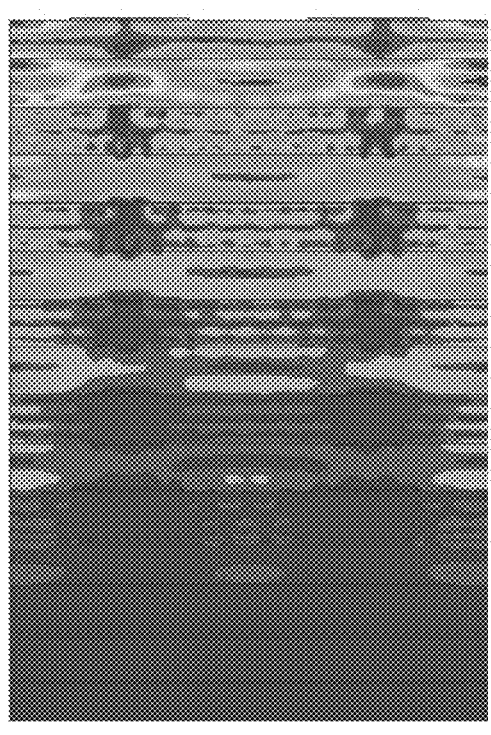
FIG. 8C illustrates displacement at an anti-resonant frequency for the laterally excited bulk acoustic wave device of FIG. 7.
Figure 8C:
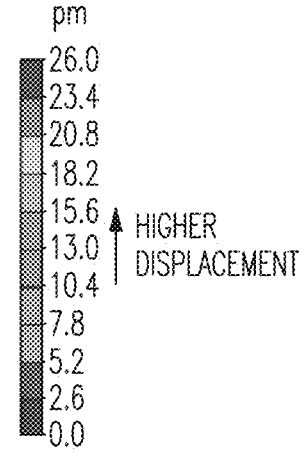

In the simulations for FIGS. 8A to 8C, the acoustic mirror 15 includes silicon dioxide low impedance layers having a thickness of 0.1λ and platinum (Pt) high impedance layers having a thickness of 0.1λ. The performance of the laterally excited bulk acoustic wave device 70 in these simulations is degraded. This can be due to the high impedance layers having a thickness that is away from range that leads to better performance. It can be challenging to design an acoustic mirror that can properly reduce and/or eliminate acoustic energy leakage into a support substrate.

FIG. 8A is a graph of admittance of the laterally excited bulk acoustic wave device 70 of FIG. 7. The graph of FIG. 8A shows a generally undesirable frequency response.

FIG. 8B illustrates displacement at a resonant frequency for the laterally excited bulk acoustic wave device 70 of FIG. 7. FIG. 8B indicates some acoustic energy leakage into the middle layers of the solid acoustic mirror 15 at the resonant frequency.

FIG. 8C illustrates displacement at an anti-resonant frequency for the laterally excited bulk acoustic wave device 70 of FIG. 7. FIG. 8C indicates acoustic energy leakage into the middle and lower layers of the solid acoustic mirror 15 at the anti-resonant frequency.

Figure 9:
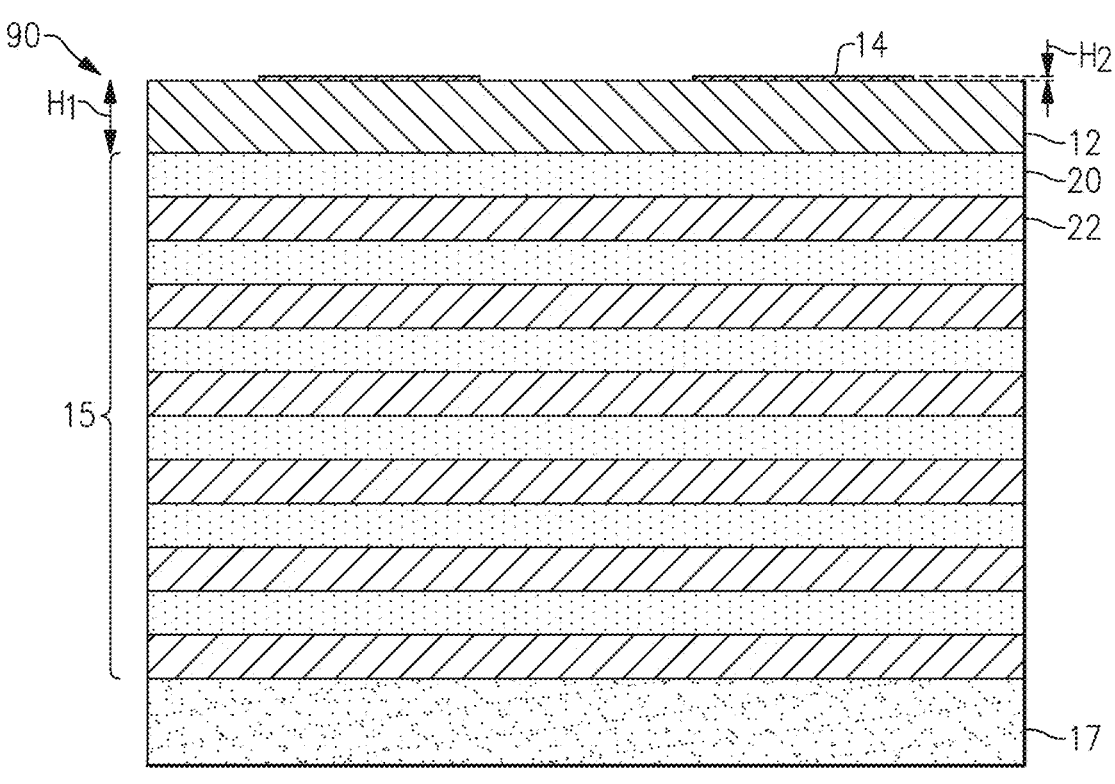
FIG. 9 is a schematic cross sectional side view of a laterally excited bulk acoustic wave device with a solid acoustic mirror.

FIG. 9 is a schematic cross sectional side view of a laterally excited bulk acoustic wave device 90 with a solid acoustic mirror 15 according to an embodiment. The laterally excited bulk acoustic wave device 90 is like the laterally excited bulk acoustic wave device 70 of FIG. 7, except that the laterally excited bulk acoustic wave device 90 is modified to increase confinement of acoustic energy and produce a cleaner frequency response. In FIG. 9, the support substrate 17 is not necessarily shown to scale. The support substrate 17 can be the thickest element illustrated in the laterally excited bulk acoustic wave device 90.

The piezoelectric layer 12 can have a thickness to increase performance of the laterally excited bulk acoustic wave device 90. For example, the piezoelectric layer 12 can have a thickness H1 in a range from about 0.042 to 0.52, in which λ is an IDT electrode pitch. As one example, the thickness H1 of the piezoelectric layer 12 can be about 0.082.

The layers of the solid acoustic mirror 15 can each have a thickness to increase performance of the laterally excited bulk acoustic wave device 90. For example, the low impedance layers 20 can be silicon dioxide layers having a thickness in a range from 0.02λ to 0.10λ. The high impedance layers can be platinum layers having a thickness in a range from 0.01λ to 0.03λ or 0.04λ to 0.06λ. As one example, the low impedance layers 20 and high impedance layers 22 can each have a thickness of about 0.052. A preferred mirror layer thickness can vary depending on the materials of the solid acoustic mirror 15 (the low and high impedance layers 20, 22), and the operating frequency of the laterally excited bulk acoustic wave device 90. For example, in the case with high impedance layers that are tungsten, preferred thickness of the high impedance layer can be in a range from 0.017λ to 0.027λ or from 0.049λ to 0.059λ. For molybdenum high impedance layers, preferred thickness of each high impedance layer can be in a range from 0.040λ to 0.050λ or 0.010λ to 0.011λ. Normalized by wave length of longitudinal wave velocity $\lambda_p$ in each material, preferred low impedance layer thickness for each silicon dioxide low impedance layer can be in a range from $0.1\lambda_p$ to $0.3\lambda_p$ and each high impedance layer thickness can be in a range from $0.14\lambda_p$ to from $0.30\lambda_p$ or $0.35\lambda_p$ to $0.45\lambda_p$. In certain applications, the low impedance layers 20 and the high impedance layers 22 can have similar and/or approximately the same thicknesses. In some other applications, the low impedance layers 20 can have different thickness than the high impedance layers 22.

The piezoelectric layer 12 may include a material with a particular cut angle that enable the structure shown in FIG. 9 to be a leaky longitudinal surface acoustic wave device. For example, the piezoelectric layer 12 may be formed, compared to the piezoelectric layer 12 of the laterally excited bulk acoustic wave device 90, from a different material and/or may result from a different cutting angle (or: cutting plane) through a crystal. In some embodiments, the piezoelectric layer 12 for a laterally excited bulk acoustic wave device 90, can include a lithium niobate layer that has a crystal cut angle in Euler angles of $(\alpha, \beta, \gamma)$, with $\alpha$ between $-10°$ and $10°$, $\beta$ between $-10°$ and $10°$, and $\gamma$ between $80°$ and $100°$. For example, the lithium niobate layer can have a crystal cut angle in Euler angles of $(\alpha, \beta, \gamma)=(0°, 0°, 90°)$.

By contrast a leaky longitudinal surface acoustic wave (LLSAW) device can include a lithium niobate layer with a crystal cut angle in Euler angles of $(\alpha, \beta, \gamma)$, with $\alpha$ between $80°$ and $100°$, $\beta$ between $80°$ and $110°$, and $\gamma$ between $30°$ and $50°$ as the piezoelectric layer 12. For example, the lithium niobate layer can have a crystal cut angle in Euler angles of $(\alpha, \beta, \gamma)=(90°, 90°, 40°)$. Alternatively, the lithium niobate layer of the LLSAW device can have a crystal cut angle in Euler angles of $(\alpha, \beta, \gamma)$, with $\alpha$ between $-10°$ and $+10°$, $\beta$ between $70°$ and $110°$, and $\gamma$ between $80°$ and $100°$. For example, the lithium niobate layer can have a crystal cut angle in Euler angles of $(\alpha, \beta, \gamma)=(0°, 90°, 90°)$. It shall be understood that in each case the solid acoustic mirror 15 is designed and formed specifically for the type and frequency range of waves that each acoustic wave device utilizes.

Figure 10A:
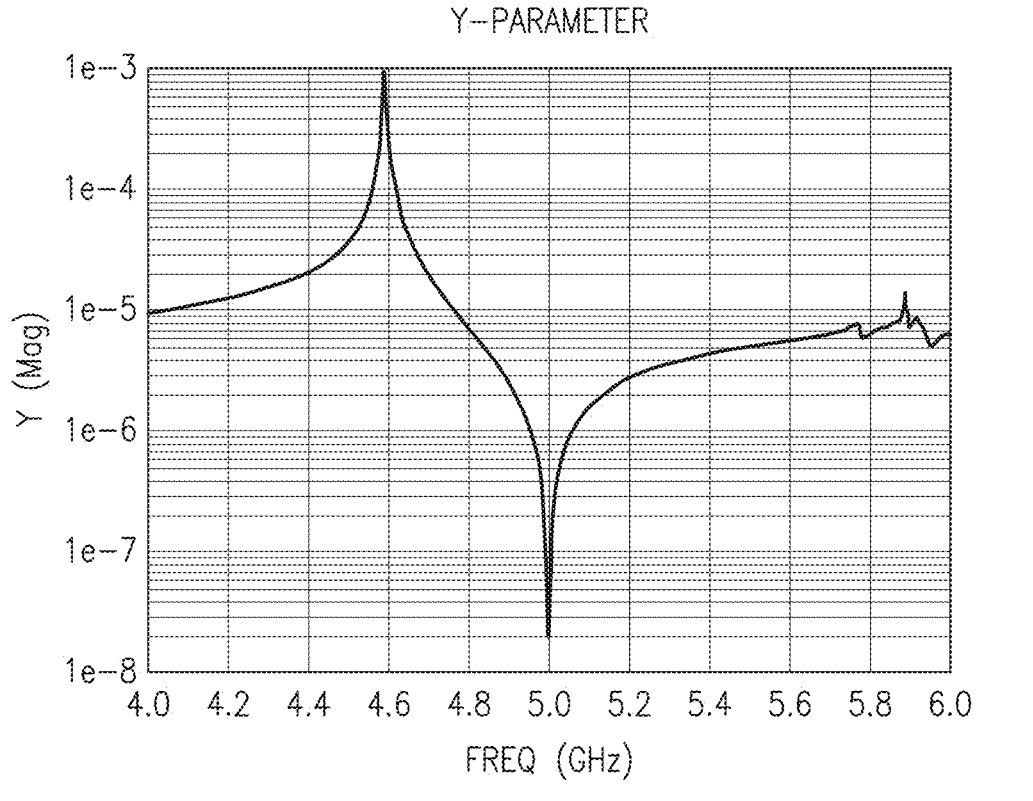
FIG. 10A is graph of admittance of the laterally excited bulk acoustic wave device of FIG. 9.
Figure 10B:
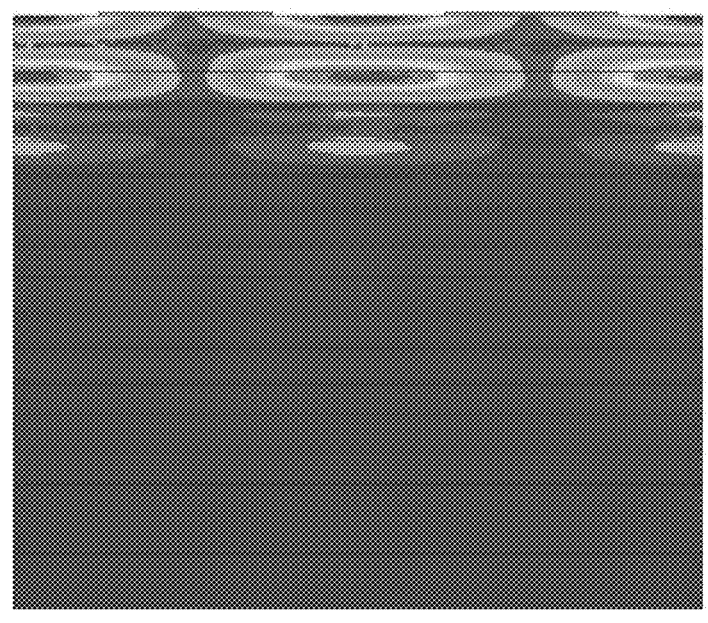
FIG. 10B illustrates displacement at a resonant frequency for the laterally excited bulk acoustic wave device of FIG. 9.
Figure 10C:
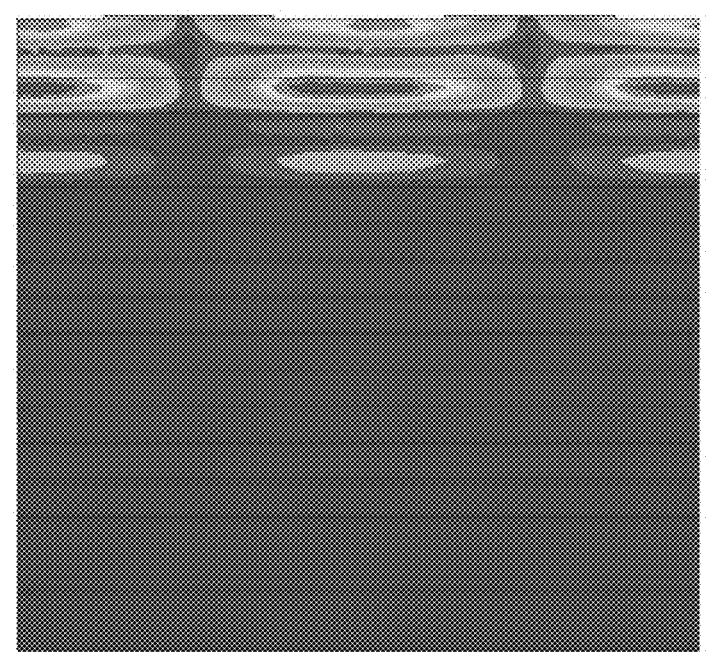
FIG. 10C illustrates displacement at an anti-resonant frequency for the laterally excited bulk acoustic wave device of FIG. 9.
Figure 10C:
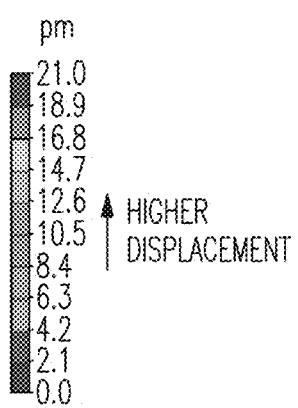

The simulations in FIGS. 10A to 10C correspond to a piezoelectric layer thickness of 0.082 and low impedance and high impedance layers 20 and 22, respectively, each having a thickness of 0.052.

FIG. 10A is a graph of admittance of the laterally excited bulk acoustic wave device of FIG. 9. The graph of FIG. 10A shows a relatively clean frequency response with a resonant frequency at around 4.6 GHz and an anti-resonant frequency around 5.0 GHz FIG. 10B illustrates displacement at a resonant frequency for the laterally excited bulk acoustic wave device FIG. 9. FIG. 10B indicates that the acoustic energy in confined near the piezoelectric layer 12 at the resonant frequency in the laterally excited bulk acoustic wave device 90. FIG. 10B shows improve acoustic energy confinement relative to FIG. 8B.

FIG. 10C illustrates displacement at an anti-resonant frequency for the laterally excited bulk acoustic wave device of FIG. 9. FIG. 10C indicates that the acoustic energy in confined near the piezoelectric layer 12 at the anti-resonant frequency in the laterally excited bulk acoustic wave device 90. FIG. 10C shows improve acoustic energy confinement relative to FIG. 8C.

Figure 10D:
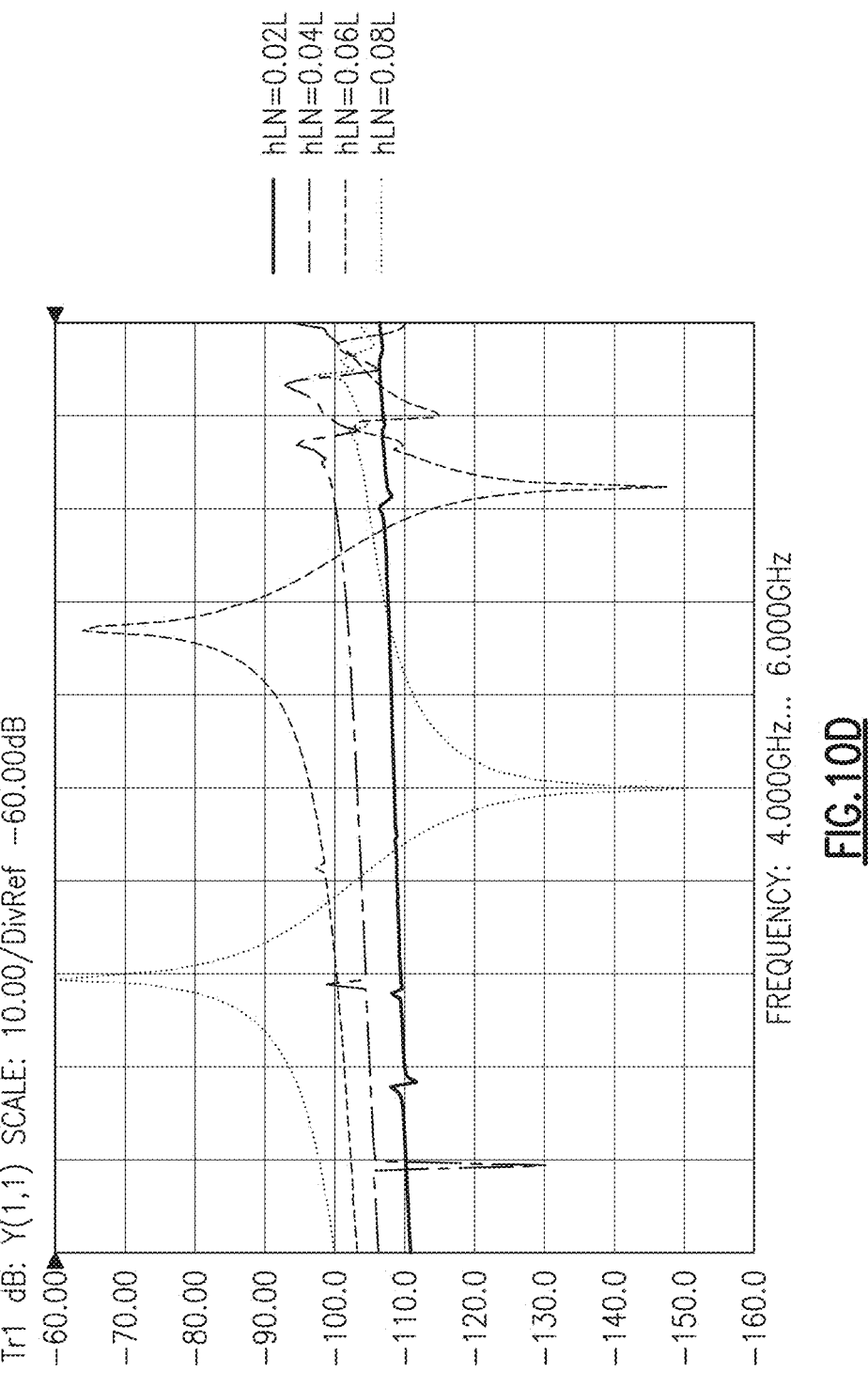
FIG. 10D is a graph corresponding to different thicknesses of the piezoelectric layer for the laterally excited bulk acoustic wave device of FIG. 9.

FIG. 10D is a graph showing simulation results corresponding to different thicknesses of the piezoelectric layer 12 for the laterally excited bulk acoustic wave device 90 of FIG. 9. Lithium niobate is used for the piezoelectric layer 12 in the simulations. The different curves correspond to different thicknesses H1 of the piezoelectric layer 12. FIG. 10D indicates that the thickness H1 of the piezoelectric layer 12 can be at least 0.06L to achieve a preferred electrical performance (k2). The thickness H1 of the piezoelectric layer 12 can be at least 300 nanometers from a fabrication point of view.

Figure 10E:
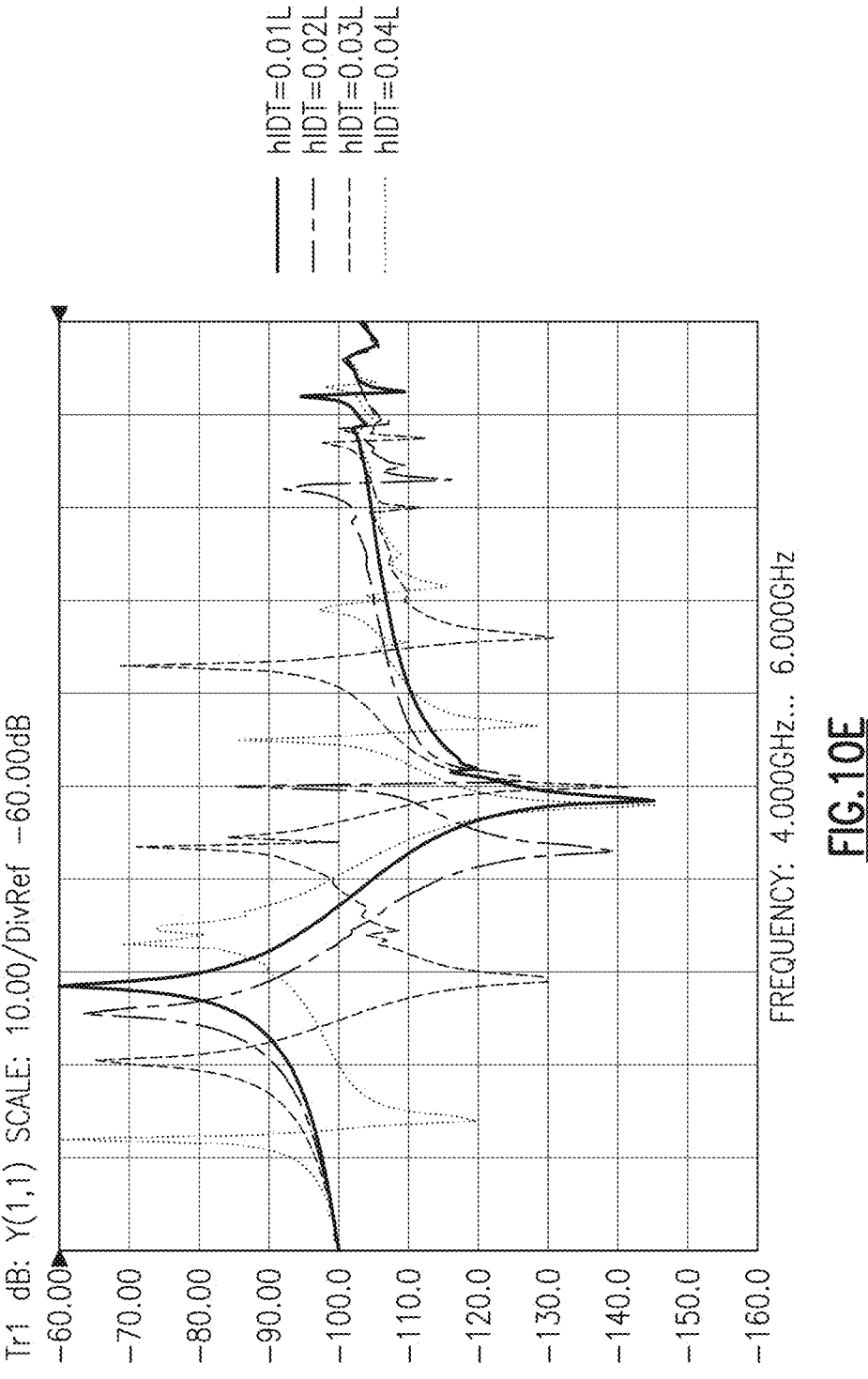
FIG. 10E is a graph corresponding to different thicknesses of the interdigital transducer electrode for the laterally excited bulk acoustic wave device of FIG. 9.

FIG. 10E is a graph showing simulation results corresponding to different thicknesses of the interdigital transducer electrode 14 for the laterally excited bulk acoustic wave device 90 of FIG. 9. The different curves correspond to different thicknesses H2 for the IDT electrode layer 14. This graph indicates that an IDT electrode thickness H2 of greater than 0.02L can excite a spurious mode. The simulations in FIG. 10E do not include the effect of IDT electrode resistivity.

Figure 10F:
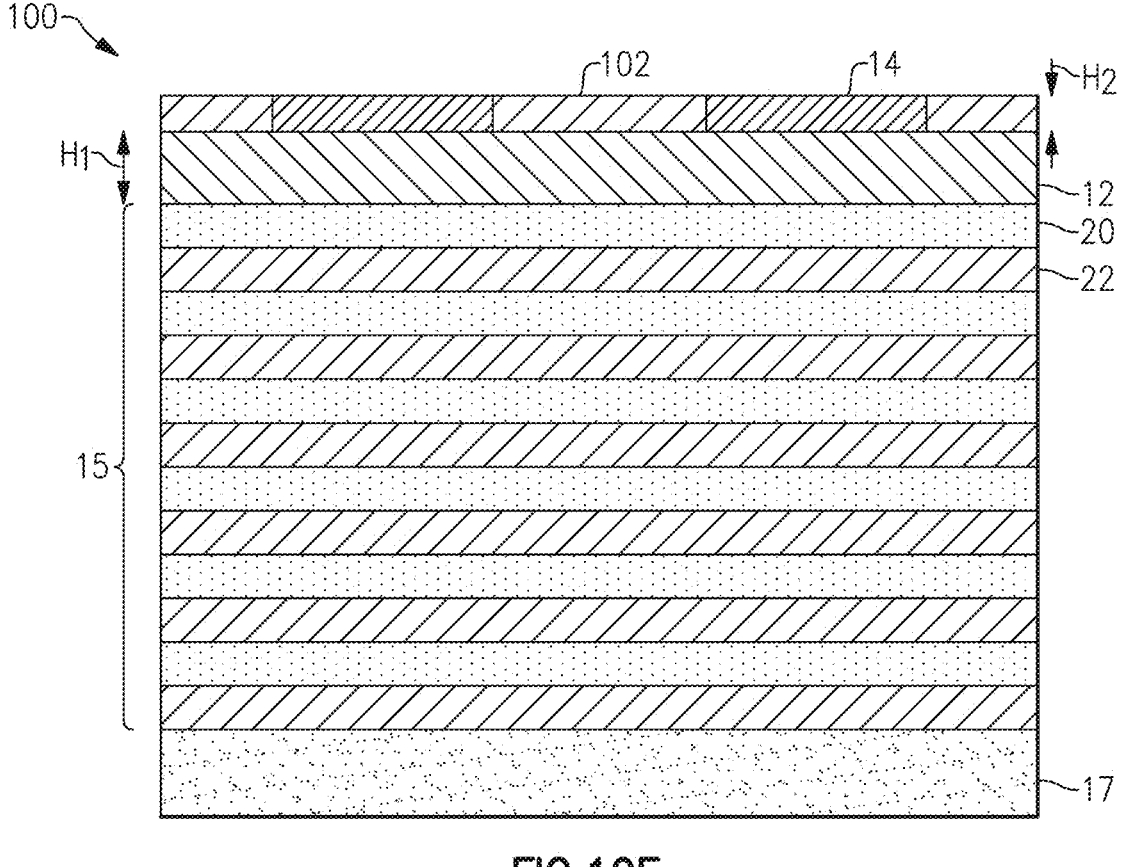
FIG. 10F is a schematic cross sectional side view of a laterally excited bulk acoustic wave device with a solid acoustic mirror and silicon dioxide between interdigital transducer electrode fingers.

FIG. 10F is a schematic cross sectional side view of a laterally excited bulk acoustic wave device 100 with a solid acoustic mirror 15 and silicon dioxide layer 102 between fingers of the IDT electrode 14 according to an embodiment. The laterally excited bulk acoustic wave device 100 is like the laterally excited bulk acoustic wave device 90 of FIG. 9, except that silicon dioxide layer 102 is included between fingers of the IDT electrode 14 in the laterally excited bulk acoustic wave device 100. In some other instances (not illustrated), silicon dioxide and/or another temperature compensation layer can cover fingers of the IDT electrode 14.

Including silicon dioxide layer 102 between fingers of the IDT electrode 14 can suppress a spurious mode. Resonant frequency can be dominated by total thickness of the piezoelectric layer 12 and silicon dioxide layer 102. The silicon dioxide layer 102 can provide frequency tuning. A trimming range can be sufficient to cover series and parallel arms in a ladder type filter.

Figure 10G:
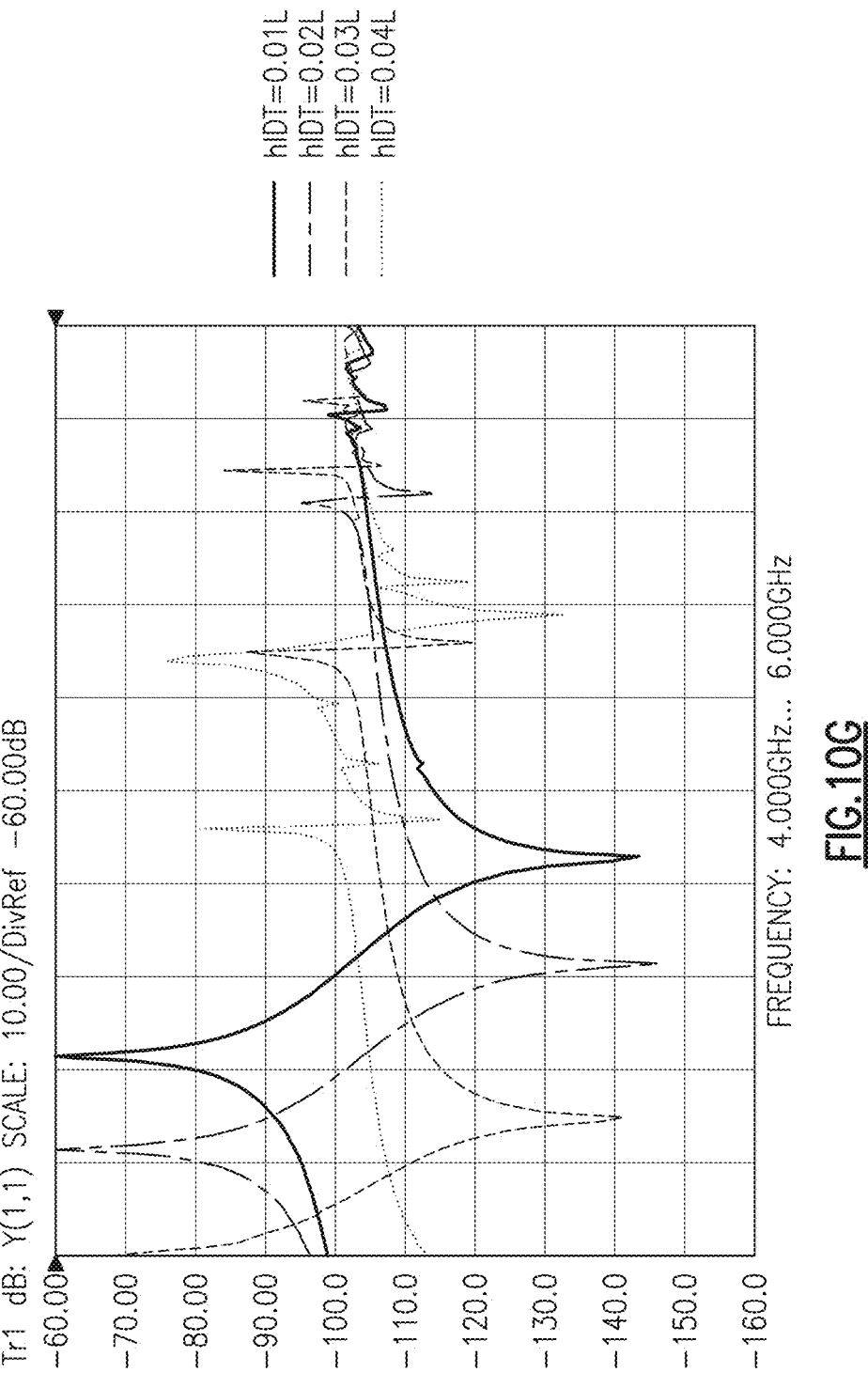
FIG. 10G is a graph corresponding to different thicknesses of the interdigital transducer electrode for the laterally excited bulk acoustic wave device of FIG. 10F.

FIG. 10G is a graph showing simulation results corresponding to different thicknesses of the IDT electrode 14 for the laterally excited bulk acoustic wave device 100 of FIG. 10F. The simulations in FIG. 10G do not include the effect of IDT electrode resistivity.

Figure 11A:
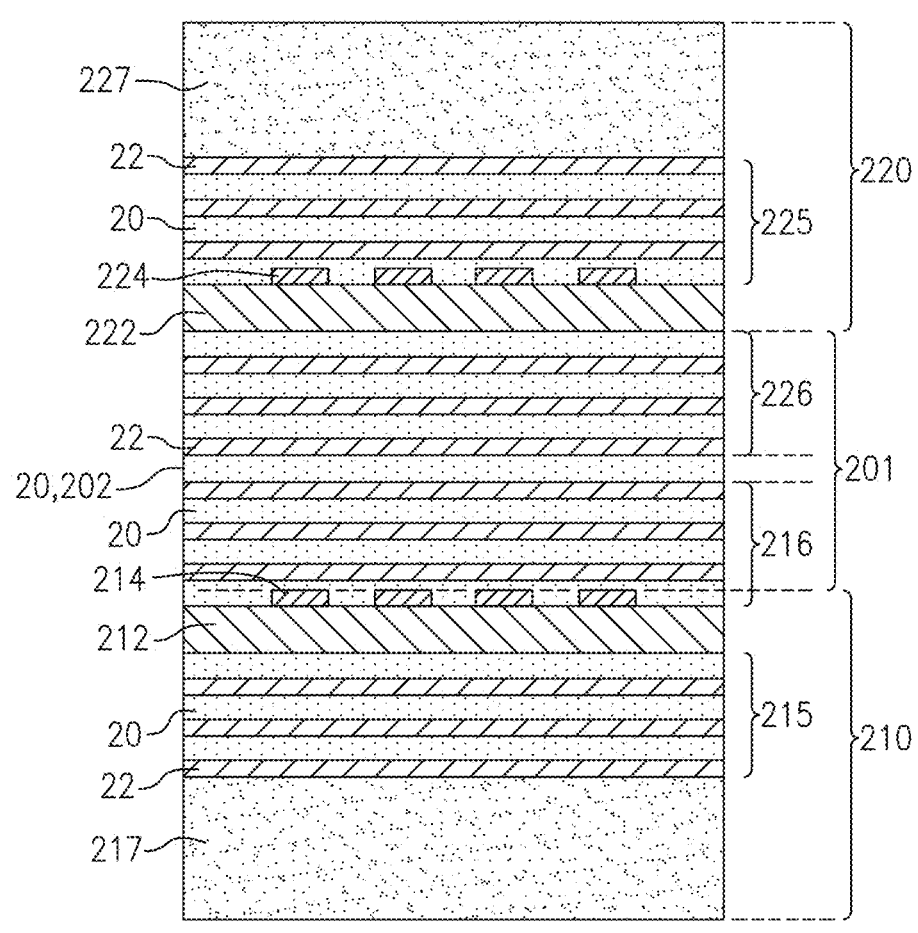
FIG. 11A is a schematic cross sectional side view of a stacked acoustic wave device assembly according to an embodiment.

FIG. 11A is a schematic cross sectional side view of a stacked structure (e.g., a stacked acoustic wave device assembly 200) according to an embodiment, not necessarily shown to scale. The stacked acoustic wave device assembly 200 has a relatively small footprint while at the same time including both a first acoustic wave device 210 and a second acoustic wave device 220. The first acoustic wave device 210 includes a first support substrate 217 and a first piezoelectric layer 212 which may be formed with the same or generally similar properties as has been described with respect to FIG. 9 for the support substrate 17 and the piezoelectric layer 12 respectively. Between the first support substrate 217 and the first piezoelectric layer 212, a first solid acoustic mirror 215 can be positioned. As disclosed herein, in particular with respect to FIG. 9 and the solid acoustic mirror 15, the first solid acoustic mirror 215 may be formed with alternating low impedance layers 20 and high impedance layers 22, wherein a low impedance layer 20 is formed immediately adjacent to and in contact with the first piezoelectric layer 212, and a high impedance layer 22 is formed immediately adjacent to and in contact with the first support substrate 217 such that low impedance layers 20 and high impedance layers 22 are provided in the same quantity. The number of pairs of adjacent low impedance layers 20 and high impedance layers 22 may be between two and ten, between three and six, or even smaller or larger.

The second acoustic wave device 220 includes a second support substrate 227 and a second piezoelectric layer 222 which may be formed with the same or generally similar properties as has been described with respect to FIG. 9 for the support substrate 17 and the piezoelectric layer 12 respectively. Between the second support substrate 227 and the second piezoelectric layer 222, a second solid acoustic mirror 225 can be positioned. As disclosed herein, in particular with respect to FIG. 9 and the solid acoustic mirror 15, the second solid acoustic mirror 225 may be formed with alternating low impedance layers 20 and high impedance layers 22. A low impedance layer 20 may be formed immediately adjacent to and in contact with the second piezoelectric layer 222, and a high impedance layer 22 may be formed immediately adjacent to and in contact with the second support substrate 227 such that low impedance layers 20 and high impedance layers 22 are provided in the same quantity. The number of pairs of adjacent low impedance layers 20 and high impedance layers 22 may be between two and ten, between three and six, or even smaller or larger. The first solid acoustic mirror 215 and the second solid acoustic mirror 225 may be identical or different from one another. In some variants, the first acoustic wave device 210 and the second acoustic wave device 220 are provided identically, for example when the first acoustic wave device 210 realizes a first acoustic wave filter and the second acoustic wave device 220 realizes a second acoustic wave filter with the same frequency range as the first acoustic wave filter.

As is shown in FIG. 11A, between the first acoustic wave device 210 and the second acoustic wave device 220, a third solid acoustic mirror 201 can be positioned. The piezoelectric layers 212, 222 produce heat when in use (e.g., in an acoustic wave filter) which needs to be dissipated or transported away, and the third solid acoustic mirror 201 can help in dissipating or transporting heat from one piezoelectric layer 212, 222 to the respective other. In this way, each of the substrates 217, 227 may contribute to heat removal even when only one of the acoustic wave devices 210, 220 is producing the heat. Thus, the stacked acoustic wave device assembly 200 not only has a small footprint due to the stacking, but heat can be transported away on two different levels, or from two different locations, e.g., at the respective support substrate 217, 227.

The third solid acoustic mirror 201, may, as is shown in FIG. 11A, include, or consist of, two (or more) separate sections. In FIG. 11A, the third solid acoustic mirror 201 includes two major sections: a first section 216 arranged in contact with the first acoustic wave device 210 and adapted to mirror frequencies for which the first acoustic wave device 210 is configured (or: adapted, or: intended); and a second section 226 arranged in contact with the second acoustic wave device 220 and adapted to mirror frequencies for which the second acoustic wave device 220 is configured (or: adapted, or: intended). The frequencies for which an acoustic wave device 210, 220 is configured may be any frequencies with which oscillations or vibrations are generated within the piezoelectric layers 212, 222 during operation of the respective acoustic wave device 210, 220 (e.g., operation as a filter). At either outer end of the third solid acoustic mirror 201 in stacking direction a low impedance layer 20 is arranged such that it is always a low impedance layer which contacts a piezoelectric layer 212, 222 of an acoustic wave device 210, 220.

In order to maintain the structure of pairs of alternating low and high impedance layers throughout the first and the second section 216, 226 of the third solid acoustic mirror 201, a third section 202 of the third solid acoustic mirror 201 is arranged between the first section 216 and the second section 226. The third section 202 includes, or consists of, at least one low impedance layer 20 and connects to the first section 216 and the second section 226 on both sides with a low impedance layer 20. Thus, in the simplest case shown in FIG. 11A, the third section 202 consists of a single low impedance layer 20. In other variants, the third section 202 may include additional low impedance layers 20 and high impedance layers 21 arranged alternatingly with the condition that the outermost layers are always low impedance layers 20. The third section 202 may be configured to mirror frequencies in a frequency range in between and/or overlapping with the frequency ranges for which the first and the second acoustic wave device 210, 220 and/or the first section 216 and the second section 226 are adapted. In other variants, either the first or the second section 216, 226 of the third solid acoustic mirror 201 may include one more low impedance layer 20 than high impedance layer 22. In other words, the low impedance layer of the third section 202 may be considered to be part of either the first or the second section 216, 226 of the third solid acoustic mirror 201.

The described structures allow the first section 216 of the third solid acoustic mirror 201 to confine acoustic energy such that the second piezoelectric layer 262 is free from acoustic energy during operation of the first acoustic wave device 210, and the second section 226 of the third solid acoustic mirror 201 to confine acoustic energy such that the first piezoelectric layer 252 is free from acoustic energy during operation of the second acoustic wave device 220. Expressed yet differently, the third solid acoustic mirror 201 is configured to confine acoustic energy generated during operation of one of the acoustic wave device 210, 220 to that acoustic wave device 210, 220 and to keep the respective other acoustic wave device 220, 210 free from it. The first section 216 and the second section 226 of the third solid acoustic mirror 201 may be configured for their respective function differently from another, for example in terms of materials of the low impedance layers 20 and/or the high impedance layers 22 and/or in terms of thicknesses of the low impedance layers 20 and/or the high impedance layers 22 and/or the like.

In FIG. 11A, each of the first solid acoustic mirror 215 and the second acoustic mirror 225 includes three pairs of adjacent low impedance layers 20 and high impedance layers 22, although the numbers of the pairs may also differ between the two acoustic wave devices 210, 220. The number of pairs of adjacent low impedance layers 20 and high impedance layers 22 may be between two and ten, between three and six, or even smaller or larger. Each of the sections 216, 226 of the third solid acoustic mirror 201 may have the same amount of pairs as (one of, or both of) the first and second solid acoustic mirror 215, 225. In general, also the number of pairs of adjacent low impedance layers 20 and high impedance layers 22 may be between two and ten, between three and six, or even smaller or larger. The third section 201 consists of a single low impedance layer 20.

In some embodiments, the first solid acoustic mirror 215 can be configured to reduce and/or eliminate acoustic energy leakage into the first support substrate 217, and the first section 216 of the third solid acoustic mirror 201 can be configured to reduce and/or eliminate acoustic energy leakage into the second section 226 of the third solid acoustic mirror 201. In some embodiments, the second solid acoustic mirror 225 can be configured to reduce and/or eliminate acoustic energy leakage into the second support substrate 227, and the second section 226 of the third solid acoustic mirror 201 can be configured to reduce and/or eliminate acoustic energy leakage into the first section 216 of the third solid acoustic mirror 201. For example, when an operating frequency of the first acoustic wave device 210 is lower than an operating frequency of the second acoustic wave device 220, a pitch (e.g., a thickness) of the low impedance layers 20 and the high impedance layers 22 of the first solid acoustic mirror 215 can be wider than a pitch (e.g., a thickness) of the low impedance layers 20 and the high impedance layers 22 of the second solid acoustic mirror 225. For example, when an operating frequency of the first acoustic wave device 210 is lower than an operating frequency of the second acoustic wave device 220, a pitch (e.g., a thickness) of the low impedance layers 20 and the high impedance layers 22 of the first section 216 of the third solid acoustic mirror 201 can be wider than a pitch (e.g., a thickness) of the low impedance layers 20 and the high impedance layers 22 of the second section 226 of the third solid acoustic mirror 201. In some embodiments, the first acoustic wave device 210 can include one of a transmit filter or a receive filter, and the second acoustic wave device 220 can include the other of the transmit filter or the receive filter.

A method of forming the third solid acoustic mirror 201 can include forming the first section 216 and the second section 226 separately, and bonding the two sections 216, 226 together. In some other embodiment, the third solid acoustic mirror 201 can be formed with the first acoustic wave device 210 and the second acoustic wave device 220 can be bonded to the third solid acoustic mirror 201. The method of forming the third solid acoustic mirror 201 can include forming a first low impedance layer (the low impedance layer 20 that is closest to the first piezoelectric layer 212 by way of, for example, deposition. A top surface of the first low impedance layer opposite the first piezoelectric layer 212 may have uneven surface due to a first IDT electrode 214. In some embodiments, the uneven surface may be polished to have a more even, flat surface.

In some embodiments, the third section 202 of the third solid acoustic mirror 201 can include a single low impedance layer 20 that is formed with the first or second section 216, 226. In some other embodiments, the third section 202 of the third solid acoustic mirror 201 can include two low impedance layers 20 that are directly bonded to one another without an intervening adhesive. In some other embodiments, the third section 202 of the third solid acoustic mirror 201 can include the high impedance layer 22 that is formed with the first or second section 216, 226, or two impedance layers 22 that are directly bonded to one another within an intervening adhesive.

As disclosed herein, the by stacking a multiple acoustic wave devices, the stacked structure can enable a relatively small footprint. In some embodiments, when the stacked structure includes two acoustic wave devices, the stacked structure can have about a half the footprint as compared to positioning two acoustic devices laterally. Also, as compared to including a cavity to reduce and/or eliminate acoustic energy leakage, use of the solid acoustic mirrors can enable relatively thin stacked structure. The overall thickness of the stacked structure can be optimized by controlling, for example, the support substrate(s) in the stacked structure. Though stacked structures disclosed herein may only include two acoustic wave devices, a stacked structure may include three or more acoustic wave devices.

Figure 11B:
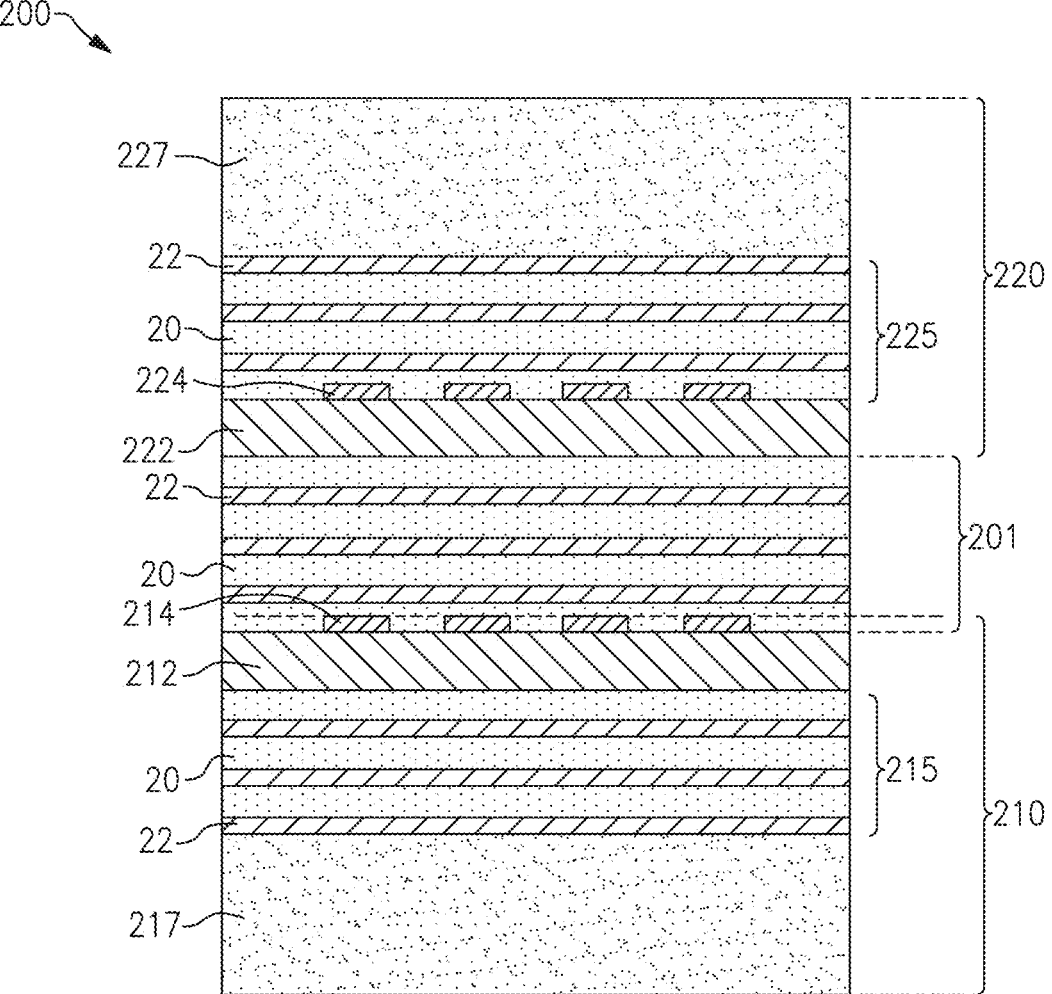
FIG. 11B is a schematic cross sectional side view of a stacked acoustic wave device assembly according to an embodiment, which is a variant of the embodiment of FIG. 11A.

FIG. 11B shows a variant of the stacked acoustic wave device assembly 200 of FIG. 12 for the specific situation that both the first acoustic wave device 210 and the second acoustic wave device 220 are operated in exactly or essentially the same frequency range. In this case, it is sufficient when the third solid acoustic mirror 201 includes only a single section that is adapted to mirror the frequencies for which the first acoustic wave device 210 and the second acoustic wave device 220 are configured. In this situation, the third solid acoustic mirror 201 may have the same number of pairs of adjacent low impedance layer 20 and high impedance layers 22 as the first and/or the second solid acoustic mirror 215, 225, or a different, preferably larger, number of pairs, for example twice the number.

In the shown embodiments of FIG. 11A and FIG. 11B, a first IDT electrode 214 of the first acoustic wave device 210 is formed on the first piezoelectric layer 212. In other words, a plurality of surfaces of the first IDT electrode 214 is covered by a low impedance layer 20 of the third solid acoustic mirror 201, specifically to the first section 216 thereof. Thus, the first IDT electrode 214 is arranged (indirectly) between the first piezoelectric layer 212 and the second piezoelectric layer 222. A second IDT electrode 224 of the second acoustic wave device 220 is formed on the second piezoelectric layer 222. In other words, a plurality of surfaces of the second IDT electrode 224 is covered by a low impedance layer 20 of the second solid acoustic mirror 225. Thus, the second IDT electrode 224 is arranged (indirectly) between the second substrate 227 and the second piezoelectric layer 222.

Both the first IDT electrode 214 and the second IDT electrode 224 can be formed as has been described in the foregoing with respect to the IDT electrode 14, for example with respect to FIG. 9. It shall be understood that FIGS. 11A and 11B are not drawn to scale. It shall be understood that in acoustic wave devices usually two separate IDT electrodes are provided with considerable distance there between. The drawings in FIGS. 11A and 11B (and the following figures) are intended to illustrate the vertical arrangement of the acoustic wave devices 210, 220 and are not intended to depict or restrict the layout in the horizontal direction.

A method of forming a stacked acoustic wave device assembly 200 can include providing a first wafer (later forming the first substrates 217) with one or more, usually a large number, of acoustic wave devices (later the first acoustic wave devices 210) horizontally adjacent to one another, adding the adjacent pairs of low impedance layers 20 and high impedance layers 22 of the third solid acoustic mirror 201 on top of the acoustic wave devices, adding the same number of second acoustic wave devices 220 on top of the low impedance layers 20 and the high impedance layers 22, flipping the first wafer, and bonding the formed structure to another wafer, which can form the second substrates 227. Thereafter, the individual stacked acoustic wave device assemblies 200 can be provided by dicing the wafers bonded to one another.

Each of the first acoustic wave device 210 and the second acoustic wave device 220 may be realized as a laterally excited bulk acoustic wave device. Each of the first acoustic wave device 210 and the second acoustic wave device 220 may also be realized as a leaky longitudinal surface acoustic wave (LLSAW) device. In other words, both of the first acoustic wave device 210 and the second acoustic wave device 220 may be realized as laterally excited bulk acoustic wave device, or both of the first acoustic wave device 210 and the second acoustic wave device 220 may be realized as leaky longitudinal surface acoustic wave device, or one may be realized as a laterally excited bulk acoustic wave device and the other one as a leaky longitudinal surface acoustic wave device. Both laterally excited bulk acoustic wave device and leaky longitudinal surface acoustic wave device have been described with respect to FIG. 9 in the foregoing.

In case one (or both) of the acoustic wave devices 210, 220 of the stacked acoustic wave device assembly 200 is (or are) a laterally excited bulk acoustic wave device (such as laterally excited bulk acoustic wave device 90 of FIG. 9), specifics about materials (e.g., silicon dioxide, tungsten, molybdenum, etc.), dimensions (e.g., a thickness in a range from 0.01λ to 0.5λ) of any or all layers 20, 22, 212, 222 and substrates 217, 227 and the like can be found in the foregoing discussion, specifically with respect to FIG. 9.

In case one (or both) of the acoustic wave devices 210, 220 of the stacked acoustic wave device assembly 200 is (or are) a leaky longitudinal surface acoustic wave device, the same materials, dimensions and so on may apply, with the difference that the respective piezoelectric layer 212, 222 is formed such as to transmit leaky longitudinal surface waves. For example, the respective piezoelectric layer 212, 222 can be a lithium niobate layer with a crystal cut angle in Euler angles ($\alpha$, $\beta$, $\gamma$), with $\alpha$ between 60° and 120° (e.g., 80° and 100°), $\beta$ between 60° and 120° (e.g., 80° and 110°), and $\gamma$ between 10° and 70° (e.g., 30° and 50°). For example, the lithium niobate layer can have a crystal cut angle in Euler angles of ($\alpha$, $\beta$, $\gamma$)=(90, 90, 40°). Alternatively, the piezoelectric layer 212, 222 can be a lithium niobate layer with a crystal cut angle in Euler angles of ($\alpha$, $\beta$, $\gamma$), with $\alpha$ between −10° and +10°, $\beta$ between 70° and 110°, and $\gamma$ between 80° and 100°. For example, the lithium niobate layer can have a crystal cut angle in Euler angles of ($\alpha$, $\beta$, $\gamma$)=(0°, 90°, 90°).

Figure 11C:
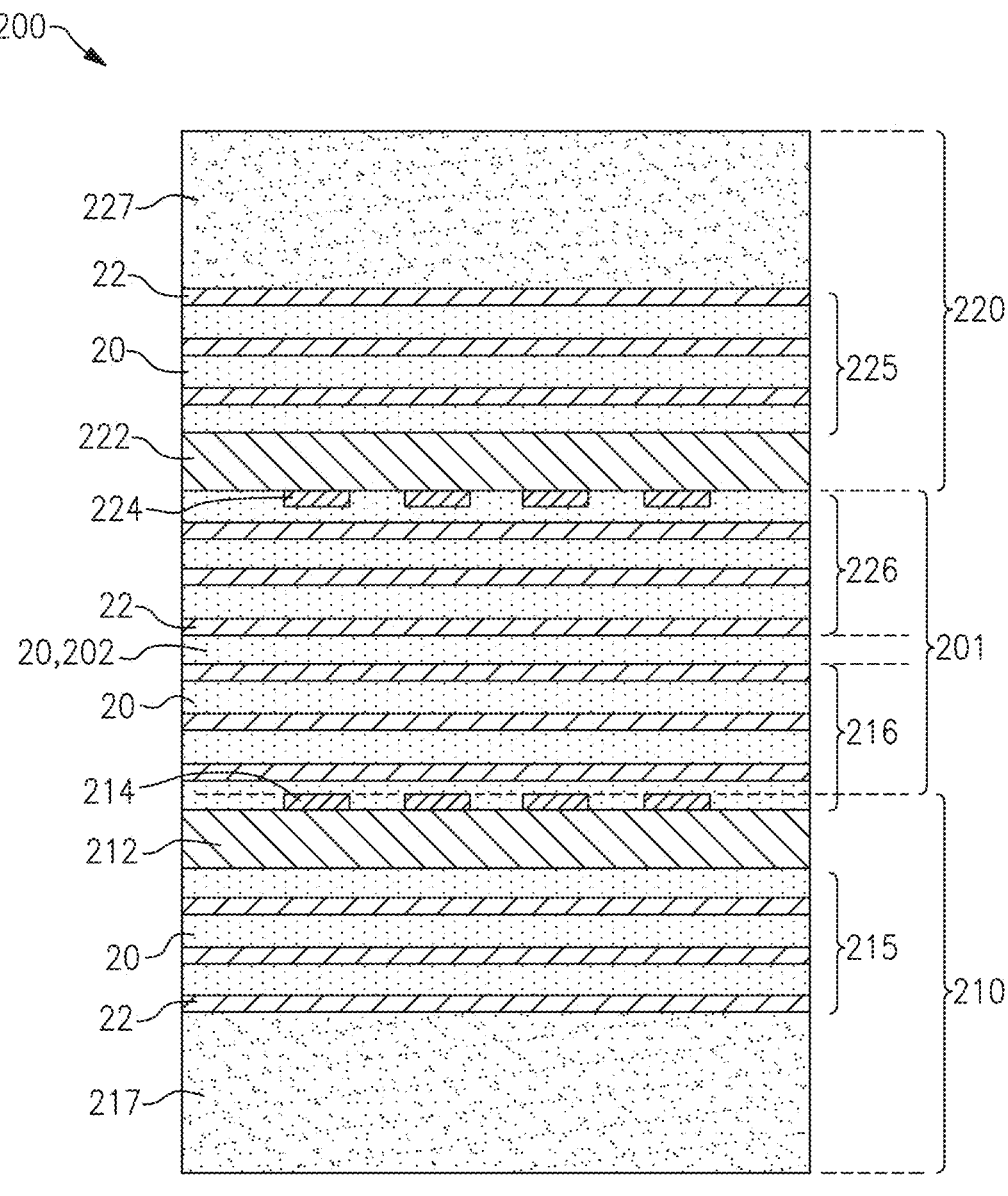
FIG. 11C is a schematic cross sectional side view of a stacked acoustic wave device assembly according to an embodiment, which is another variant of the embodiment of FIG. 11A.

FIG. 11C shows an embodiment which is a variant of the embodiment shown in FIG. 11A. The embodiment of FIG. 11C is different from the embodiment of FIG. 11A in the embodiment of FIG. 11C, the second IDT electrode 224 is arranged on a surface of the second piezoelectric layer 222 facing the third solid acoustic mirror 201 and, indirectly, facing the first IDT electrode 214. Thus, the second IDT electrode 224 can contact a outermost low impedance layer 20 of the third solid acoustic mirror 201, specifically of the second section 226 thereof. Expressed yet differently, the second IDT electrode 224 is arranged between the second piezoelectric layer 222 and (indirectly) the first piezoelectric layer 212. This embodiment is more symmetrical with respect to the third section 202 of the third solid acoustic mirror 201 and may be easier to manufacture.

Figure 11D:
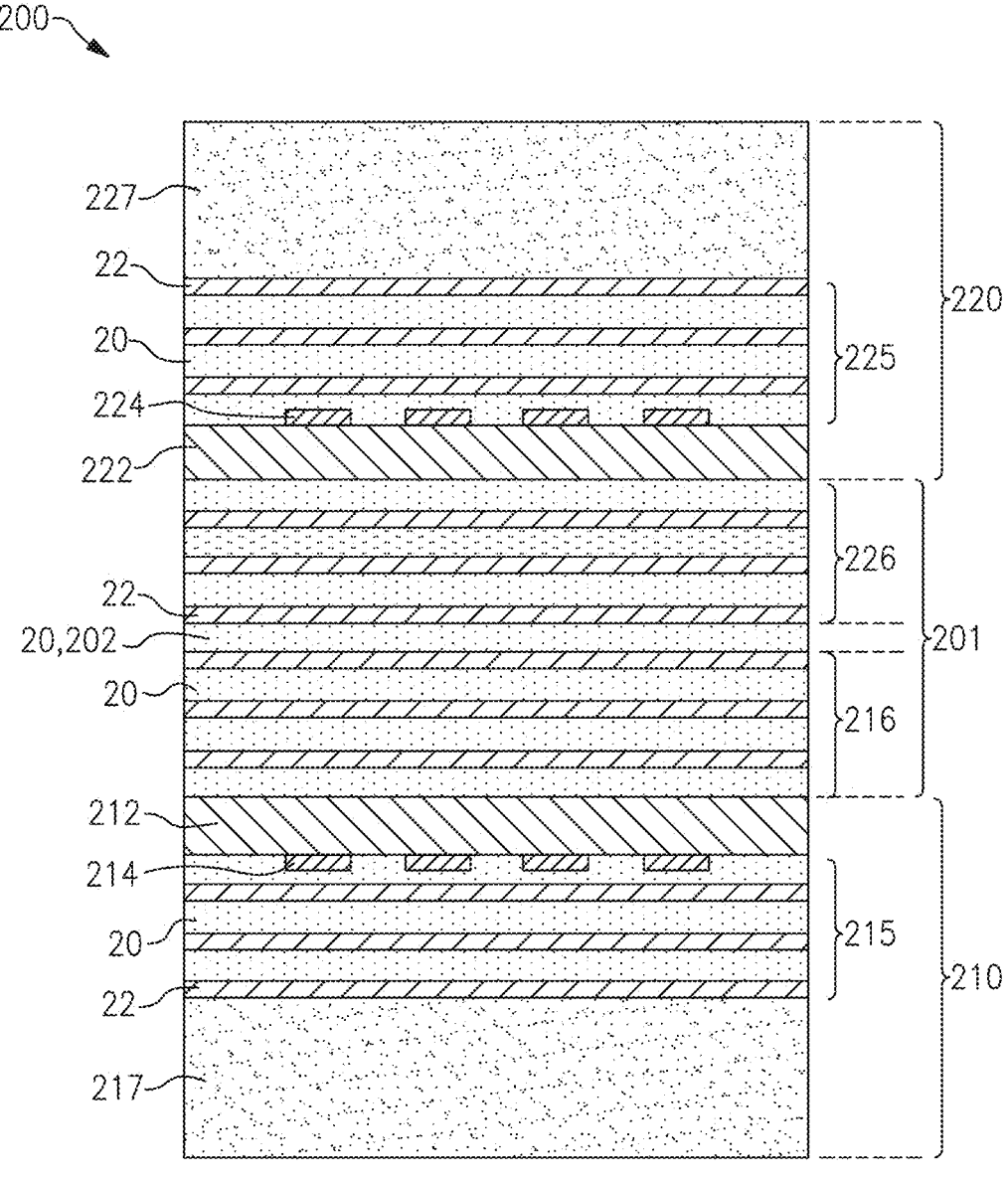
FIG. 11D is a schematic cross sectional side view of a stacked acoustic wave device assembly according to an embodiment, which is yet another variant of the embodiment of FIG. 11A.

In FIG. 11D another variant of the embodiment of FIG. 11A is shown where the first and the second IDT electrodes 214, 224 contact a respective low impedance layer 20 of the solid acoustic mirror 215, 225. In other words, the first IDT electrode 214 can contact an adjacent low impedance layer 20 of the first solid acoustic mirror 215, and the second IDT electrode 224 can contact an adjacent low impedance layer 20 of the second solid acoustic mirror 225.

In summary: FIG. 11A depicts a variant where the first IDT electrode 214 faces the third solid acoustic mirror 201 and the second IDT electrode 224 faces away from the third solid acoustic mirror 201. FIG. 11C depicts a variant where both the first IDT electrode 214 and the second IDT electrode 224 face the third solid acoustic mirror 201 (and, by extension, each other). FIG. 11D depicts a variant where both the first IDT electrode 214 and the second IDT electrode 224 face away from the third solid acoustic mirror 201, and are arranged on a surface of their respective piezoelectric layer 212, 222 facing away from the third solid acoustic mirror 201.

Figure 12A:
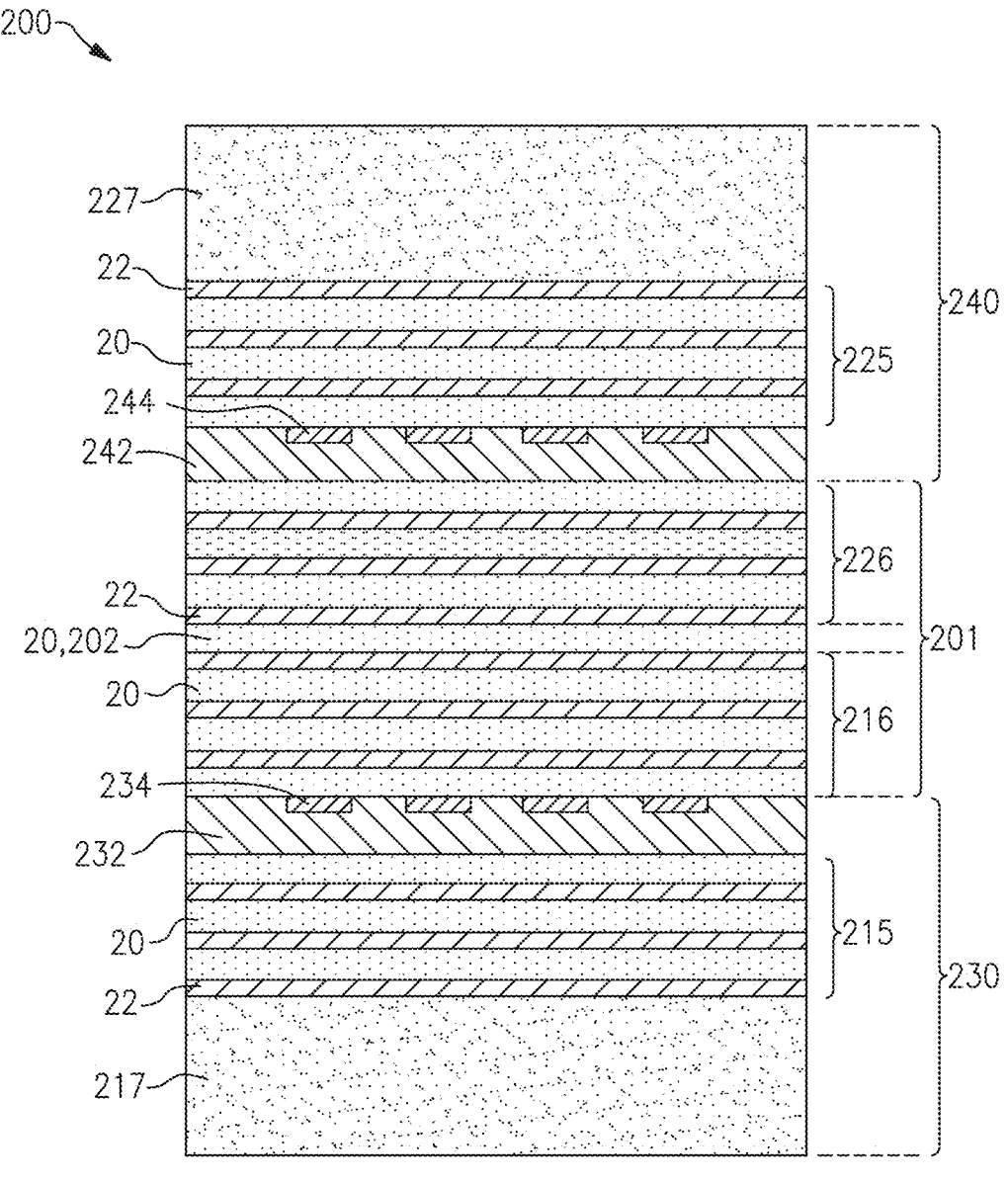
FIG. 12A is a schematic cross sectional side view of a stacked acoustic wave device assembly according to another embodiment.

FIG. 12A is a schematic cross sectional side view of a stacked acoustic wave device assembly 200 according to an embodiment, not necessarily shown to scale. The stacked acoustic wave device assembly 200 of FIG. 12A can be seen as a variant of the stacked acoustic wave device assembly 200 of FIG. 11A. A first acoustic wave device 230 of the stacked acoustic wave device assembly 200 of FIG. 12A differs from the first acoustic wave device 210 of the stacked acoustic wave device assembly 200 of FIG. 11A in the differences between the respective first piezoelectric layers 212, 232 and in the differences between the respective first IDT electrodes 214, 234. Specifically, in the stacked acoustic wave device assembly 200 of FIG. 12A, the first IDT electrode 234 is at least partially embedded in the first piezoelectric layer 232. For example, the first IDT electrode 234 can be at least partially embedded in the first piezoelectric layer 232 such that one group of surfaces of the first IDT electrode 234 in contact with the third solid acoustic mirror 201 and that the other surfaces of the first IDT electrode 234 are covered by the first piezoelectric layer 232. The surfaces of the one group of surfaces of the first IDT electrode 234 can lie within the same plane and can be arranged flush with a surface of the first piezoelectric layer 232 which contacts the third solid acoustic mirror 201, specifically an outermost low impedance layer 20. Expressed in yet another way, the first acoustic wave device 230 can contact the third solid acoustic mirror 201 with a flush planar surface which is formed in part by a surface of the first piezoelectric layer 232 and in part by the open surfaces of the first IDT electrode 234. In some other embodiments, at least a portion of the first IDT electrode 234 can be embedded in the first piezoelectric layer 232, and at least a portion of the first IDT electrode 234 can be disposed over the first piezoelectric layer 232.

Similarly, a second acoustic wave device 240 of the stacked acoustic wave device assembly 200 of FIG. 12A differs from the second acoustic wave device 220 of the stacked acoustic wave device assembly 200 of FIG. 11A in the differences between the respective second piezoelectric layers 222, 242 and in the differences between the respective second IDT electrodes 224, 244. Specifically, in the stacked acoustic wave device assembly 200 of FIG. 12A, the second IDT electrode 244 is at least partially embedded in the second piezoelectric layer 242. For example, the second IDT electrode 244 is at least partially embedded in the second piezoelectric layer 242 such that one group of surfaces of the second IDT electrode 244 is in contact with the second solid acoustic mirror 225 and that the other surfaces of the second IDT electrode 244 are covered by the second piezoelectric layer 242. The surfaces of the one group of surfaces of the second IDT electrode 244 can lie within the same plane and can be arranged flush with a surface of the second piezoelectric layer 242 which contacts the second solid acoustic mirror 225, specifically an outermost low impedance layer 20. Expressed in yet another way, the second acoustic wave device 240 can contact the second solid acoustic mirror 225 with a flush planar surface which is formed in part by a surface of the second piezoelectric layer 242 and in part by the open surfaces of the second IDT electrode 244. In some other embodiments, at least a portion of the first IDT electrode 234 can be embedded in the first piezoelectric layer 232, and at least a portion of the first IDT electrode 234 can be disposed over the first piezoelectric layer 232.

It shall be understood that, although it may be convenient in particular for the manufacture to provide the stacked acoustic wave device assembly 200 as shown in FIG. 11A, the design shown for the acoustic wave devices 230, 240 in FIG. 12A may be used for one of the two acoustic wave devices, and the design shown for the acoustic wave devices 210, 210 in FIG. 11A may be used for the other of the two acoustic wave devices of one stacked acoustic wave device assembly 200. In other words, one acoustic wave device may have an IDT electrode 214, 224 that is arranged on (top of) a surface of a respective piezoelectric layer 212, 222, and the other acoustic wave device may have an IDT electrode 234, 244 that is at least partially embedded within the surface of the respective piezoelectric layer 232, 242. Providing IDT electrodes on top of piezoelectric layers may simplify the manufacturing process. Providing IDT electrodes as at least partially embedded within the surface of piezoelectric layers may improve k2, meaning an improved electrical performance, as well as realize broader frequency bands.

Figure 12B:
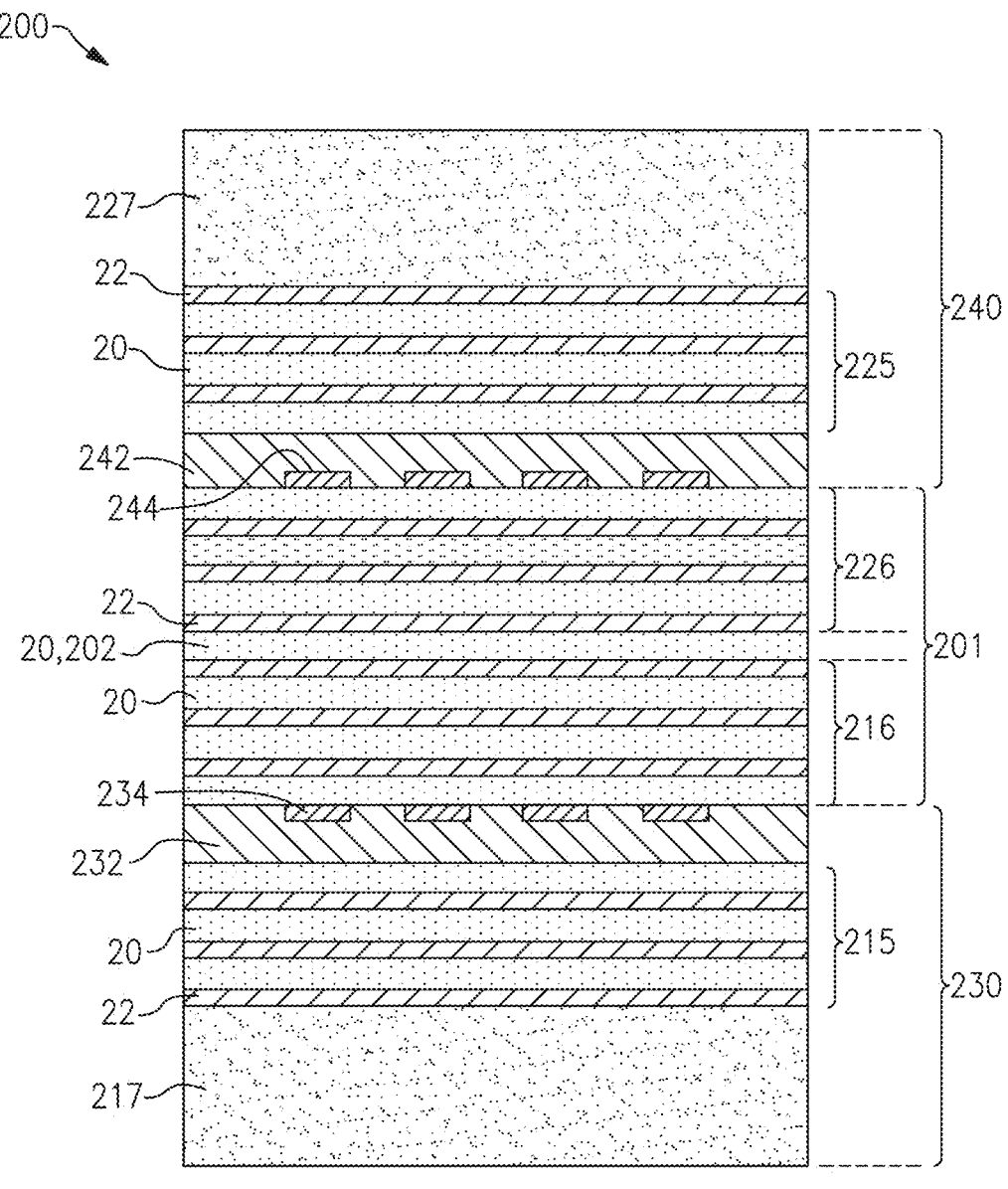
FIG. 12B is a schematic cross sectional side view of a stacked acoustic wave device assembly according to another embodiment, which is a variant of the embodiment of FIG. 12A.

FIG. 12B shows another variant of the embodiment of FIG. 12A. In the embodiment of FIG. 12B, both first and second IDT electrodes 234, 244 are embedded in the piezoelectric layer 232, 242 respectively such that the surfaces of the first and second IDT electrodes 234, 244 are flush with the respective surface of the piezoelectric layer 232, 242. In the embodiment of FIG. 12B, the first and the second IDT electrodes 234, 244 face each other through the third solid acoustic mirror 201.

Figure 12C:
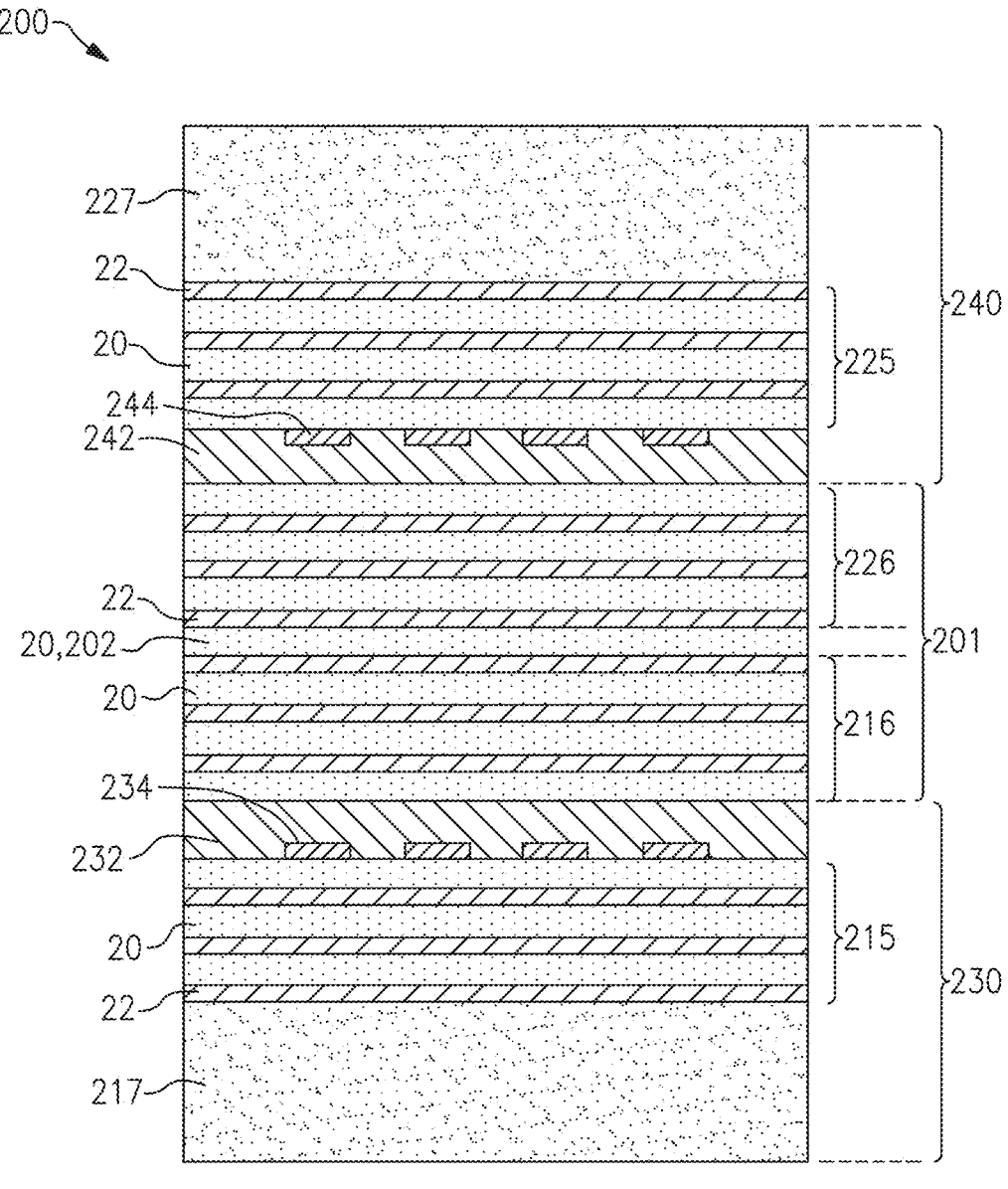
FIG. 12C is a schematic cross sectional side view of a stacked acoustic wave device assembly according to another embodiment, which is another variant of the embodiment of FIG. 12A.

FIG. 12C shows another variant of the embodiment of FIG. 12A. In the embodiment of FIG. 12C, both first and second IDT electrodes 234, 244 are at least partially embedded in the piezoelectric layer 232, 242 respectively such that the surfaces of the first and second IDT electrodes 234, 244 are flush with the respective surface of that piezoelectric layer 232, 242. In the embodiment of FIG. 12B, the first and the second IDT electrodes 234, 244 face away from one another.

In summary: FIG. 12A depicts a variant where the first IDT electrode 234 faces the third solid acoustic mirror 201 and the second IDT electrode 244 faces away from the third solid acoustic mirror 201. FIG. 12B depicts a variant where both the first IDT electrode 234 and the second IDT electrode 244 face the third solid acoustic mirror 201 (and, by extension, each other). FIG. 12C depicts a variant where both the first IDT electrode 234 and the second IDT electrode 244 face away from the third solid acoustic mirror 201.

Various principles and advantages disclosed herein, such as those described with respect to the embodiments of FIG. 12A, FIG. 12B, and FIG. 12C can be combined in any suitable manner. For example, there may be only a single common acoustic mirror arranged between the first acoustic wave device 210 and the second acoustic wave device 220 as the third solid acoustic mirror 201. This single common acoustic mirror can be designed as has been described with respect to FIG. 11B in the foregoing.

Figure 13:
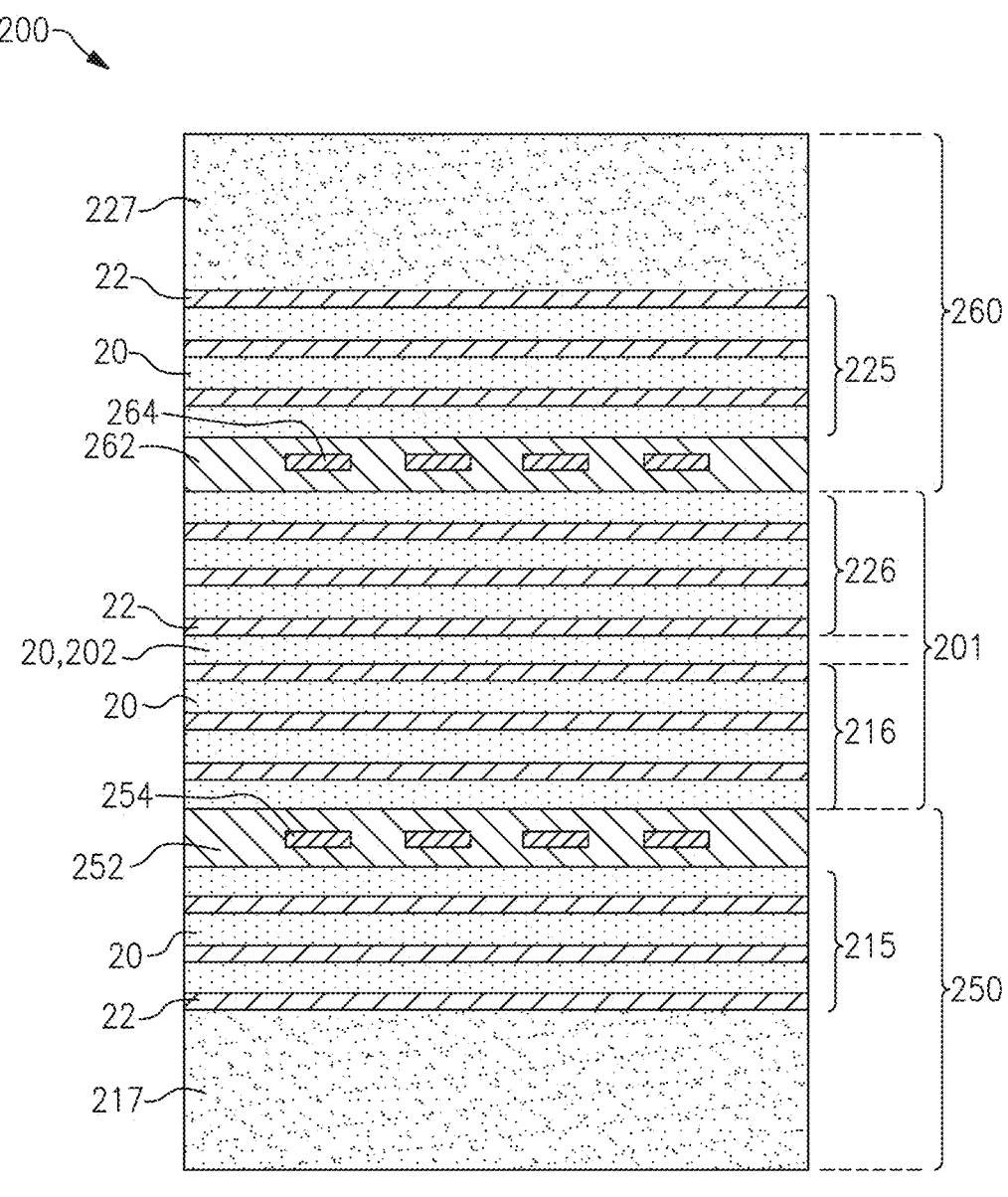
FIG. 13 is a schematic cross sectional side view of n stacked acoustic wave device assembly according to yet another embodiment.

FIG. 13 is a schematic cross sectional side view of a stacked acoustic wave device assembly 200 according to another embodiment, not necessarily shown to scale. The stacked acoustic wave device assembly 200 of FIG. 13 can be seen as a variant of the stacked acoustic wave device assembly 200 of FIG. 11A. A first acoustic wave device 250 of the stacked acoustic wave device assembly 200 of FIG. 13 differs from the first acoustic wave device 210 of the stacked acoustic wave device assembly 200 of FIG. 11A in the differences between the respective first piezoelectric layers 212, 252 and in the differences between the respective first IDT electrodes 214, 254. Specifically, in the stacked acoustic wave device assembly 200 of FIG. 13, the first IDT electrode 254 is completely embedded within the first piezoelectric layer 232 such that all of the surfaces of the first IDT electrode 254 are covered by the first piezoelectric layer 252. Providing IDT electrodes as completely embedded within the surface of piezoelectric layers may further improve k2, meaning an improved electrical performance, as well as realize even broader frequency bands.

Similarly, a second acoustic wave device 260 of the stacked acoustic wave device assembly 200 of FIG. 13 differs from the second acoustic wave device 220 of the stacked acoustic wave device assembly 200 of FIG. 11A in the differences between the respective second piezoelectric layers 222, 262 and in the differences between the respective second IDT electrodes 224, 264. Specifically, in the stacked acoustic wave device assembly 200 of FIG. 13, the second IDT electrode 264 is completely embedded within the second piezoelectric layer 262 such all of the surfaces of the second IDT electrode 246 are covered by the second piezoelectric layer 262. Providing IDT electrodes as completely embedded within the surface of piezoelectric layers may further improve k2, meaning an improved electrical performance, as well as realize even broader frequency bands.

Any suitable principle and advantages disclosed herein can be implemented in the embodiment of FIG. 13. For example, there may be only a single common acoustic mirror arranged between the first acoustic wave device 210 and the second acoustic wave device 220 as the third solid acoustic mirror 201. This single common acoustic mirror can be designed as has been described with respect to FIG. 11B in the foregoing.

Thus, referring to FIG. 11A, FIG. 11C, FIG. 11D, FIG. 12A and FIG. 13 now three different basic arrangements of the IDT electrodes 214, 224, 234, 244, 254, 264 with respect to their corresponding piezoelectric layer 212, 222, 232, 242, 252, 262 have been described wherein the "corresponding piezoelectric layer" 212, 222, 232, 242, 252, 262 is the one in which acoustic waves are generated by the IDT electrodes 214, 224, 234, 244, 254, 264 in the case of transmitting electrodes, or by which acoustic waves are received which induce a voltage in the case of receiving electrodes. The three different basic arrangements are: IDT electrode 214, 224 arranged on a surface of the piezoelectric layer 212, 222, partially embedded in a low impedance layer 20 of an adjacent solid acoustic mirror 201, 225, with two sub-option in that a) IDT electrode 214, 224 at least partially embedded (or: protrudes into) the low impedance layer 20 of the acoustic wave device 210, 220 to which the IDT electrode 214, 224 belongs, or b) IDT electrode 214, 224 at least partially embedded (or: protrudes into) the third solid acoustic mirror 201; IDT electrode 234, 244 arranged at least partially embedded in the piezoelectric layer 232, 242; and IDT electrode 254, 264 arranged completely embedded within the piezoelectric layer 252, 262.

It shall be understood that in any particular embodiment of a stacked acoustic wave device assembly 200, the first acoustic wave device 210, 230, 250 may include any of these three arrangements, and the second acoustic wave device 220, 240, 260 may include any of these three arrangements. In FIGS. 11A-11D, FIGS. 12A-12C, and FIG. 13 in each case a variant is shown in which both first and second acoustic wave devices 210, 220, 230, 240, 250, 260 include the same arrangement of IDT electrode 214, 224, 234, 244, 254, 264 with respect to piezoelectric layer 212, 222, 232, 242, 252, 262. However, the skilled person will readily appreciate from the foregoing that the first and second acoustic wave devices 210, 220, 230, 240, 250, 260 may include different arrangements of IDT electrode 214, 224, 234, 244, 254, 264.

Similarly, two main modes, or types of piezoelectric layers 212, 222, 232, 242, 252, 262 have been described in the foregoing: laterally excited bulk acoustic wave devices and leaky longitudinal surface acoustic wave devices. It will be appreciated by the skilled person that any of these two types of piezoelectric layers 212, 222, 232, 242, 252, 262 may be combined with any of the three types of arrangements of the of IDT electrode 214, 224, 234, 244, 254, 264 with respect to piezoelectric layer 212, 222, 232, 242, 252, 262, and this with any or both of the two acoustic wave devices of a single stacked acoustic wave device assembly 200. Thus, at least six (two times three) different variations of the stacked acoustic wave device assembly 200 are presented for each of the two acoustic wave devices, leading to thirty-six different variants in total. Of course the skilled person will always consider and provide the optimal configuration out of these thirty-six variants for any intended application. Since there are also other possible configurations, for example IDT electrodes half-submerged in the surface of the piezoelectric layers, the actual number of variations at the disposal of the skilled person will be even higher. Furthermore, each of the design variants may be further varied according to, for example, the variations shown and described with respect to FIG. 11A, FIG. 11B, FIG. 11C, FIG. 11D, FIG. 12A, FIG. 12B, and FIG. 12C. The freedom of design for stacked acoustic wave device assemblies 200 is thus vastly increased by the present disclosure, whereas, by virtue of the stacking of two acoustic wave devices 210, 220, 230, 240, 250, 260 the footprint of the stacked acoustic wave device assembly 200 is extraordinarily small.

Acoustic wave devices (e.g., acoustic wave resonators) disclosed herein can be implemented in a variety of different filter topologies. Example filter topologies include without limitation, ladder filters, lattice filters, hybrid ladder lattice filters, filters that include ladder stages and a multi-mode surface acoustic wave filter, and the like. Such filters can include band pass filters. In some other applications, such filters can include band stop filters. In some instances, acoustic wave devices disclosed herein can be implemented in filters with one or more other types of resonators and/or with passive impedance elements, such as one or more inductors and/or one or more capacitors. When two (or more) acoustic wave devices are described as used in the same filter topology, they can be part of the same stacked acoustic wave device assembly 200 as has been described with respect to FIGS. 11A to 13 in the foregoing, or part of different stacked acoustic wave device assemblies 200, or can be provided as individually separated. Some example filter topologies will now be discussed with reference to FIGS. 14 to 16. Any suitable combination of features of the filter topologies of FIGS. 14 to 16 can be implemented together with each other and/or with other filter topologies.

Figure 14:
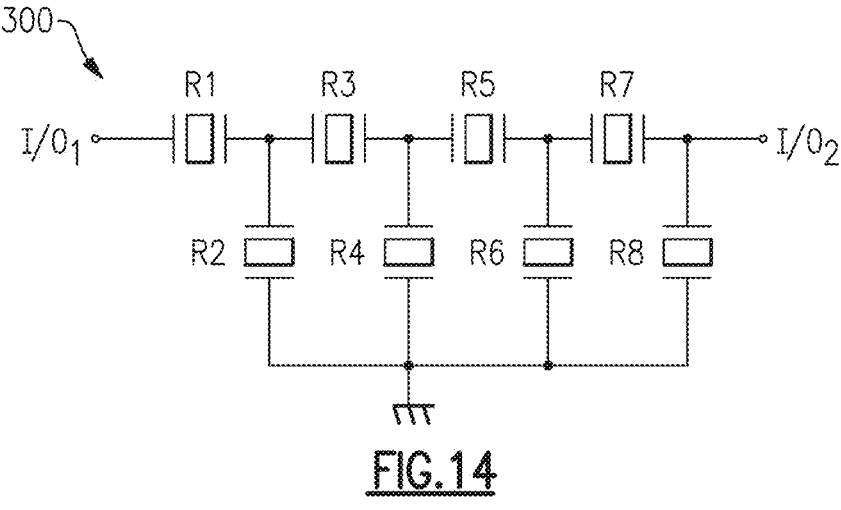
FIG. 14 is a schematic diagram of a ladder filter that includes a laterally excited bulk acoustic wave resonator.

FIG. 14 is a schematic diagram of a ladder filter 300 that includes a laterally excited bulk acoustic wave resonator according to an embodiment and/or a leaky longitudinal surface acoustic wave resonator according to an embodiment. The ladder filter 300 is an example topology that can implement a band pass filter formed from acoustic wave resonators. In a band pass filter with a ladder filter topology, the shunt resonators can have lower resonant frequencies than the series resonators. The ladder filter 300 can be arranged to filter a radio frequency signal. As illustrated, the ladder filter 300 includes series acoustic wave resonators R1 R3, R5, and R7 and shunt acoustic wave resonators R2, R4, R6, and R8 coupled between a first input/output port I/O1 and a second input/output port I/O2. Any suitable number of series acoustic wave resonators can be in included in a ladder filter. Any suitable number of shunt acoustic wave resonators can be included in a ladder filter.

One or more of the acoustic wave resonators of the ladder filter 300 can include a laterally excited bulk acoustic wave filter or a leaky longitudinal surface acoustic wave filter according to an embodiment. In certain applications, all acoustic resonators of the ladder filter 300 can be laterally excited bulk acoustic wave resonators or leaky longitudinal surface acoustic wave resonators in accordance with any suitable principles and advantages disclosed herein. According to some applications, the ladder filter 300 can include at least one laterally excited bulk acoustic wave device according to one embodiment and at least one other laterally excited bulk acoustic wave device according to another embodiment, and/or at least one leaky longitudinal surface acoustic wave device according to one embodiment and at least one other leaky longitudinal surface acoustic wave device according to another embodiment. The eight laterally excited bulk acoustic wave devices R1-R8 in FIG. 14 can be provided by four stacked acoustic wave device assemblies in each of which both acoustic wave devices are laterally excited bulk acoustic wave devices.

The first input/output port I/O1 can a transmit port and the second input/output port I/O2 can be an antenna port. Alternatively, first input/output port I/O1 can a receive port and the second input/output port I/O2 can be an antenna port.

Figure 15:
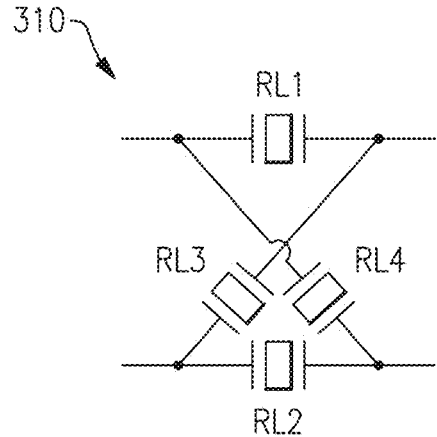
FIG. 15 is a schematic diagram of a lattice filter that includes a laterally excited bulk acoustic wave resonator.

FIG. 15 is a schematic diagram of a lattice filter 310 that includes a laterally excited bulk acoustic wave resonator according to an embodiment and/or a leaky longitudinal surface acoustic wave device according to an embodiment. The lattice filter 310 is an example topology of a band pass filter formed from acoustic wave resonators. The lattice filter 310 can be arranged to filter an RF signal. As illustrated, the lattice filter 310 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 310 has a balanced input and a balanced output. One or more of the illustrated acoustic wave resonators RL1 to RL4 can be a laterally excited bulk acoustic wave resonator and/or a leaky longitudinal surface acoustic wave resonator in accordance with any suitable principles and advantages disclosed herein. The four acoustic wave devices RL1-RL4 in FIG. 14 can be provided by two stacked acoustic wave device assemblies according to an embodiment.

Figure 16:
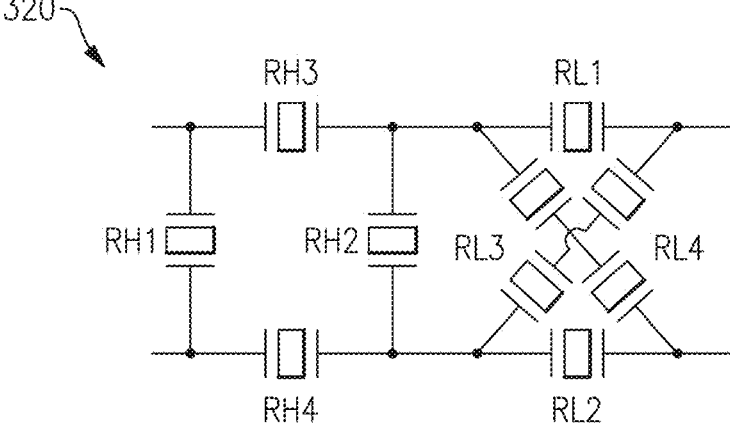
FIG. 16 is a schematic diagram of a hybrid ladder lattice filter that includes a laterally excited bulk acoustic wave resonator.

FIG. 16 is a schematic diagram of a hybrid ladder and lattice filter 320 that includes a laterally excited bulk acoustic wave resonator according to an embodiment. The illustrated hybrid ladder and lattice filter 320 includes series acoustic resonators RL1, RL2, RH3, and RH4 and shunt acoustic resonators RL3, RL4, RH1, and RH2. The hybrid ladder and lattice filter 320 includes one or more laterally excited bulk acoustic wave resonators and/or one or more leaky longitudinal surface acoustic wave resonators in accordance with any suitable principles and advantages disclosed herein. For example, the series resonators RL1, RL2, RH3, and RH4 and the shunt resonators RL3, RL4, RH1, and RH2 can each be a laterally excited bulk acoustic wave resonator or a leaky longitudinal surface acoustic wave device according to an embodiment. The eight acoustic wave devices RH1-RH4, RL1-RL4 in FIG. 16 can be provided by four stacked acoustic wave device assemblies according to an embodiment.

According to certain applications, a laterally excited bulk acoustic wave resonator or a leaky longitudinal surface acoustic wave resonator can be included in filter that also includes one or more inductors and one or more capacitors.

The laterally excited bulk acoustic wave resonators and/or leaky longitudinal surface acoustic wave resonators disclosed herein can be implemented in a standalone filter and/or in a filter in any suitable multiplexer. The filter can be a band pass filter arranged to filter a 4G LTE band and/or 5G NR band. Examples of a standalone filter and multiplexers will be discussed with reference to FIGS. 17A to 17E. Any suitable principles and advantages of these filters and/or multiplexers can be implemented together with each other.

Figure 17A:
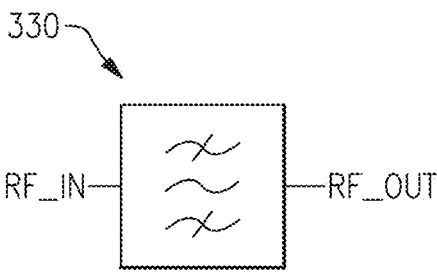
FIG. 17A is a schematic diagram of an acoustic wave filter.

FIG. 17A is schematic diagram of an acoustic wave filter 330. The acoustic wave filter 330 is a band pass filter. The acoustic wave filter 330 is arranged to filter a radio frequency. The acoustic wave filter 330 includes one or more acoustic wave devices coupled between a first input/output port RF_IN and a second input/output port RF_OUT. The acoustic wave filter 330 includes a laterally excited bulk acoustic wave resonator or a leaky longitudinal surface acoustic wave resonator according to an embodiment.

Figure 17B:
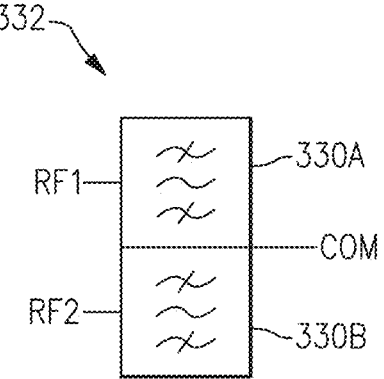
FIG. 17B is a schematic diagram of a duplexer.

FIG. 17B is a schematic diagram of a duplexer 332 that includes an acoustic wave filter according to an embodiment. The duplexer 332 includes a first filter 330A and a second filter 330B coupled together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node. The two acoustic wave filters 330A, 330B can be part of the same stacked acoustic wave device assembly according to an embodiment.

The first filter 330A is an acoustic wave filter arranged to filter a radio frequency signal. The first filter 330A includes one or more acoustic wave resonators coupled between a first radio frequency node RF1 and the common node COM. The first radio frequency node RF1 can be a transmit node or a receive node. The first filter 330A includes a laterally excited bulk acoustic wave resonator or a leaky longitudinal surface acoustic wave resonator in accordance with any suitable principles and advantages disclosed herein.

The second filter 330B can be any suitable filter arranged to filter a second radio frequency signal. The second filter 330B can be, for example, an acoustic wave filter, an acoustic wave filter that includes a laterally exited bulk acoustic wave resonator, a leaky longitudinal surface acoustic wave resonator, an LC filter, a hybrid acoustic wave LC filter, or the like. The second filter 330B is coupled between a second radio frequency node RF2 and the common node. The second radio frequency node RF2 can be a transmit node or a receive node. The two acoustic wave filters 330A, 330B can be part of the same stacked acoustic wave device assembly according to an embodiment.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of laterally excited bulk acoustic wave devices.

Each pair of any two filters may be provided as part of the same stacked acoustic wave device assembly according to an embodiment.

Figure 17C:
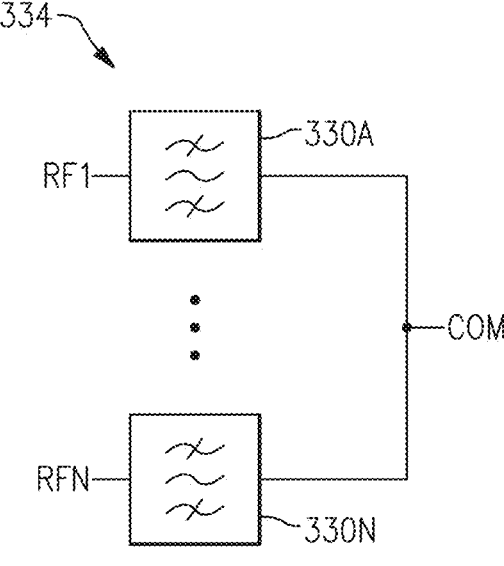
FIG. 17C is a schematic diagram of a multiplexer with hard multiplexing.

FIG. 17C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications. Any pair of acoustic wave filters 330A, 330B, . . . 330N can be provided by one stacked acoustic wave device assembly according to an embodiment.

The first filter 330A is an acoustic wave filter arranged to filter a radio frequency signal. The first filter 330A can include one or more acoustic wave devices coupled between a first radio frequency node RF1 and the common node COM. Each pair of two acoustic wave devices can be implemented by the same stacked acoustic wave device assembly according to an embodiment. The first radio frequency node RF1 can be a transmit node or a receive node. The first filter 330A includes a laterally excited bulk acoustic wave resonator in accordance with any suitable principles and advantages disclosed herein. The other filter(s) of the multiplexer 334 can include one or more acoustic wave filters, one or more acoustic wave filters that include a laterally excited bulk acoustic wave resonator, a leaky longitudinal surface acoustic wave device, one or more LC filters, one or more hybrid acoustic wave LC filters, or any suitable combination thereof. The two acoustic wave filters 330A, 330B can be part of the same stacked acoustic wave device assembly according to an embodiment.

Figure 17D:
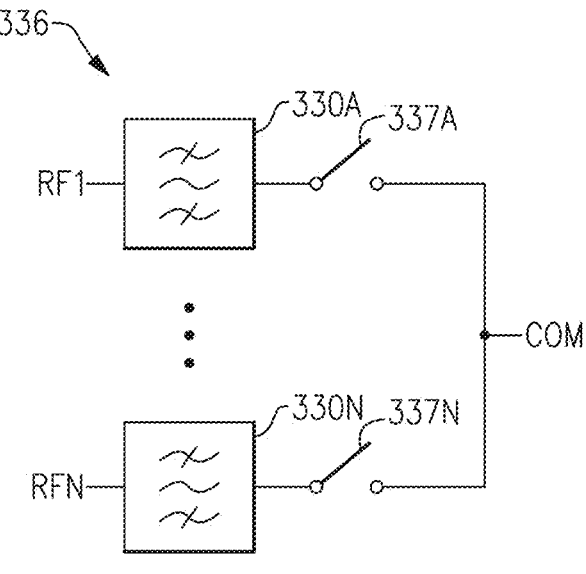
FIG. 17D is a schematic diagram of a multiplexer with switched multiplexing.

FIG. 17D is a schematic diagram of a multiplexer 336 that includes an acoustic wave filter according to an embodiment. The multiplexer 336 is like the multiplexer 334 of FIG. 17C, except that the multiplexer 336 implements switched multiplexing. In switched multiplexing, a filter is coupled to a common node via a switch. In the multiplexer 336, the switch 337A to 337N can selectively electrically connect respective filters 330A to 330N to the common node COM. For example, the switch 337A can selectively electrically connect the first filter 330A the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations. Any pair of acoustic wave filters 330A, 330B, . . . 330N can be provided by one stacked acoustic wave device assembly according to an embodiment.

Figure 17E:
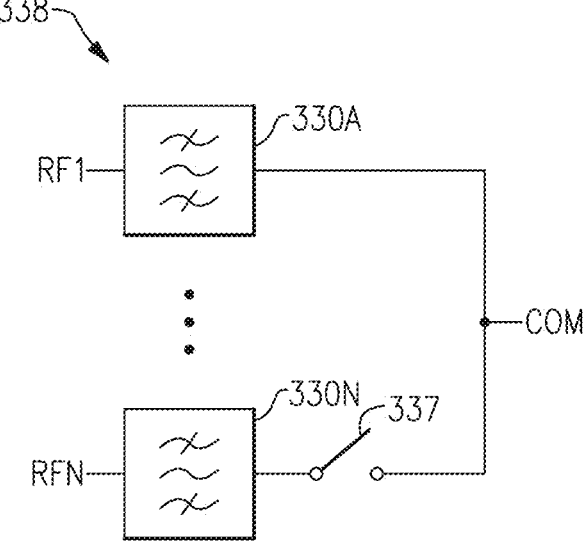
FIG. 17E is a schematic diagram of a multiplexer with a combination of hard multiplexing and switched multiplexing.

FIG. 17E is a schematic diagram of a multiplexer 338 that includes an acoustic wave filter according to an embodiment. The multiplexer 338 illustrates that a multiplexer can include any suitable combination of hard multiplexed and switched multiplexed filters. One or more laterally excited bulk acoustic wave or leaky longitudinal surface acoustic wave device devices can be included in a filter that is hard multiplexed to the common node of a multiplexer. Alternatively or additionally, one or more laterally excited bulk acoustic wave devices or leaky longitudinal surface acoustic wave devices can be included in a filter that is switch multiplexed to the common node of a multiplexer. Any pair of two acoustic wave devices can be provided by one stacked acoustic wave device assembly according to an embodiment.

The acoustic wave devices disclosed herein can be implemented in a variety of packaged modules. Some example packaged modules will now be disclosed in which any suitable principles and advantages of the acoustic wave devices, acoustic wave components, or stacked acoustic wave device assemblies disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 18 to 22 are schematic block diagrams of illustrative packaged modules according to certain embodiments. Any suitable combination of features of these packaged modules can be implemented with each other. While duplexers are illustrated in the example packaged modules of FIGS. 19, 20, and 22, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 18:
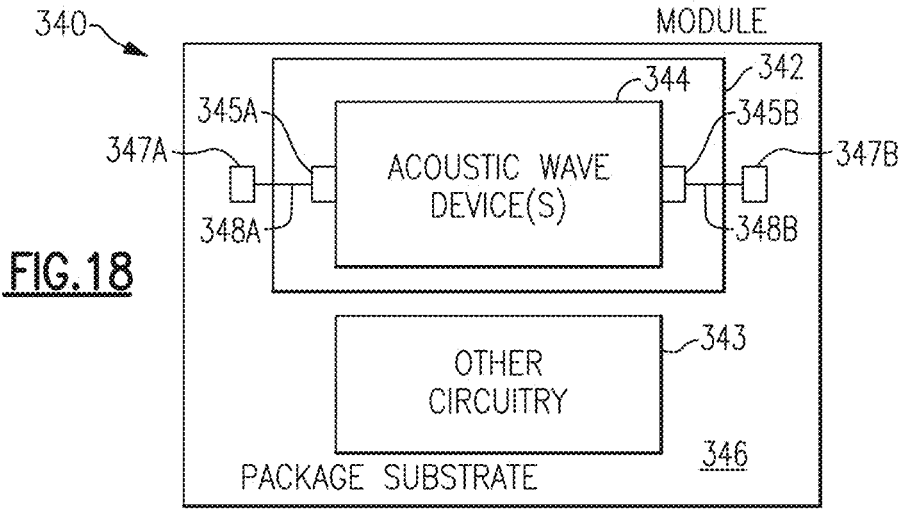
FIG. 18 is a schematic diagram of a radio frequency module that includes an acoustic wave filter.

FIG. 18 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include one or more acoustic wave devices or stacked acoustic wave device assemblies in accordance with any suitable combination of features of the acoustic wave filters disclosed herein. The acoustic wave component 342 can include an acoustic wave filter that includes a plurality of laterally excited bulk acoustic wave resonators or leaky longitudinal surface acoustic wave resonators, for example.

The acoustic wave component 342 shown in FIG. 18 includes one or more acoustic wave devices 344 and terminals 345A and 345B. The one or more acoustic wave devices 344 includes an acoustic wave device implemented in accordance with any suitable principles and advantages disclosed herein. The terminals 345A and 344B can serve, for example, as an input contact and an output contact. Although two terminals are illustrated, any suitable number of terminals can be implemented for a particular application. The acoustic wave component 342 and the other circuitry 343 are on a common packaging substrate 346 in FIG. 18. The package substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 343 can be electrically connected to the one or more acoustic wave devices 344. The radio frequency module 340 can include one or more packaging structures to, for example, provide protection and/or facilitate easier handling of the radio frequency module 340. Such a packaging structure can include an overmold structure formed over the packaging substrate 346. The overmold structure can encapsulate some or all of the components of the radio frequency module 340.

Figure 19:
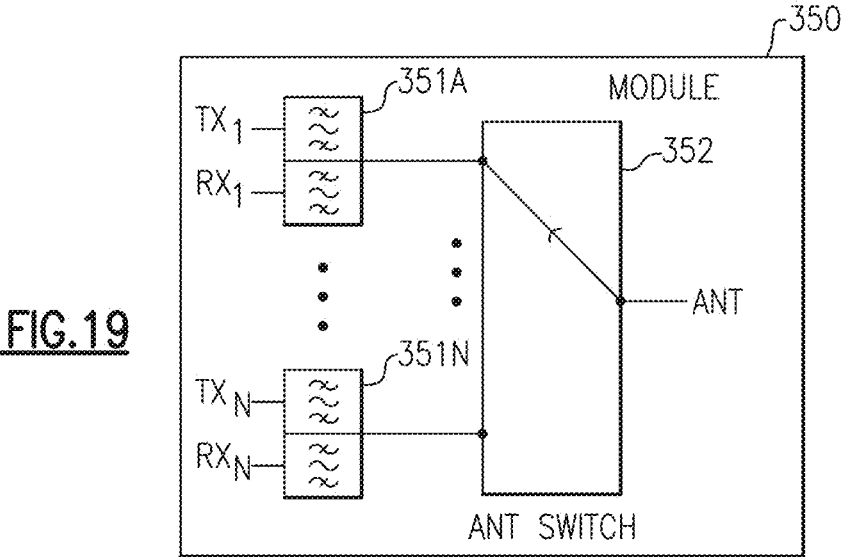
FIG. 19 is a schematic block diagram of a module that includes an antenna switch and duplexers.

FIG. 19 is a schematic block diagram of a module 350 that includes duplexers 351A to 351N and an antenna switch 352. One or more filters of the duplexers 351A to 351N can include an acoustic wave device or a stacked acoustic wave device assembly in accordance with any suitable principles and advantages disclosed herein. Any suitable number of duplexers 351A to 351N can be implemented. The antenna switch 352 can have a number of throws corresponding to the number of duplexers 351A to 351N. The antenna switch 352 can include one or more additional throws coupled to one or more filters external to the module 350 and/or coupled to other circuitry. The antenna switch 352 can electrically couple a selected duplexer to an antenna port of the module 350.

FIG. 20 is a schematic block diagram of a module 360 that includes a power amplifier 362, a radio frequency switch 364, and duplexers 351A to 351N according to an embodiment. The power amplifier 362 can amplify a radio frequency signal. The radio frequency switch 364 can be a multi-throw radio frequency switch. The radio frequency switch 364 can electrically couple an output of the power amplifier 362 to a selected transmit filter of the duplexers 351A to 351N. One or more filters of the duplexers 351A to 351N can include an acoustic wave device or stacked acoustic wave device assembly in accordance with any suitable principles and advantages disclosed herein. Any suitable number of duplexers 351A to 351N can be implemented. Any duplexer 351A to 351N can be implemented using a stacked acoustic wave device assembly according to embodiments.

FIG. 21 is a schematic block diagram of a module 370 that includes filters 372A to 372N, a radio frequency switch 374, and a low noise amplifier 376 according to an embodiment. One or more filters of the filters 372A to 372N can include any suitable number of acoustic wave devices or stacked acoustic wave device assemblies in accordance with any suitable principles and advantages disclosed herein. Any suitable number of filters 372A to 372N can be implemented, for example by any number of stacked acoustic wave device assemblies. The illustrated filters 372A to 372N are receive filters. In some embodiments (not illustrated), one or more of the filters 372A to 372N can be included in a multiplexer that also includes a transmit filter. The radio frequency switch 374 can be a multi-throw radio frequency switch. The radio frequency switch 374 can electrically couple an output of a selected filter of filters 372A to 372N to the low noise amplifier 376. In some embodiments (not illustrated), a plurality of low noise amplifiers can be implemented. The module 370 can include diversity receive features in certain applications.

FIG. 22 is a schematic diagram of a radio frequency module 380 that includes an acoustic wave filter or a stacked acoustic wave device assembly according to an embodiment. As illustrated, the radio frequency module 380 includes duplexers 351A to 351N, a power amplifier 362, a select switch 364, and an antenna switch 352. Each duplexer 351A to 351N may be implemented using a stacked acoustic wave device assembly according to embodiments. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 22 and/or additional elements. The radio frequency module 380 may include any one of the acoustic wave filters or stacked acoustic wave device assemblies in accordance with any suitable principles and advantages disclosed herein.

The duplexers 351A to 351N can each include two acoustic wave filters coupled to a common node. For example, the two acoustic wave filters can be a transmit filter and a receive filter. Each duplexer 351A to 351N can be implemented using one stacked acoustic wave device assembly. As illustrated, the transmit filter and the receive filter can each be a band pass filter arranged to filter a radio frequency signal. One or more of the transmit filters can include an acoustic wave device in accordance with any suitable principles and advantages disclosed herein. Similarly, one or more of the receive filters can include an acoustic wave device in accordance with a stacked acoustic wave device assembly with any suitable principles and advantages disclosed herein. Although FIG. 22 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 362 can amplify a radio frequency signal. The illustrated switch 364 is a multi-throw radio frequency switch. The switch 364 can electrically couple an output of the power amplifier 362 to a selected transmit filter of the transmit filters of the duplexers 351A to 351N. In some instances, the switch 364 can electrically connect the output of the power amplifier 362 to more than one of the transmit filters. The antenna switch 352 can selectively couple a signal from one or more of the duplexers 351A to 351N to an antenna port ANT. The duplexers 351A to 351N can be associated with different frequency bands and/or different modes of operation (e.g., different power modes, different signaling modes, etc.).

Figure 23:
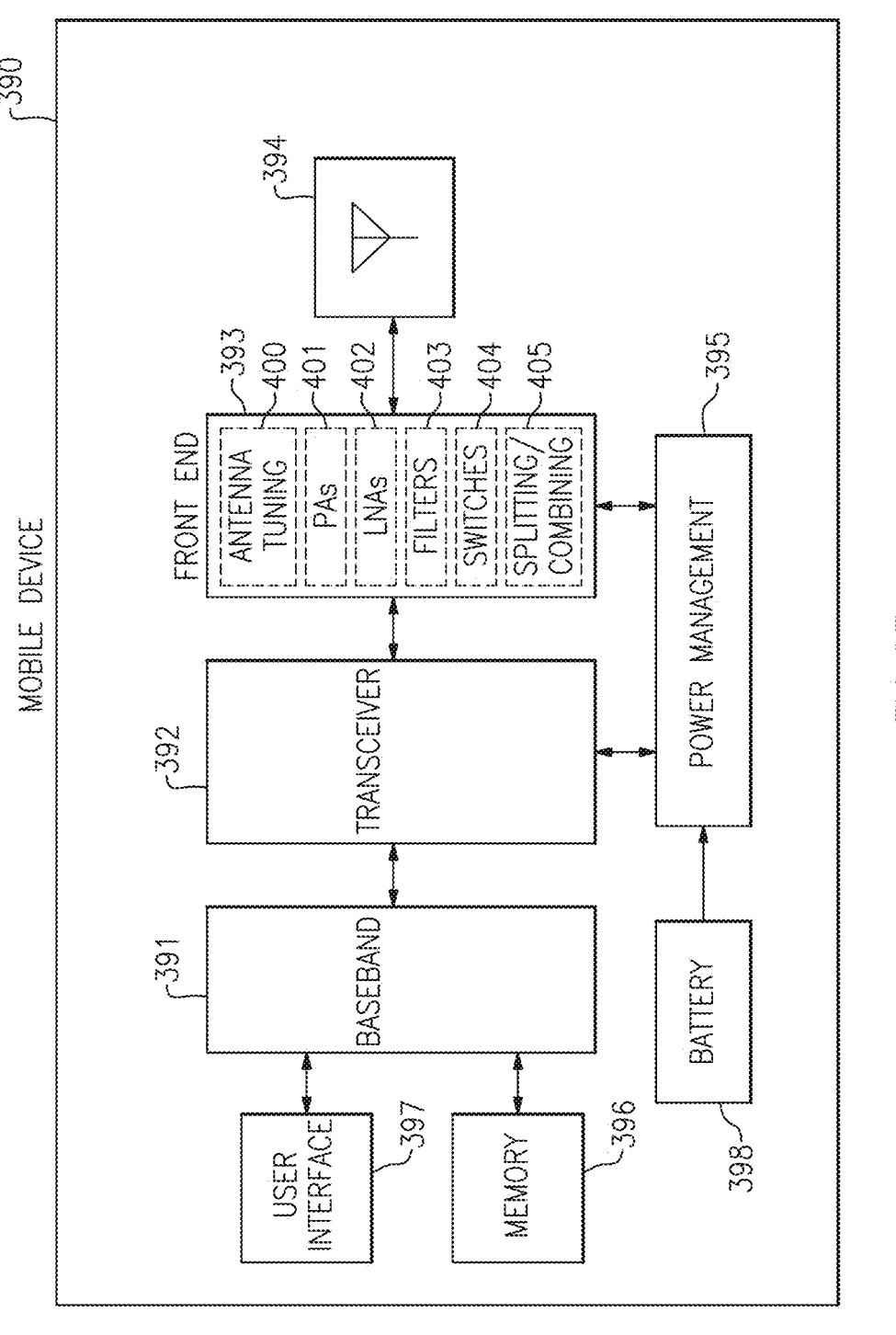
FIG. 23 is a schematic block diagram of a wireless communication device that includes a filter.

The acoustic wave devices disclosed herein can be implemented in wireless communication devices. FIG. 23 is a schematic block diagram of a wireless communication device 390 that includes a filter or a stacked acoustic wave device assembly according to an embodiment. The wireless communication device 390 can be a mobile device. The wireless communication device 390 can be any suitable wireless communication device. For instance, a wireless communication device 390 can be a mobile phone, such as a smart phone. As illustrated, the wireless communication device 390 includes a baseband system 391, a transceiver 392, a front end system 393, antennas 394, a power management system 395, a memory 396, a user interface 397, and a battery 398.

The wireless communication device 390 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 392 generates RF signals for transmission and processes incoming RF signals received from the antennas 394. Various functionalities associated with the transmission and receiving of RF signals can be achieved by one or more components that are collectively represented in FIG. 23 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAS) 401, low noise amplifiers (LNAs) 402, filters 403, switches 404, and signal splitting/combining circuitry 405. However, other implementations are possible. The filters 403 can include one or more acoustic wave filters that include any suitable number of laterally excited bulk acoustic wave devices in accordance with any suitable principles and advantages disclosed herein.

For example, the front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 390 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 23, the baseband system 391 is coupled to the memory 396 of facilitate operation of the wireless communication device 390.

The memory 396 can be used for a wide variety of purposes, such as storing data and/or instructions to facilitate the operation of the wireless communication device 390 and/or to provide storage of user information.

The power management system 395 provides a number of power management functions of the wireless communication device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 23, the power management system 395 receives a battery voltage from the battery 398. The battery 398 can be any suitable battery for use in the wireless communication device 390, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 25 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, multiplexer, devices, modules, wireless communication devices, apparatus, methods, and systems described herein may be embodied in a variety of other forms. Furthermore, various omissions, substitutions and changes in the form of the filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A stacked acoustic wave device assembly comprising:
a first acoustic wave device including a first solid acoustic mirror on a first substrate, a first piezoelectric layer on the first solid acoustic mirror and a first interdigital transducer electrode in contact with the first piezoelectric layer;
a second acoustic wave device including a second solid acoustic mirror on a second substrate, a second piezoelectric layer on the second solid acoustic mirror and a second interdigital transducer electrode in contact with the second piezoelectric layer; and
a third solid acoustic mirror positioned between the first acoustic wave device and the second acoustic wave device.

2. The stacked acoustic wave device assembly of claim 1 wherein the first piezoelectric layer is arranged between the first interdigital transducer electrode and the first substrate.

3. The stacked acoustic wave device assembly of claim 1 wherein the second interdigital transducer electrode is arranged between the second interdigital transducer electrode and the second substrate.

4. The stacked acoustic wave device assembly of claim 1 wherein the first solid acoustic mirror, the first piezoelectric layer, the first interdigital transducer electrode, the second interdigital transducer electrode, the third solid acoustic mirror, the second piezoelectric layer, and the second solid acoustic mirror are positioned between the first substrate and the second substrate.

5. The stacked acoustic wave device assembly of claim 1 wherein the third solid acoustic mirror includes a first section adapted to mirror frequencies for which the first acoustic wave device is configured, the first section being arranged in contact with the first acoustic wave device.

6. The stacked acoustic wave device assembly of claim 1 wherein the third solid acoustic mirror includes a second section adapted to mirror frequencies for which the second acoustic wave device is configured, the second section being arranged in contact with the second acoustic wave device.

7. The stacked acoustic wave device assembly of claim 1 wherein the first acoustic wave device is a laterally excited bulk acoustic wave resonator, the first piezoelectric layer includes a lithium niobate crystal cut with a surface normal orientation of $(\alpha, \beta, \gamma)$, with $\alpha$ between $-10°$ and $+10°$, $\beta$ between $-10°$ and $+10°$, and $\gamma$ between $80°$ and $100°$ in Euler angles.

8. The stacked acoustic wave device assembly of claim 1 wherein the first acoustic wave device is a leaky longitudinal surface acoustic wave resonator, the first piezoelectric layer includes a lithium niobate crystal cut with a surface normal orientation of $(\alpha, \beta, \gamma)$, with $\alpha$ between $80°$ and $100°$, B between $80°$ and $100°$, and $\gamma$ between $30°$ and $50°$.

9. The stacked acoustic wave device assembly of claim 1 wherein the first interdigital transducer electrode is arranged on the first piezoelectric layer.

10. The stacked acoustic wave device assembly of claim 1 wherein the first interdigital transducer electrode is completely enclosed by the first piezoelectric layer.

11. The stacked acoustic wave device assembly of claim 1 wherein the first interdigital transducer electrode is partially enclosed by the first piezoelectric layer.

12. The stacked acoustic wave device assembly of claim 11 wherein a surface of the first interdigital transducer electrode is flush with a surface of the first piezoelectric layer.

13. A radio frequency module comprising:
a first acoustic wave device including a first solid acoustic mirror on a first substrate, a first piezoelectric layer on the first solid acoustic mirror and a first interdigital transducer electrode in contact with the first piezoelectric layer;
a first radio frequency circuit element coupled to the first acoustic wave device;
a second acoustic wave device including a second solid acoustic mirror on a second substrate, a second piezoelectric layer on the second solid acoustic mirror and a second interdigital transducer electrode in contact with the second piezoelectric layer; and
a third solid acoustic mirror positioned between the first acoustic wave device and the second acoustic wave device, the first acoustic wave device, the second acoustic wave device, the third solid acoustic mirror and the radio frequency circuit element being enclosed within a common package.

14. The radio frequency module of claim 13 wherein the first radio frequency circuit element is a radio frequency amplifier arranged to amplify a radio frequency signal.

15. The radio frequency module of claim 13 wherein the first radio frequency amplifier is a low noise amplifier.

16. The radio frequency module of claim 13 further comprising a first switch configured to selectively couple a terminal of the first acoustic wave device to an antenna port of the first radio frequency module.

17. The radio frequency module of claim 13 wherein the first radio frequency circuit element is a first switch configured to selectively couple the first acoustic wave device to an antenna port of the first radio frequency module.

18. A wireless communication device comprising:

a first acoustic wave device including a first solid acoustic mirror on a first substrate, a first piezoelectric layer on the first solid acoustic mirror and a first interdigital transducer electrode in contact with the first piezoelectric layer;

a second acoustic wave device including a second solid acoustic mirror on a second substrate, a second piezoelectric layer on the second solid acoustic mirror and a second interdigital transducer electrode in contact with the second piezoelectric layer;

an antenna operatively coupled to the first acoustic wave device and the second acoustic wave device;

a radio frequency amplifier operatively coupled to the first acoustic wave device and configured to amplify a radio frequency signal;

a transceiver in communication with the radio frequency amplifier; and a third solid acoustic mirror positioned between the first acoustic wave device and the second acoustic wave device.

19. The wireless communication device of claim 18 further comprising a baseband processor in communication with the transceiver.

20. The wireless communication device of claim 18 wherein the first acoustic wave device is included in a radio frequency front end.

* * * * *